United States Patent [19]
Fujikata et al.

[11] Patent Number: 5,766,743
[45] Date of Patent: Jun. 16, 1998

[54] MAGNETORESISTANCE EFFECT FILM, A METHOD OF MANUFACTURING THE SAME, AND MAGNETORESISTANCE EFFECT DEVICE

[75] Inventors: Jun-Ichi Fujikata; Kazuhiko Hayashi; Hidefumi Yamamoto; Kunihiko Ishihara; Masafumi Nakada, all of Tokyo, Japan

[73] Assignee: NEC Corporation, Japan

[21] Appl. No.: 656,921

[22] Filed: Jun. 3, 1996

[30] Foreign Application Priority Data

Jun. 2, 1995 [JP] Japan ................................ 7-136670
Dec. 28, 1995 [JP] Japan ................................ 7-344066

[51] Int. Cl.$^6$ ........................ G11B 5/127; G11B 5/33
[52] U.S. Cl. ........................ 428/212; 428/693; 428/457; 338/32 R; 360/113; 324/252
[58] Field of Search ........................ 338/32 R; 324/252; 428/693, 336, 457, 212; 360/113

[56] References Cited

U.S. PATENT DOCUMENTS

| | | | |
|---|---|---|---|
| 5,315,468 | 5/1994 | Lin et al. | 360/113 |
| 5,373,238 | 12/1994 | McGuire et al. | 324/252 |
| 5,422,571 | 6/1995 | Gurney et al. | 324/252 |

FOREIGN PATENT DOCUMENTS

| | | | |
|---|---|---|---|
| 2-61572 | 3/1990 | Japan | G01R 33/06 |
| 4358310 | 12/1992 | Japan | G11B 5/39 |
| 8127864 | 5/1996 | Japan | C23C 14/08 |

OTHER PUBLICATIONS

Dieny, et al, "Giant Magnetoresistance in Soft Ferromagnetic Multilayers", Physical Review B, vol. 43, No. 1, Jan. 1, 1991, pp. 1297-1300.

Thompson et al, "Thin Film Magnetoresistors in Memory, Storage, and Related Applications", IEEE Transactions on Magnetics, vol. MAG-11, No. 4, Jul. 1975, pp. 1039-1049.

McIntyre et al, "X-Ray Photoelectron Studies on Some Oxides and Hydroxides of Cobalt, Nickel, and Copper", Analytical Chemistry, vol. 47, No. 13, Nov. 1975, pp. 2208-2213.

*Primary Examiner*—Daniel Zirker
*Attorney, Agent, or Firm*—Hayes, Soloway, Hennessey, Grossman & Hage, P.C.

[57] ABSTRACT

Magnetic thin films 2 and 3 are stacked on a substrate 4 with a nonmagnetic thin film 1 interposed therebetween. An antiferromagnetic thin film 5 is arranged adjacent to one magnetic thin film 3. The inequality $Hc_2 < Hr$ is satisfied between a bias magnetic field Hr of the antiferromagnetic thin film 5 and coercive force $Hc_2$ of the other magnetic thin film 2. At least a part of the antiferromagnetic thin film 5 comprises NiMn of an fct structure. Alternatively, the antiferromagnetic thin film 5 comprises a two-layer structure composed of a CoO layer deposited on a NiO layer to a thickness between 10 and 40 angstroms.

12 Claims, 34 Drawing Sheets

MAGNETORESISTANCE EFFECT FILM, A METHOD OF MANUFACTURING THE SAME, AND MAGNETORESISTANCE EFFECT DEVICE

BACKGROUND OF THE INVENTION

This invention relates to a magnetoresistance effect film useful in a magnetoresistance effect device for reading as a signal a magnetic field intensity in a magnetic medium and, in particular, to a magnetoresistance effect film which exhibits a large rate of change in resistance in response to a small external magnetic field.

This invention also relates to a magnetic sensor for reading an information signal recorded on a magnetic medium.

In recent years, improvement in sensitivity of magnetic sensors and increase in density of magnetic recording are advancing. Concomitantly, development of magnetoresistance effect magnetic sensors (hereinafter abbreviated to MR sensors) and magnetoresistance effect magnetic heads (hereinafter abbreviated to MR heads) is making rapid progress. Each of the MR sensors and the MR heads is operable to read an external magnetic field signal as an electric resistance variation in a sensor in response to the external magnetic field. In these MR sensors and MR heads, reproduction outputs do not depend upon relative speeds with respect to recording media. This leads to high sensitivity of the MR sensors and high output levels of the MR head in high-density magnetic recording.

Recently, proposal is made of a magnetoresistance effect film which comprises at least two ferromagnetic layers or thin films stacked one over the other with a nonmagnetic layer or thin film interposed therebetween, and an antiferromagnetic layer or thin film underlying a first one of the ferromagnetic thin films so that the first ferromagnetic thin film is provided with antimagnetic force, that is, constrained by exchange anisotropy or exchange biasing.

A so-called soft magnetic material or a high permeability magnetic material is usually used for the ferromagnetic layers. The term "nonmagnetic" is usually used to mean "paramagnetic" and/or "diamagnetic".

When an external magnetic field is applied to the magnetoresistance effect film, the direction of magnetization of the other second one of the ferromagnetic thin films is rotated with respect to that of the first ferromagnetic film. Thus, change in resistance takes place. The magnetoresistance effect film of the type described is disclosed in, for example, Physical Review B, Vol. 43, pp. 1297–1300, 1991 and Japanese Patent Unexamined Publication No. 358310/1992.

Disclosure is also made of a conventional magnetic read transducer, called an MR sensor or an MR head, which can read data from a magnetic surface with high linear density. The MR sensor detects a magnetic field signal through change in resistance as a function of the intensity and the direction of magnetic flux detected by a reading element. The above-mentioned conventional MR sensor is operated on the basis of an anisotropic magnetoresistance (AMR) effect. Specifically, one component of the resistance of the reading element changes in proportion to the square of the cosine of the angle between the magnetization direction and the direction of the sense current flowing through the element. The AMR effect is described in detail in an article written by D. A. Thompson et al and entitled "Thin Film Magnetoresistors in Memory, Storage, and Related Applications", IEEE Transactions on Magnetics, Vol. MAG-11, No. 4, pp. 1039–1049, July 1975.

More recently, disclosure is made of a further remarkable magnetoresistance effect. Specifically, change in resistance of a stacked-type magnetic sensor results from spin-dependent transmission of conduction electrons between ferromagnetic layers with a nonmagnetic layer interposed therebetween and from interfacial spin-dependent scattering accompanying the spin-dependent transmission. Such magnetoresistance effect is called by various names such as "a giant magnetoresistance effect" and "a spin-valve effect". Such magnetoresistance effect sensor made of an appropriate material has improved sensitivity and exhibits large rate of change in resistance. In the MR sensor of the type described, in-plane resistance between a pair of the ferromagnetic layers separated by the nonmagnetic layer changes in proportion to the cosine of the angle between magnetization directions in the two ferromagnetic layers.

Japanese Unexamined Patent Publication No. 61572/1990 claiming a priority of June 1986 discloses a stacked magnetic structure giving large rate of change in magnetoresistance resulting from antiparallel alignment of magnetization directions in ferromagnetic layers. In the above-mentioned publication, ferromagnetic transition metals and alloys are recited as a material which can be used in the stacked structure. The publication discloses the structure including an antiferromagnetic layer attached to one of at least two ferromagnetic layers separated by an intermediate layer and mentions that FeMn is suitable as the antiferromagnetic layer.

Japanese Unexamined Patent Publication No. 358310/1992 with a priority claim of Dec. 11, 1990 discloses an MR sensor comprising two ferromagnetic thin film layers separated by a metallic nonmagnetic thin film layer. When an applied magnetic field is zero, magnetization directions of the two ferromagnetic thin film layers are orthogonal to each other. Resistance between the two uncoupled ferromagnetic layers changes in proportion to the cosine of the angle between the magnetization directions in the two ferromagnetic layers, regardless of the direction of electric current flowing through the sensor.

Japanese Unexamined Patent Publication No. 127864/1996 discloses a magnetoresistance effect device comprising a plurality of ferromagnetic thin films stacked one over the other on a substrate with a nonmagnetic layer interposed there-between, and an anti-erromagnetic thin film arranged adjacent to one of the ferromagnetic thin films. A biasing magnetic field Hr of the antiferromagnetic thin film and a coercive force $Hc_2$ of the other magnetic thin film satisfies $Hc_2 < Hr$. The antiferromagnetic thin film comprises a superlattice composed of at least two materials selected from NiO, $Ni_xCo_{1-x}O$, and CoO.

Although the magnetoresistance effect device in the above-mentioned Japanese Publication No. 127864/1996 is operable in response to a small external magnetic field, a signal magnetic field must be applied in a direction of an easy magnetization axis when it is used as a practical sensor or magnetic head. When it is used as a sensor, no change in resistance is observed around the zero magnetic field and nonlinearity such as Barkhausen jumps appears.

In addition, ferromagnetic interaction is caused between the ferromagnetic thin films which are located adjacent to each other with the nonmagnetic layer interposed therebetween. As a consequence, a linear zone in an M-R curve is shifted from the zero magnetic field.

The antiferromagnetic thin film is made of FeMn which has a poor corrosion resistance. For practical use, a countermeasure against corrosion is required such as incorporation of an additive or application of a protective film.

Basically, change in resistance is obtained by the use of change in the length of mean free path of conduction electrons across the three layers of the ferromagnetic/nonmagnetic/ferromagnetic thin films. With this structure, change in resistance is small as compared with magnetoresistance effect films having a multilayer, structure called a coupling type.

On the other hand, when a Ni oxide film having an excellent corrosion resistance is used as the antiferromagnetic thin film, the biasing magnetic field is small so that the coercive force of the adjacent ferromagnetic thin film is large. This makes it difficult to obtain antiparallel alignment of magnetization directions in the ferromagnetic thin films.

When the oxide film is used as the antiferromagnetic thin film, the adjacent ferromagnetic film is oxidized during heat treatment. This reduces the magnitude of the biasing magnetic field and change in resistance of the magnetoresistance effect film.

When the superlattice composed of NiO and CoO is used as the antiferromagnetic thin film, a large exchange-coupling magnetic field is obtained. However, a blocking temperature which is an upper limit of operation of the magnetoresistance effect film is lowered. In addition, production cost inevitably becomes high.

When the two-layer film composed of the NiO layer and the CoO layer deposited on the NiO layer to a thickness between 10 and 40 angstroms is used as the antiferromagnetic film, it is extremely difficult to obtain an antiferromagnetic phase of CoO.

Basically, change in resistance is obtained by the use of change in the length of mean free path of conduction electrons across the three layers of the ferromagnetic/nonmagnetic/ferromagnetic thin films. With this structure, change in resistance is small as compared with magnetoresistance effect film having a multilayer structure called a coupling type.

In the above-mentioned prior art, FeMn, which is easily oxidized in an atmosphere, is mainly recited as a candidate of the antiferromagnetic layer forming a spin-valve structure. For practical use, it is essential to take a countermeasure against the corrosion such as incorporation of an additive or application of a protective film. Even if such countermeasure is taken, deterioration in characterisics is still inevitable during manufacturing process. Under the circumstances, a manufactured device is often insufficient in reliability.

When the Ni oxide film or the CoPt film excellent in corrosion resistance is used to increase the intensity of a reverse magnetic field in one of the ferromagnetic thin films, the sandwich structure of the ferromagnetic/nonmagnetic/ferromagnetic thin films has a poor crystallinity. This results in frequent occurrence of the hysteresis on an R-H loop.

When the magnetoresistance effect device based on an SV (spin-valve) effect is used as the magnetoresistance effect sensor, optimization is required at an operation point (cross point) in the zero magnetic field, like the conventional magnetoresistance effect sensor using the AMR effect. In the magnetoresistance effect device using the SV effect, the reproduction output at the head is affected by the configuration of the device. In the SV device using a nonconductive material as the antiferromagnetic layer, the thickness of the antiferromagnetic layer affects the gap length of the shielded type magnetoresistance effect device and the off-track characteristic of the reproduction signal reproduced by the shielded-type magnetoresistance effect head.

SUMMARY OF THE INVENTION

It is an object of this invention to provide a magnetoresistance effect device which linearly exhibits large change in resistance around the zero magnetic field, which has a small hysteresis in an M-R curve, and which is excellent in corrosion and heat resistances.

It is another object of this invention to provide a magnetoresistance effect device and a magnetic detection system excellent in corrosion resistance, exchange-coupling magnetic field, hysteresis characteristic, MR ratio, cross point, and half-width of an output signal.

Other objects of this invention will become clear as the description proceeds.

In order to solve the above-mentioned problems, the present invention provides a magnetoresistance effect film comprising two ferromagnetic layers stacked on a substrate with a nonmagnetic layer interposed between the two ferromagnetic layers, and an antiferromagnetic layer underlying a first one of the ferromagnetic layers. A biasing magnetic field Hr of the antiferromagnetic layer and a coercive force $Hc_2$ of the other second one of the ferromagnetic layers satisfies the inequality $Hc_2 < Hr$.

According to this invention, at least a part of the antiferromagnetic layer is made of a NiMn alloy having an fct (face-centered tetragonal) structure. When the NiMn alloy contains 46 and 60% Mn on the basis of the atomic percent, lattice transformation into the fct structure is achieved when subjected to heat treatment. As a primer or underlying layer for the NiMn alloy, an hcp (hexagonal close packed) metal such as Ti, Hf, Zr, and Y is desirable. When the antiferromagnetic layer and the first ferromagnetic layer are subjected to heat treatment at a temperature not higher than 300° C., the fct structure of the NiMn alloy is grown. Thus, the ferromagnetic layer is given a unidirectional anisotropy as a result of exchange coupling at an interface between the antiferromagnetic layer and the first ferromagnetic layer. When 1–10% carbon (C) by the atomic percent is added to the NiMn alloy, it is possible to accelerate fct lattice transformation during heat treatment. When 1–10% chromium (Cr) is added to the NiMn alloy, corrosion resistance is improved.

Deposition is carried out by a method such as vapor deposition, sputtering, and molecular beam epitaxy (MBE). As the substrate, use may be made of a material such as glass, Si, MgO, $Al_2O_3$, SiC, GaAs, ferrite, $CaTi_2O_3$, $BaTi_2O_3$, and $Al_2O_3$-TiC.

Specifically, the antiferromagnetic layer according to this invention has a two-layer film structure composed of a Nio layer and a CoO layer deposited on the NiO layer to a thickness of 1 to 40 angstroms. The ferromagnetic layer is deposited on the two-layer film to form an exchange-coupled layer. Thereafter, the exchange-coupled layer is heated in a magnetic field at a temperature around 200° C. to increase the intensity of an exchange-coupling magnetic field.

The upper limit of the thickness of the NiO layer is 1000 angstroms. On the other hand, no specific lower limit is defined in the thickness of the NiO layer. However, since the crystallinity of the antiferromagnetic layer significantly affects the intensity of the exchange-coupling magnetic field applied to the adjacent ferromagnetic layer, the thickness of the NiO layer is preferably equal to 100 angstroms or more to achieve excellent crystallinity. When deposition is carried out with a substrate temperature within a range between 20° and 300° C., crystallinity is improved so that the intensity of the biasing magnetic field is increased. Deposition is carried out by a method such as vapor deposition, sputtering, and molecular beam epitaxy (MBE). As the substrate, use may be made of a material such as glass, Si, MgO, $Al_2O_3$, SiC, GaAs, ferrite, $CaTi_2O_3$, $BaTi_2O_3$, and $Al_2O_3$-TiC.

Although no particular limitation is imposed on the ferromagnetic material used for the ferromagnetic layers in this invention, Fe, Ni, Co, Mn, Cr, Dy, Er, Nd, Tb, Tm, Ge, and Gd are preferred. As alloys or compounds containing these elements, for example, Fe-Si, Fe-Ni, Fe-Co, Fe-Gd, Ni-Fe-Co, Ni-Fe-Mo, Fe-Al-Si (sendust), Fe-Y, Fe-Mn, Cr-Sb, Co-containing amorphous, Co-Pt, Fe-Al, Fe-C, and ferrite are preferred.

In this invention, the ferromagnetic layers are formed by selecting appropriate materials from those exemplified above. Particularly, the second ferromagnetic layer, which is not adjacent to the antiferromagnetic layer, should be of a material having the anisotropy magnetic field $Hk_2$ which is greater than its coercive force $Hc_2$.

The anisotropy magnetic field can be increased by reducing the thickness. For example, a ferromagnetic layer of NiFe having a thickness about 10 angstroms has the anisotropy magnetic field $Hk_2$ which is greater than its coercive force $Hc_2$.

In such a magnetoresistance effect film, the easy magnetization axis of each ferromagnetic layer is perpendicular to the direction of an applied signal magnetic field. The magnetoresistance effect film can be manufactured by depositing the ferromagnetic layers in such a magnetic field that the anisotropy magnetic field $Hk_2$ and the coercive force $Hc_2$ of the ferromagnetic layers in the direction of the applied signal magnetic field satisfy the inequality $Hc_2 < Hk_2 < Hr$. Specifically, the applied magnetic field during deposition is rotated by 90 degrees or the substrate is rotated in the magnetic field by 90 degrees so that the easy magnetization axis of the first ferromagnetic layer adjacent to the antiferromagnetic layer is perpendicular to the easy magnetization axis of the second ferromagnetic layer.

Each ferromagnetic layer preferably has a thickness not greater than 200 angstroms. A thickness greater than 200 angstroms is useless and uneconomical because the effect does not increase any further as the thickness becomes greater. On the other hand, no lower limit is defined in the thickness of the ferromagnetic layer. However, a thickness smaller than 30 angstroms results in increase of the surface scattering effect of conduction electrons so that the change in magnetoresistance is reduced. On the contrary, a thickness of 30 angstroms or more makes it easier to keep a uniform thickness and leads to excellent characteristics. It is also possible to prevent saturation magnetization from becoming too small.

Insertion of a Co or a Co-based alloy layer at the interface between the nonmagnetic layer and each ferromagnetic layer increases the probability of interfacial scattering of conduction electrons so that yet greater change in magnetoresistance can be obtained. The lower limit of the thickness of the Co or the Co-based alloy layer is 5 angstroms. A smaller thickness degrades the effect of such insertion and is difficult to be controlled. Although no specific upper limit is imposed on the thickness of the inserted layer, the thickness about 30 angstroms is preferred. A greater thickness results in occurrence of a hysteresis in outputs within an operation range of the magnetoresistance effect device.

In the above-mentioned magnetoresistance effect film, an additional antiferromagnetic layer or a permanent magnet layer may be arranged adjacent to the second ferromagnetic layer which is for detecting the external magnetic field so that a biasing magnetic direction by the permanent magnet or the additional antiferromagnetic layer is in the direction of the easy magnetization axis of the second ferromagnetic layer. With this structure, magnetic domains of the second ferromagnetic layer can be stabilized so that nonlinear outputs such as Barkhausen jumps can be avoided. As the additional antiferromagnetic layer for stabilization of the magnetic domains, those materials such as FeMn, NiMn, NiO, CoO, $Fe_2O_3$, FeO, CrO, and MnO are preferred. As the permanent magnet layer, those materials such as CoCr, CoCrTa, CoCrTaPt, CoCrPt, CoNiPt, CoNiCr, CoCrPtSi, and FeCoCr are preferred. Furthermore, Cr or the like may be used as a primer or an underlying layer for the permanent magnet layer.

The nonmagnetic layer serves to weaken the magnetic interaction between the ferromagnetic layers and can be made of an appropriate material selected from various metallic and semimetallic nonmagnetic materials.

Preferred metallic nonmagnetic materials include Au, Ag, Cu, Pt, Al, Mg, Mo, Zn, Nb, Ta, V, Hf, Sb, Zr, Ga, Ti, Sn, Pb and alloys thereof. Preferred semimetallic nonmagnetic materials include $SiO_2$, SiN, $Al_2O_3$, ZnO, MgO, TiN, and a combination of one or more element to those materials.

From experimental results, the nonmagnetic layer preferably has a thickness between 20 and 35 angstroms. Generally, when the thickness exceeds 40 angstroms, the resistance is dominated exclusively by the nonmagnetic layer because of concentration of a current in the nonmagnetic layer. Accordingly, the spin-dependent electron-scattering effect becomes relatively small. This results in reduction in the rate of change in magnetoresistance. On the other hand, when the thickness is smaller than 20 angstroms, magnetic interaction between the ferromagnetic layers becomes too large and inevitably leads to occurrence of a magnetically direct contact state (pinholes). As a consequence, it becomes difficult to differ the directions of magnetizations in the ferromagnetic layers from each other.

The thicknesses of the ferromagnetic and the nonmagnetic layers can be measured by a transmission electron microscope, a scanning electron microscope, an Auger electron spectroscopic analyzer, or the like. The crystalline structure of each layer can be ascertained by X-ray diffraction, fast-electron beam diffraction, or the like.

In the magnetoresistance effect device according to this invention, no specific limitation is imposed on the number of repeated stacking of artificial lattice films. This number can be selected as desired in dependence upon a desired rate of change in magnetoresistance.

On the surface of the uppermost ferromagnetic layer, an antioxidizing film such as silicon nitride, silicon oxide, and aluminum oxide may be formed. In addition, metallic conductive layers can also be provided for lead-out electrodes.

Magnetic characteristics of the ferromagnetic layers contained in the magnetoresistance effect device can not directly be measured. Generally, measurement is carried out as follows. Ferromagnetic layers and nonmagnetic layers are alternately deposited until the total thickness of the ferromagnetic layers reaches a range between 500 and 1000 angstroms to prepare a sample for measurement. By the use of this sample, the magnetic characteristics are measured. It is necessary that the thickness of each magnetic layer, the thickness of the nonmagnetic layer, and the composition of the nonmagnetic layer are exactly same as those of the magnetoresistance effect device.

This invention further provides a magnetoresistance effect film comprising a plurality of ferromagnetic layers stacked one over the other on a substrate with a nonmagnetic layer interposed therebetween, and an antiferromagnetic layer arranged adjacent to a first one of the ferromagnetic layers, a biasing magnetic field Hr of the antiferromagnetic layer and a coercive force Hc$_2$ of the other second one of the ferromagnetic layers satisfying the inequality Hc$_2$<Hr.

The antiferromagnetic layer comprises a two-layer film structure composed of a Ni oxide film and a Ni$_x$Co$_{1-x}$ oxide film (0≦x≦0.9) deposited on the Ni oxide film to a thickness between 1 and 30 angstroms. Alternatively, the antiferromagnetic layer comprises a multilayer film structure composed of a Ni oxide layer and Ni$_x$Co$_{1-x}$ oxide layers deposited on the Ni oxide film to a thickness between 1 and 30 angstroms, those Ni$_x$Co$_{1-x}$ oxide layers having different compositions within a range of 0≦x≦0.9.

With the above-mentioned structure, corrosion resistance is remarkably improved as compared with FeMn which has been used as the antiferromagnetic material. As compared with the case where a single layer of the Ni oxide layer is used, the coercive force of the exchange-coupled layer or the first ferromagnetic layer is substantially reduced so that occurrence of hysteresis in the output of the magnetoresistance effect device is remarkably reduced.

The thickness of the Ni oxide layer is preferably 1000 angstroms or less. A greater thickness results in deterioration of reading accuracy of the magnetoresistance effect device. On the other hand, the lower limit of the thickness of the Ni oxide layer is preferably 100 angstroms to obtain excellent crystallinity. This is because the crystallinity of the antiferromagnetic layer significantly affects the intensity of the exchange-coupling magnetic field applied to the adjacent or the first ferromagnetic layer. When deposition is carried out with a substrate temperature between the room temperature and 300° C., crystallinity is improved so that the intensity of the biasing magnetic field is increased. Deposition is carried out by a method such as vapor deposition, sputtering, and molecular beam epitaxy (MBE). The substrate may be made of a material such as glass, Si, MgO, Al$_2$O$_3$, GaAs, ferrite, CaTi$_2$O$_3$, BaTi$_2$O$_3$, and Al$_2$O$_3$-TiC.

According to this invention, the layer made of Ni, Fe, Co, or an alloy thereof and having a thickness between 3 and 30 angstroms may be inserted between the antiferromagnetic layer and each ferromagnetic layer. With this structure, oxidation of the ferromagnetic layers is suppressed. The exchange-coupling magnetic field is prevented from being reduced in intensity upon heat treatment and the change in resistance is prevented from becoming small.

According to this invention, the antiferromagnetic layer has a surface roughness between 2 and 30 angstroms. As a consequence, the first ferromagnetic layer stacked thereon is varied in structure of the magnetic domains so that the coercive force of the exchange-coupled layer is reduced.

The magnetic material used as the ferromagnetic layers of this invention is preferably selected from Ni, Fe, Co, FeCo, NiFe, NiFeCo, and alloys thereof. In this event, the effect of scattering of conduction electrons at the interface between the nonmagnetic layer and the ferromagnetic layer is so great that larger change in resistance is obtained.

Each ferromagnetic layer preferably has a thickness not greater than 150 angstroms. A thickness greater than 150 angstroms increases a spread of such zone that does not contribute to electron scattering. This decreases the giant magnetoresistance effect. On the other hand, no lower limit is defined in the thickness of the ferromagnetic layer. However, a thickness smaller than 20 angstroms results in greater surface scattering effect of conduction electrons so that the change in magnetoresistance is reduced. On the contrary, a thickness of 20 angstroms of more makes it easier to keep a uniform thickness and leads to excellent characteristics. It is also possible to prevent saturation magnetization from becoming too small.

The coercive force of the first ferromagnetic layer adjacent to the antiferromagnetic layer can be reduced by successive deposition of the first ferromagnetic layer following the antiferromagnetic layer while maintaining the substrate temperature between the room temperature and 300° C.

Insertion of a Co, FeCo, NiCo or NiFeCo layer at the interface between each ferromagnetic layer and the nonmagnetic layer increases the probability of interfacial scattering of conduction electrons so that yet greater change in resistance can be obtained. The lower limit of the thickness of the inserted layer is 1 angstrom. A smaller thickness degrades the effect of such insertion and is difficult to control. Although no specific upper limit is imposed on the thickness of the inserted layer, the thickness about 30 angstroms is preferred. A greater thickness results in occurrence of a hysteresis in outputs within an operation range of the magnetoresistance effect device.

The nonmagnetic layer serves to weaken the magnetic interaction between the ferromagnetic layers and is preferably made of a material selected from Cu, Au, Ag, Ru, Re and alloys thereof in order to obtain large change in magnetoresistance and excellent heat resistance.

In the spin-valve film using the oxide antiferromagnetic layer in this invention, the interaction between the ferromagnetic layers varies in correspondence to the thickness of the nonmagnetic layer. When the thickness of the nonmagnetic layer is between 8 and 12 angstroms, the two ferromagnetic layers are antiferromagnetically coupled so that large change in resistance is obtained around the zero magnetic field.

In the magnetoresistance effect device according to this invention, the antiferromagnetic layer has large resistivity which deteriorates the effect of stacking. It is therefore preferred to have an alternative structure which comprises an antiferromagnetic layer, a ferromagnetic layer, a nonmagnetic layer, a ferromagnetic layer, a nonmagnetic layer, a ferromagnetic layer, and an antiferromagnetic layer successively stacked.

According to this invention, there is further provided a magnetoresistance effect device comprising an antiferromagnetic layer, a first ferromagnetic layer, a nonmagnetic layer, and a second ferromagnetic layer successively stacked, or a magnetoresistance effect device comprising an antiferromagnetic layer, a first ferromagnetic layer, a Co layer, a nonmagnetic layer, a Co layer, and a second ferromagnetic layer successively stacked. The antiferromagnetic layer comprises a two-layer structure composed of a Ni oxide layer and a Co oxide layer. The Ni oxide layer has a thickness not smaller than 10 nm. The Co oxide layer has a thickness between 0.3 and 3.0 nm. The antiferromagnetic layer comprising the two-layer structure composed of the Ni oxide layer and the Co oxide layer is preferred as compared with that comprising a single layer of Ni oxide because addition of the Co oxide layer reduces the coercive force of the first ferromagnetic layer adjacent thereto. Accordingly, an exchange-coupling magnetic field applied from the antiferromagnetic layer to the first ferromagnetic layer is greater than the coercive force of the first ferromagnetic layer. Thus, occurrence of hysteresis on the R-H curve of the magnetoresistance effect device is suppressed and the MR ratio is increased. It is desirable that the ratio of (the number of Ni atoms)/(the number of Ni atoms+the number of O atoms) in the Ni oxide layer is between 0.3 and 0.7 and that the ratio of (the number of Co atoms)/(the number of Co atoms+the number of O atoms) in the Co oxide is between 0.3 and 0.7.

This is because, in the above-mentioned range, the Ni oxide layer and the Co oxide layer exhibit antiferro-magnetic characteristics to provide the first ferromagnetic layer with exchange anisotropy. In addition, the Co oxide layer preferably has a spinnel structure. This relies upon the experimental result that the exchange anisotropy is more effectively given from the antiferromagnetic layer to the first ferromagnetic layer when the Co oxide layer has a spinnel structure. The two-layer film composed of the Ni oxide layer and the Co oxide layer preferably has a surface roughness not greater than 10 nm. This is because a surface roughness greater than 10 nm increases the hysteresis of the magnetoresistance effect device due to increase in coercive force of the first ferromagnetic layer. The first and the second ferromagnetic layers are preferably made of a material containing NiFe or NiFeCo as a main component. Alternatively, the first ferromagnetic layer is made of a material containing Co as a main component while the second ferromagnetic layer is made of a material containing NiFe or NiFeCo as a main component. The nonmagnetic layer is improved in corrosion resistance by addition of Pd, Al, Ta, In, B, Nb, Hf, Mo, W, Re, Ru, Rh, Ga, Zr, or Ir. The nonmagnetic layer is preferably made of a material selected from a group including Cu, Ag, and Au. This is because a high MR ratio is obtained by the use of Cu, Ag, or Au. When the nonmagnetic layer is formed by the use of a material containing Ag-added Cu or Re-added Cu as a main component, heat resistance is improved. This is because Ag or Re insoluble to Cu concentrates in grain boundary to prevent grain boundary scattering of the ferromagnetic layer to the Cu layer. It is preferred that each of the ferromagnetic layers has a thickness between 1 and 10 nm, the device has a height between 0.1 and 1 μm, the nonmagnetic layer has a thickness between 2 and 3 nm, and the antiferromagnetic layer has a thickness between 10 and 70 nm. This is because a thickness of each ferromagnetic layer not greater than 10 nm weakens magnetostatic coupling between the first and the second ferromagnetic layers to thereby improve a cross point position on the R-H curve. It is noted here that a sufficient MR ratio is difficult to obtain when the thickness of each ferromagnetic layer is smaller than 1 nm. This is because such a smaller thickness reduces the difference in length of mean free path between the parallel state and the anti-parallel state of the magnetization directions of the first and the second ferromagnetic layers. A magnetic field applied to the first ferromagnetic layer during deposition and that applied to the second ferromagnetic layer during deposition are relatively rotated so that the easy magnetization axes of the first and the second ferromagnetic layers intersect each other with an intersecting angle preferably within a range between 70 and 90 degrees. This is because, when the magnetization of the second ferromagnetic layer is oriented in a direction near a hard magnetization axis, the reversal of magnetization is dominantly controlled by a magnetization rotation mode so that the coercive force of the second ferromagnetic layer can be reduced and occurrence of Berkhausen noise is reduced when used as the head.

DESCRIPTION OF THE PREFERRED EMBODIMENTS

In the magnetoresistance effect film according to this invention, it is essential that the antiferromagnetic thin film overlies a first one of the ferromagnetic thin films to apply exchange-biasing force to the first ferromagnetic thin film. This is because, according to the principle of this invention, the maximum resistance is obtained when the magnetization directions of the adjacent ferromagnetic thin films become opposite to each other.

Figure 3:
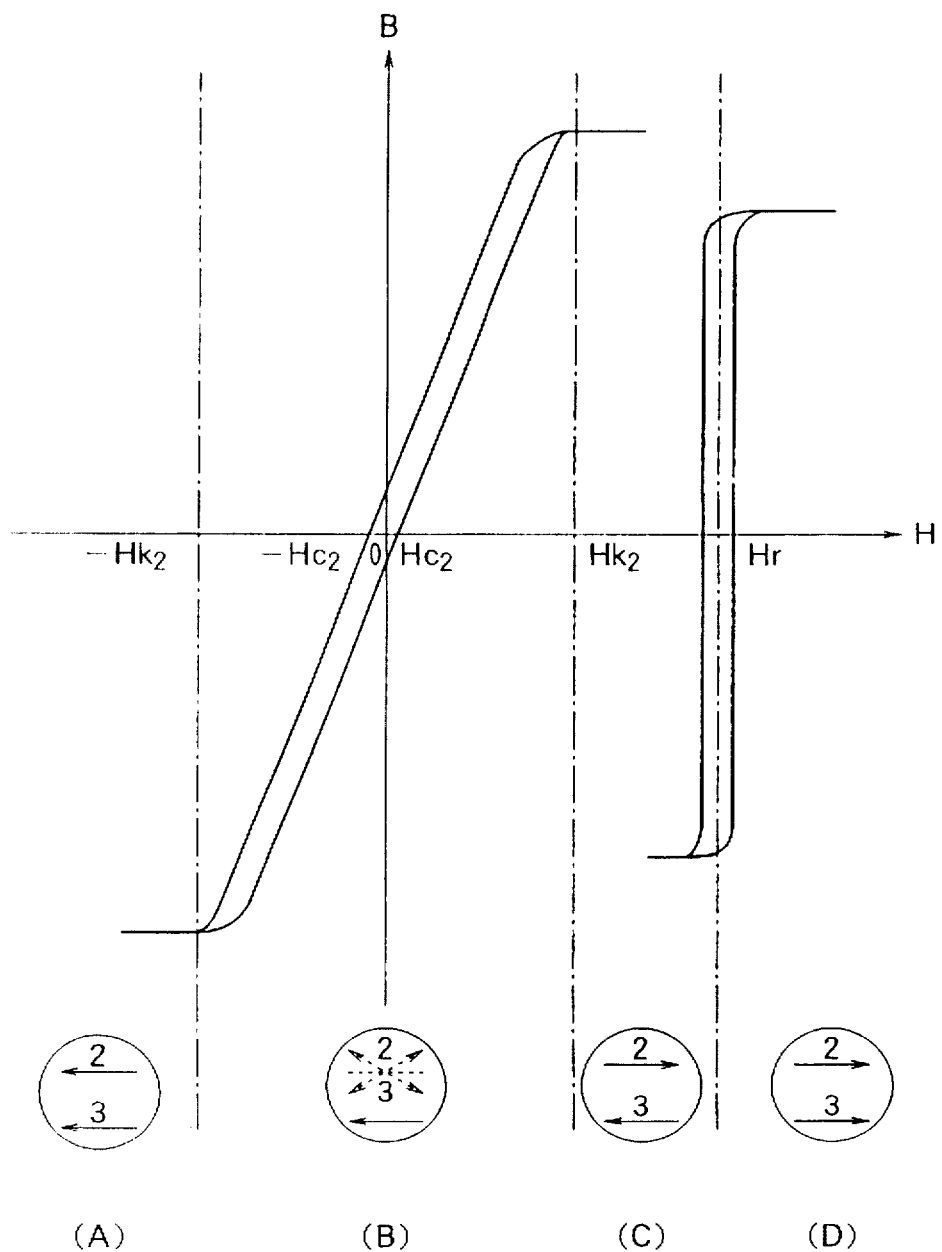
FIG. 3 shows a B-H curve for describing the principle of operation of the magnetoresistance effect film according to this invention.

FIG. 3 shows a B-H curve for describing the principle of operation of the magnetoresistance effect film according to this invention.

Specifically, according to this invention, when an external magnetic field H is between an anisotropy magnetic field $Hk_2$ of the other second one of the ferromagnetic thin films and the antimagnetic force Hr of the first magnetic thin film ($Hk_2 < H < Hr$) as illustrated in FIG. 3, the magnetization directions of the first and the second ferromagnetic thin films become opposite to each other so that the resistance is increased.

Figure 2:
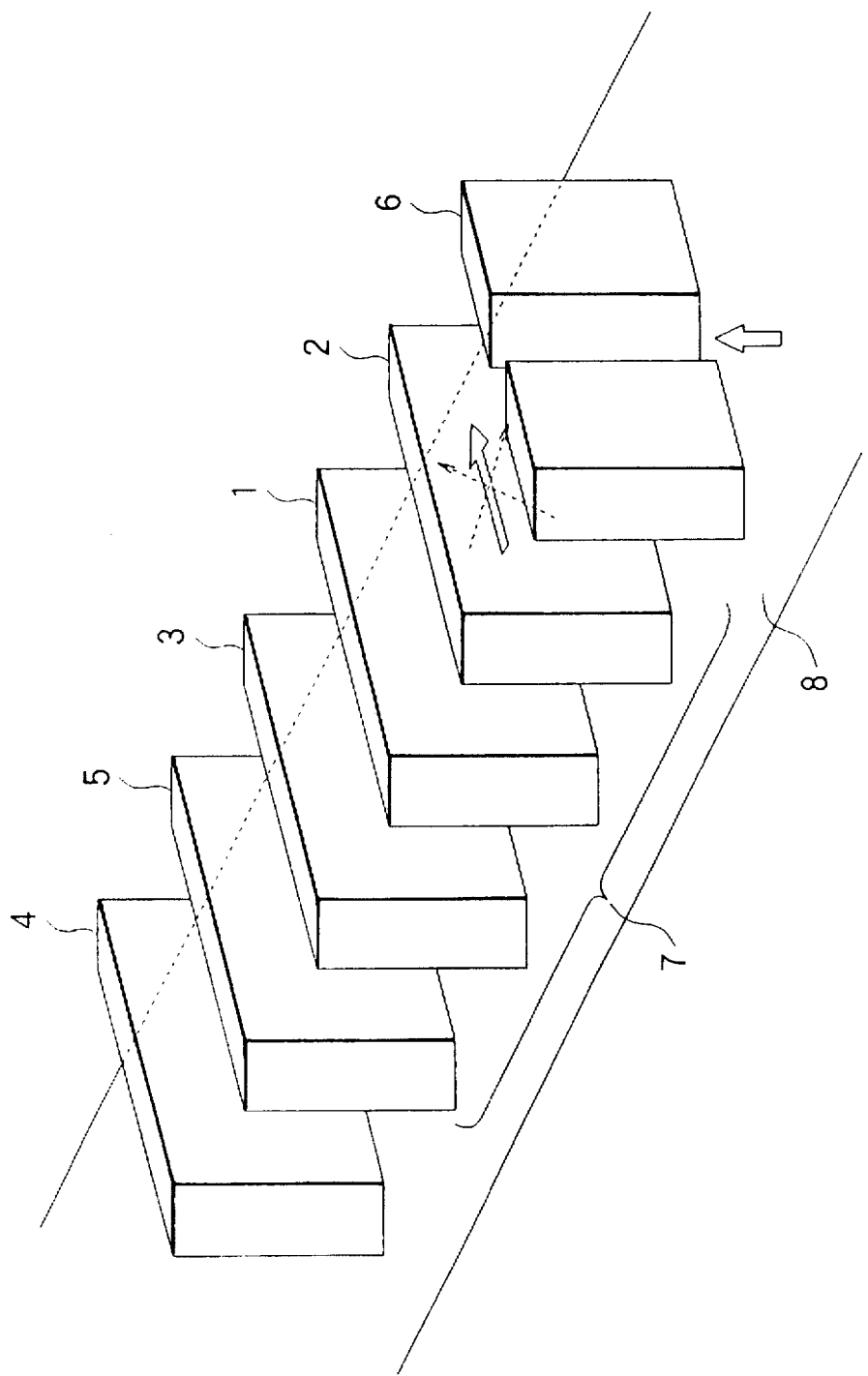
FIG. 2 is an exploded perspective view for describing the structure of the magnetoresistance effect sensor using the magnetoresistance effect film according to this invention.

FIG. 2 is an exploded perspective view for describing a structure of a magnetoresistance effect sensor using the magnetoresistance effect film according to this invention.

The magnetoresistance effect sensor illustrated in FIG. 2 comprises an artificial lattice film 7 formed on a substrate 4. The artificial lattice film 7 comprises an antiferromagnetic thin film 5 formed on the substrate 4, and ferromagnetic thin films 2 and 3 stacked one over the other with a nonmagnetic thin film 1 interposed therebetween. The easy magnetization axes of the ferromagnetic thin films 2 and 3 are arranged perpendicular to each other. The signal magnetic field from a magnetic recording medium 8 is set to be perpendicular to the direction of the easy magnetization axis of the ferromagnetic thin film 2.

The ferromagnetic thin film 3 is applied with unidirectional anisotropy by the antiferromagnetic thin film 5 adjacent thereto. When the magnetization direction of the ferromagnetic thin film 2 is rotated in response to the signal magnetic field from the magnetic recording medium 8, the resistance is changed so that the magnetic field is detected.

Now, description will be made as regards the relationship among the external magnetic field, the coercive force, and the magnetization direction.

Referring to FIG. 3, the antimagnetic force of the first ferromagnetic thin film 3 exchange-biased by the adjacent antiferromagnetic thin film 5 is represented by Hr, the coercive force of the second ferromagnetic thin film 2 by $Hc_2$, and the anisotropic magnetic field by $Hk_2$ ($0 < Hk_2 < Hr$). At first, an external magnetic field H is applied at an intensity satisfying $H \leftarrow Hk_2$ (zone (A)). At this time, the ferromagnetic thin films 2 and 3 are magnetized in a negative (−) direction coincident with the direction of the external magnetic field H. When the intensity of the external magnetic field H is gradually reduced, the magnetization direction of the second ferromagnetic thin film 2 is rotated in a positive (+) direction within a range satisfying $-Hk_2 < H < Hk_2$ (zone (B)). Within a range represented by $Hk_2 < H < Hr$ (zone (C)), the magnetization directions of the ferromagnetic thin films 2 and 3 become opposite to each other. Within a range satisfying $Hr < H$ (zone (D)) where the intensity of the external magnetic field H is further increased, the magnetization direction of the first magnetic thin film 3 is reversed also so that the magnetization directions of the ferromagnetic thin films 2 and 3 are both coincident with the positive (+) direction.

Figure 4:
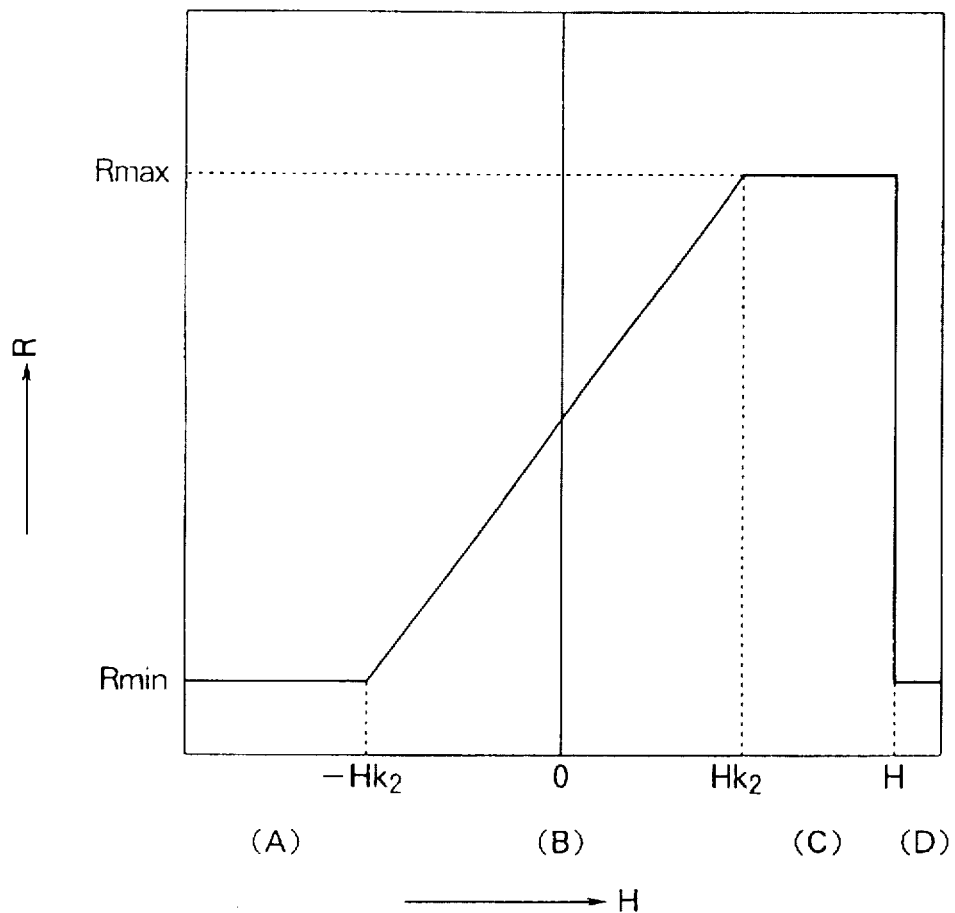
FIG. 4 shows an R-H curve for describing the principle of operation of the magnetoresistance effect film according to this invention.

FIG. 4 shows an R-H curve for describing the principle of operation of the magnetoresistance effect film according to this invention.

In FIG. 4, an ordinate and an abscissa represent the resistance R of the film and the intensity H of the magnetic field, respectively. As illustrated in FIG. 4, the resistance of the film changes in dependence upon the relative magnetization directions of the ferromagnetic thin films 2 and 3 and takes a maximum value (Rmax) in the zone (C).

Now, a magnetoresistance effect film according to this invention will be described with reference to the drawing.

Figure 1:
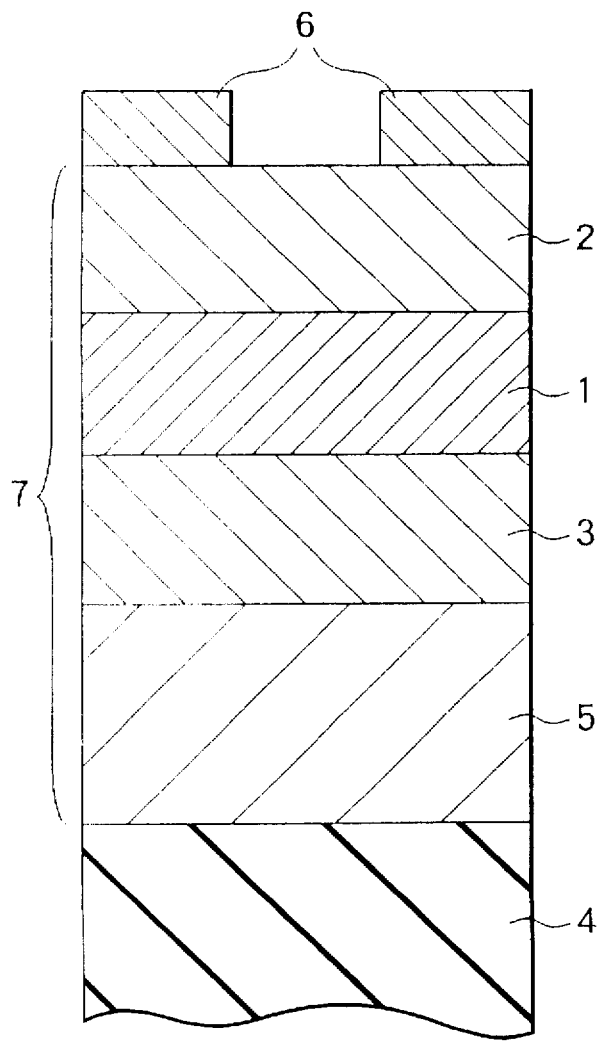
FIG. 1 is a sectional view for describing a structure of a magnetoresistance effect sensor using a magnetoresistance effect film according to this invention.

FIG. 1 is a sectional view for describing a structure of a magnetoresistance effect sensor using the magnetoresistance effect film according to this invention.

As described above, the magnetoresistance effect sensor comprises an artificial lattice film 7 formed on a substrate 4. The artificial lattice film 7 comprises an antiferromagnetic thin film 5 deposited on the substrate 4, for example, Si substrate, first and second ferromagnetic thin films 2 and 3 stacked one over the other on the antiferromagnetic thin film 5, and a nonmagnetic thin film 1 interposed between the ferromagnetic thin films 2 and 3 adjacent to each other. An additional antiferromagnetic thin film or a permanent magnet thin film 6 is stacked adjacent on the ferromagnetic thin film 2.

The magnetoresistance effect film according to this invention and a method of manufacturing the same will later be described in detail for those materials recited in appended claims by the use of specific experimental results.

Now, description will be made as regards a magnetoresistance effect device according to this invention with reference to the drawing.

Figure 25:
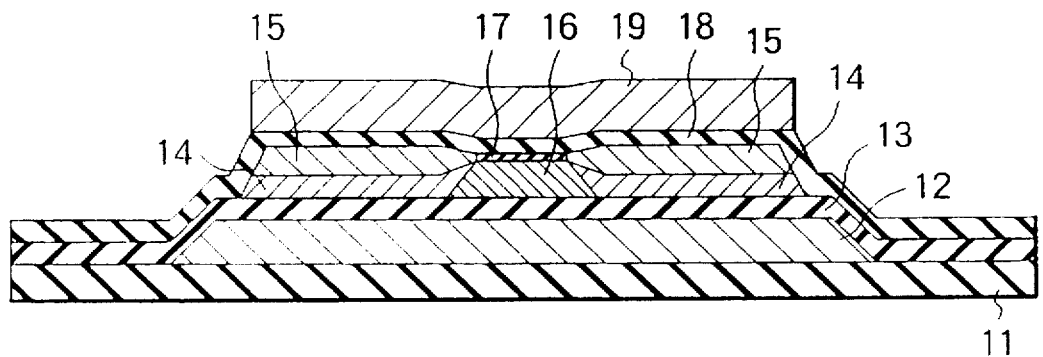
FIG. 25 is a sectional view of one example of a shielded-type magnetoresistance effect sensor according to this invention.

Referring to FIG. 25, a shielded-type magnetoresistance effect device to which this invention is applicable is shown. As illustrated in the figure, a lower shielding layer 12, a lower gap layer 13, and a magnetoresistance effect device 16 are successively stacked on a substrate 11. A gap defining insulation layer 17 may be stacked thereon. The lower shielding layer 12 is often formed into a rectangular shape of a suitable size by a photoresist process. Likewise, the magnetoresistance effect device 16 is formed by the photoresist process into a rectangular shape of a suitable size. A longitudinal biasing layer 14 and a lower electrode layer 15 are successively stacked so that the longitudinal biasing layer 14 and the lower electrode layer 15 are brought into contact with the periphery of the magnetoresistance effect device 16. An upper gap layer 18 and an upper shielding layer 19 are successively stacked thereon.

The substrate 11 is made of an insulating material. Each of the lower and the upper shielding layer 12 and 19 serves as a magnetic shielding layer. Each of the lower and the upper gap layers 13 and 18 is made of an insulating material and serves to electrically insulate the magnetoresistance effect device 16. The longitudinal biasing layer 14 serves to reduce occurrence of noise. The gap defining insulation layer 17 serves to define a distance between two separate portions of the lower electrode layer 15.

Figure 26:
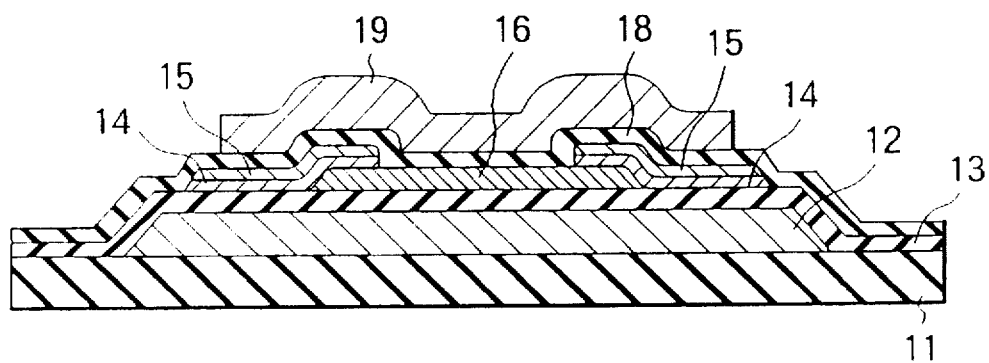
FIG. 26 is a sectional view of another example of a shielded-type magnetoresistance effect sensor according to this invention.

Referring to FIG. 26, another shielded-type magnetoresistance effect device to which this invention is applicable is shown. The structure illustrated in FIG. 26 is similar to that illustrated in FIG. 25 except that the longitudinal biasing layer 14 and the lower electrode layer 15 partially overlap the upper surface of the magnetoresistance effect device 16.

In the structures illustrated in FIGS. 25 and 26, the lower shielding layer may be made of a material such as NiFe, CoZr-based alloy, FeAlSi, and iron nitride-based material. The thickness within a range between 0.5 and 10 μm is applicable. As the lower gap layer, a material such as alumina, $SiO_2$, aluminum nitride, and silicon nitride is applicable. The thickness within a range between 0.03 and 0.20 μm is desirable. The lower electrode is preferably made of a material such as a single element of Zr, Ta, or Mo, an alloy thereof, and a mixture thereof. The thickness is preferably within a range between 0.01 and 0.10 μm. The longitudinal biasing layer may be made of a material such as CoCrPt, CoCr, CoPt, CoCrTa, FeMn, NiMn, Ni oxide, and NiCo oxide. The gap defining insulation layer may be made of a material such as alumina, $SiO_2$, aluminum nitride, and silicon nitride. The thickness within a range between 0.005 and 0.05 μm is desirable. The upper gap layer may be made of a material such as alumina, $SiO_2$, aluminum nitride, and silicon nitride. The thickness within a range between 0.03 and 0.20 μm is desirable.

Figure 27:
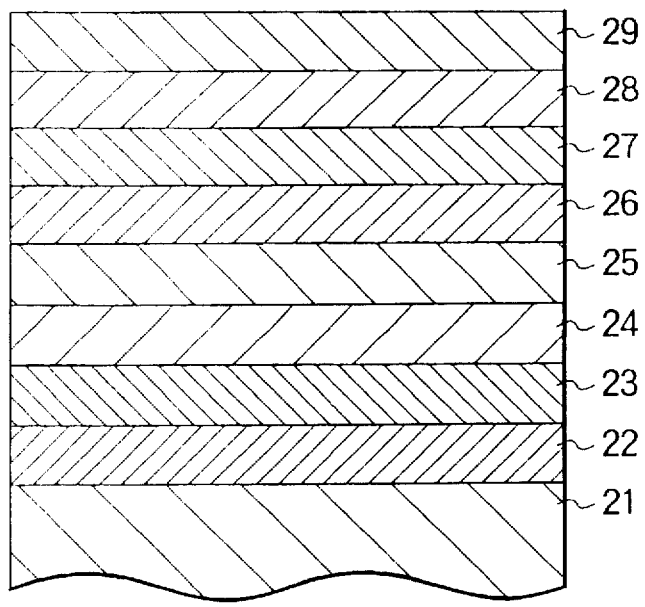
FIG. 27 is a conceptual sketch of a film structure of the magnetoresistance effect device according to this invention.
Figure 28:
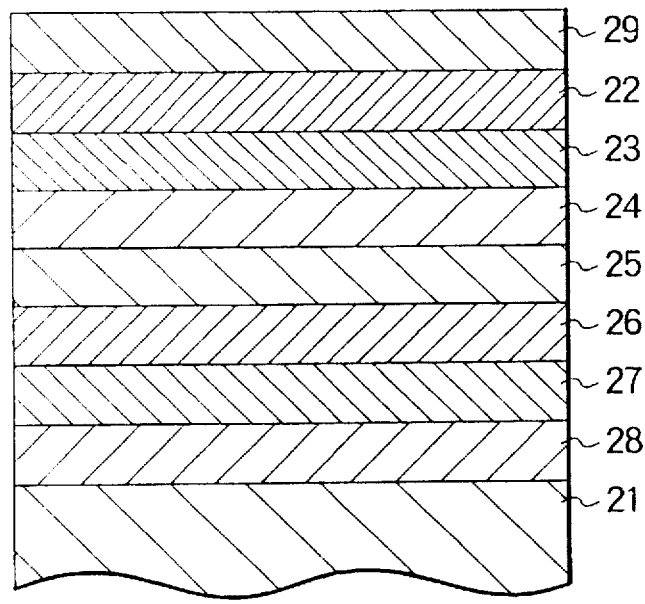
FIG. 28 is a conceptual sketch of another film structure of the magnetoresistance effect device according to this invention.

FIGS. 27 and 28 are conceptual sketches each of which shows a structure of the magnetoresistance effect device used in this invention. Referring to FIG. 27, the magnetoresistance effect device comprises an underlying layer 21, a Ni oxide layer 22, a Co oxide layer 23, a first ferromagnetic layer 24, a first MR enhance layer 25, a nonmagnetic layer 26, a second MR enhance layer 27, a second ferromagnetic layer 28, and a protective layer 29 successively stacked on the underlying layer 21. Referring to FIG. 28, the magnetoresistance effect device comprises an underlying layer 21, a second ferromagnetic layer 28, a second MR enhance layer 27, a nonmagnetic layer 26, a first MR enhance layer 25, a first ferromagnetic layer 24, a Co oxide layer 23, a Ni oxide layer 22, and a protective layer 29 successively stacked on the underlying layer 21.

The first ferromagnetic layer may be made of a material such as NiFe, NiFeCo, CoZr-based material, FeCoB, sendust, iron nitride-based material, and FeCo. The thickness is preferably between 1 and 10 nm. The first MR enhance layer may be made of a material such as Co, NiFeCo, and FeCo. The thickness is preferably between 0.5 and 2 nm. If the first MR enhance layer is not used, the MR ratio is slightly decreased as compared with the case where it is used. In this case, however, the number of processes required in manufacture is reduced correspondingly. The nonmagnetic layer may be made of a material such as Cu, Cu with 1–20 at% Ag added thereto, and Cu with 1–20 at% Re added thereto. The thickness is preferably between 2 and 3 nm. The second MR enhance layer may be made of a material such as Co, NiFeCo, and FeCo. The thickness is preferably between 0.5 and 2 nm. If the second MR enhance layer is not used, the MR ratio is slightly decreased as compared with the case where it is used. In this case, however, the number of processes required in manufacture is reduced correspondingly. The second ferromagnetic layer may be made of a material such as NiFe, NiFeCo, CoZr-based material, FeCoB, sendust, iron nitride-based material, and FeCo. The thickness is preferably between 1 and 10 nm. When the first and the second magnetic layers are made of a material such as a NiFe- or NiFeCo-based alloy, a material such as Ta, Hf, and Zr is selected as the underlying layer. In this event, the first and the second ferromagnetic layers and the nonmagnetic layer have an fcc (face-centered cubic) structure excellent in crystallinity so as to improve the MR ratio. The protective layer may be made of oxide or nitride of an element selected from a group containing Al, Si, Ta, and Ti. Alternatively, use may be made of an element selected from a group containing Cu, Au, Ag, Ta, Hr, Zr, Ir, Si, Pt, Ti, Cr, Al, and C, and mixtures thereof. Use of the protective layer improves the corrosion resistance. On the contrary, when the protective layer is not used, the number of manufacturing processes is reduced to thereby improve productivity.

Now, description will be made as regards magnetoresistance effect films according to several embodiments of this invention.

1st Embodiment

Referring to FIG. 1, a glass substrate 4 was placed in a vacuum unit which was evacuated to the order of 10⁻⁷ Torr. With the substrate temperature kept at the room temperature, an underlying layer and a NiMn thin layer were deposited to thicknesses of 100 angstroms and 200 angstroms, respectively. Subsequently, a NiFe layer was deposited to thereby form an exchange-coupled film.

After the exchange-coupled film was formed at the room temperature as described above, the substrate temperature was raised to 270° C. and held at the temperature for about 10 hours. The substrate temperature was again lowered to the room temperature. Then, a nonmagnetic layer and a magnetic layer were formed to obtain the magnetoresistance effect film.

More specifically, deposition was carried out in the condition where NdFeB magnets were located on both sides of the glass substrate with an external magnetic field on the order of 400 Oe applied in parallel to the glass substrate. When the B-H curve was measured for this sample, the direction of the magnetic field applied during deposition was coincident with the easy magnetization axis of the artificial lattice NiFe layer.

The artificial lattice films mentioned below were deposited at a deposition rate between about 2.2 and 3.5 angstrom/second.

For example, indication of Zr(100)/NiMn(200)/NiFe(60)/Cu(25)/NiFe(60) means that, after the Zr thin film was deposited on the substrate to the thickness of 100 angstroms, the NiMn thin film was deposited thereon to the thickness of 200 angstroms, followed by successive deposition of the 80%Ni-20%Fe alloy thin film of the thickness of 60 angstroms, the Cu thin film of the thickness of 25 angstroms, and the 80%Ni-20%Fe thin film of the thickness of 60 angstroms.

Measurement of magnetization was conducted by the use of a vibrating sample magnetometer. Measurement of resistance was carried out as follows. Sample pieces of a dimension of 1.0×10 mm were prepared from various samples. While an external magnetic field was applied in a film plane in a direction perpendicular to electric current with its intensity varied between −500 and 500 Oe, resistances were measured by the use of the four terminal method. The rate of change in magnetoresistance, ΔR/R, was calculated from the resistances thus measured by Equation (1) where Rmax and Rmin represent a maximum resistance and a minimum resistance, respectively.

$$\frac{\Delta R}{R} = \frac{Rmax - Rmin}{Rmin} \times 100(\%) \quad (1)$$

The artificial lattices prepared are:

1. glass/Ti(100)/NiMn(200)/NiFe(60)/Cu(25)/NiFe(60)
2. glass/Hf(100)/NiMn(200)/NiFe(60)/Cu(25)/NiFe(60)
3. glass/Zr(100)/NiMn(200)/NiFe(60)/Cu(25)/NiFe(60)
4. glass/Y(100)/NiMn(200)/NiFe(60)/Cu(25)/NiFe(60)
5. glass/Cr(100)/NiMn(200)/NiFe(60)/Cu(25)/NiFe(60)
6. glass/Ta(100)/NiMn(200)/NiFe(60)/Cu(25)/NiFe(60)
7. glass/Ti(100)/NiMnCr(200)/NiFe(60)/Cu(25)/NiFe(60)
8. glass/ZrHf(100)/NiMn(200)/NiFe(60)/Cu(25)/NiFe(60)
9. glass/Hf(100)/NiMnCr(200)/NiFe(60)/Cu(25)/NiFe(60)
10. glass/Zr(100)/NiMnCr(200)/NiFe(60)/Cu(25)/NiFe(60)
11. glass/Y(100)/NiMnCr(200)/NiFe(60)/Cu(25)/NiFe(60)
12. glass/Cr(100)/NiMnCr(200)/NiFe(60)/Cu(25)/NiFe(60)
13. glass/Ta(100)/NiMnCr(200)/NiFe(60)/Cu(25)/NiFe(60)
14. glass/ZrHf(100)/NiMnCr(200)/NiFe(60)/Cu(25)/NiFe(60)

Figure 5:
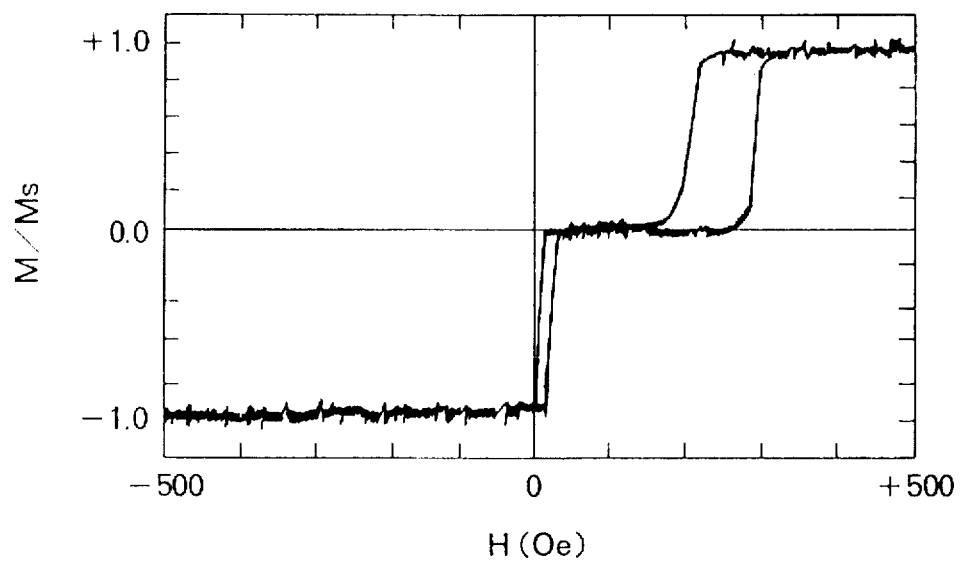
FIG. 5 shows a B-H curve of the magnetoresistance effect film according to this invention.
Figure 6:
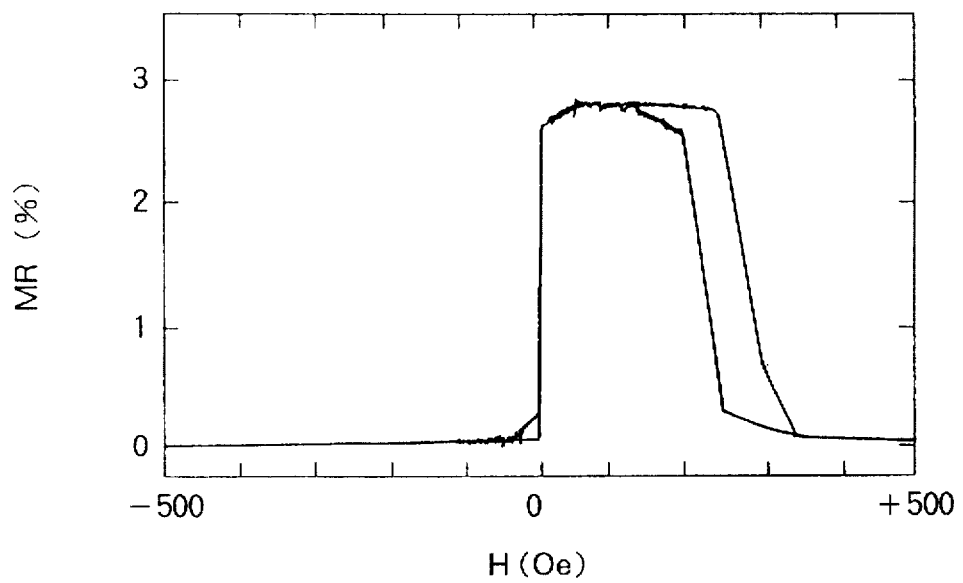
FIG. 6 shows an M-R curve of the magnetoresistance effect film according to this invention.

When the underlying layers were made of Ti, Hf, Zr, Y, Cr, Ta, and ZrHf, the changes in resistance were equal to 2.8, 3.2, 3.0, 2.5, 2.4, 2.6, and 3.3%, respectively. The time durations required for lattice transformation into the fct structure were 12, 8, 10, 15, 16, and 14 hours, respectively, when the heat treatment temperature was 270° C. By addition of 5% C (carbon) to NiMn, the time duration required for lattice transformation was reduced to 2 through 6 hours when the heat treatment temperature was 270° C. By addition of Cr to NiMn, the corrosion resistance was remarkably improved and the life at the room temperature was estimated to be on the order of 15 years. By insertion of the Co layer at the interface between the ferromagnetic layer (NiFe) and the nonmagnetic layer (Cu), the rate of change in resistance was increased to about 4.5%. FIGS. 5 and 6 show the B-H curve and the M-R curve for the artificial lattice film (No. 1), respectively.

FIG. 5 shows the B-H curve of the magnetoresistance effect film according to this invention. In the figure, the ordinate represents the ratio of magnetization to saturation magnetization (M/Ms) and the abscissa represents the magnetic field intensity (H). FIG. 6 shows the M-R curve of the magnetoresistance effect film according to this invention. In the figure, the ordinate represents the rate of change in resistance (MR) and the abscissa represents the magnetic field intensity (H).

The artificial lattice films were patterned by the photoresist process to a size of 1–3 µm×2 µm and forced to be in a single domain state by the use of the CoPtCr film. Thus, the RH curve became linear around the zero magnetic field with the noise suppressed small.

2nd Embodiment

A glass substrate 4 was placed in a vacuum unit which was evacuated to the order of 10⁻⁷ Torr. With the substrate temperature kept at the room temperature, NiO and CoO thin films were deposited to thicknesses of 300 angstroms and 1 to 40 angstroms, respectively. Subsequently, a ferromagnetic layer, a nonmagnetic layer, and another ferromagnetic layer were deposited.

Specifically, deposition was carried out in the condition where NdFeB magnets were located on both sides of the glass substrate with an external magnetic field on the order of 400 Oe applied in parallel to the glass substrate. When the B-H curve was measured for this sample, the direction of the magnetic field applied during deposition was coincident with the easy magnetization axis of the artificial lattice NiFe layer.

The artificial lattice films mentioned below were deposited at a deposition rate between about 2.2 and 3.5 angstrom/second.

For example, indication of NiO(300)/CoO(10)/NiFe(100)/Cu(25)/NiFe(100) means that, after the NiO and the CoO thin films were deposited on the substrate to thicknesses of 300 angstroms and 10 angstroms, respectively, to form the antiferromagnetic layer, the 80%Ni-20%Fe alloy thin film of a thickness of 100 angstroms, the Cu thin film of a thickness of 25 angstroms, and the 80%Ni-20%Fe thin film of a thickness of 100 angstroms were successively deposited.

Measurement of magnetization was carried out in the manner similar to the first embodiment. The rate of change in resistance, A R/R, was calculated by Equation (1) where Rmax and Rmin represent a maximum resistance and a minimum resistance, respectively.

The artificial lattices prepared are:
1. glass/NiO(300)/CoO(10)/NiFe(100)/Cu(25)/NiFe(100)

2. glass/NiO(300)/CoO(20)/NiFe(100)/Cu(25)/NiFe(100)
3. glass/NiO(300)/CoO(40)/NiFe(100)/Cu(25)/NiFe(100)
4. glass/NiO(300)/CoO(10)/NiFe(90)/Co(10)/Cu(25)/Co(10)/NiFe(100)

Figure 7:
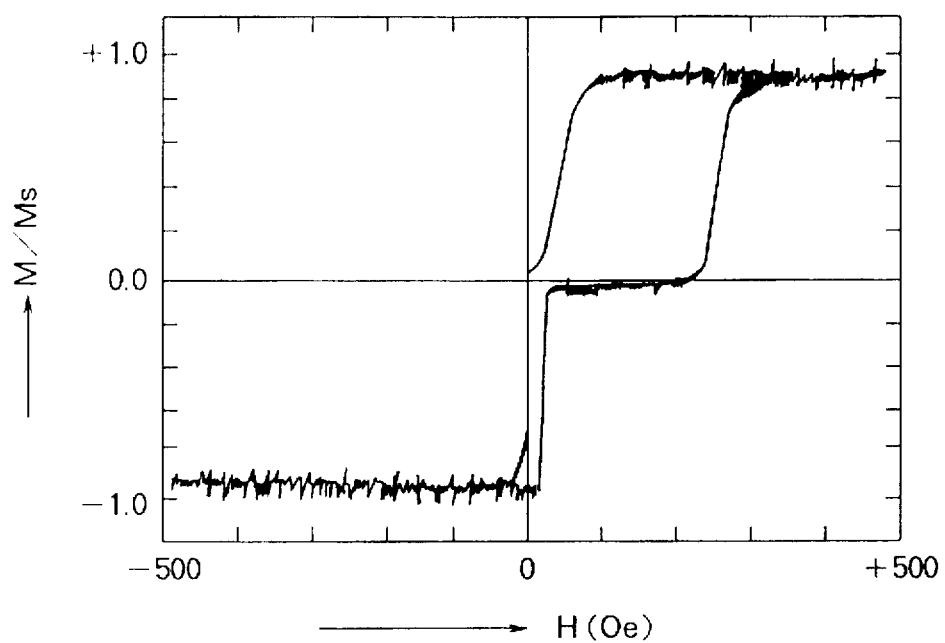
FIG. 7 shows a B-H curve of the magnetoresistance effect film according to this invention.
Figure 8:
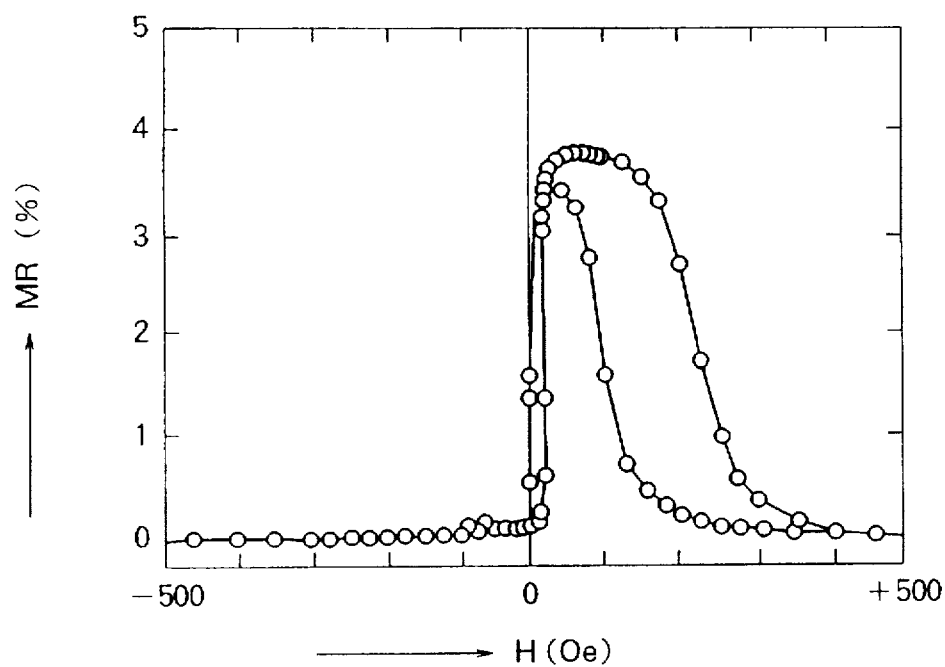
FIG. 8 shows an M-R curve of the magnetoresistance effect film according to this invention.

When the thickness of the nonmagnetic layer was 25 angstroms, the rate of change in resistance was on the order of 3.8%. When the Co layer was inserted at the interface between the ferromagnetic layer (NiFe) and the nonmagnetic layer (Cu), the rate of change in resistance was 6%. When the thickness of the CoO film was 20 angstroms, the exchange-coupling magnetic field was on the order of 150 Oe. FIGS. 7 and 8 show the B-H curve and the M-R curve for the artificial lattice film (No. 1), respectively. The artificial lattice films were patterned by the photoresist process to a size of 1–2 µm×2 µm and forced to be in a single domain state by the use of the CoPtCr film. In this event, the R-H curve had little hysteresis and was free from Berkhausen noise.

FIG. 7 shows the B-H curve of the magnetoresistance effect film according to this invention. In the figure, the ordinate represents the ratio of magnetization to saturation magnetization (M/Ms) and the abscissa represents the magnetic field intensity (H). FIG. 8 shows the M-R curve of the magnetoresistance effect film according to this invention. In the figure, the ordinate represents the ratio of change in resistance (MR) and the abscissa represents the magnetic field intensity (H).

Now, description will be made as regards the magnetoresistance effect film and a method of manufacturing the same according to another embodiment of this invention.

A glass substrate 4 was placed in a vacuum unit which was evacuated to the order of $10^{-7}$ Torr. With the substrate temperature kept between the room temperature and 300° C., a Ni oxide film having a thickness between 100 and 600 angstroms and a Co oxide film or a NiCo oxide film or a NiCo oxide multilayer film of a thickness between 1 and 40 angstroms were deposited. Subsequently, a ferromagnetic layer (NiFe, Co, FeCo, NiCo, or NiFeCo) was deposited as an exchange-coupled film.

After the exchange-coupled film was formed at a temperature between the room temperature and 300° C., the substrate temperature was lowered to the room temperature. Then, a nonmagnetic layer and a ferromagnetic layer were formed to obtain the magnetoresistance effect film.

The artificial lattice films mentioned below were deposited at a deposition rate between 1.0 and 1.4 angstrom/second for the oxide antiferromagnetic film and at a deposition rate between about 2.2 and 3.5 angstrom/second for the ferromagnetic thin film and the nonmagnetic thin film.

For example, indication of NiO x(300)/CoO$_y$(10)/NiFe(60)/Cu(25)/NiFe(60) means that, after the NiO thin film and the CoO$_y$ thin film were deposited on the substrate to thicknesses of 300 angstroms and 10 angstroms, respectively, to form the antiferromagnetic layer, the 80%Ni-20%Fe alloy thin film of a thickness of 60 angstroms, the Cu thin film of a thickness of 25 angstroms, and the 80%Ni-20%Fe thin film of a thickness of 60 angstroms were successively deposited.

The spin-valve films thus prepared are as follows.

1. Nonmagnetic layer Cu
    (a) NiO$_x$/CoO$_y$-based sample
        i. glass/NiO$_x$(150–500)/CoO$_y$(1–40)/NiFe(20–150)/Cu(8–40)/NiFe(20–150)
    (b) NiO$_x$/NiCoO$_y$-based sample
        i. glass/NiO$_x$(150–500)/Ni$_{0.1}$Co$_{0.9}$O$_y$(1–40)/NiFe(20–150)/Cu(8–40)/NiFe(20–150)
        ii. glass/NiO$_x$(150–500)/Ni$_{0.3}$Co$_{0.7}$O$_y$(1–40)/NiFe(20–150)/Cu(8–40)/NiFe(20–150)
        iii. glass/NiO$_x$(150–500)/Ni$_{0.5}$Co$_{0.5}$O$_y$(1–40)/NiFe(20–150)/Cu(8–40)/NiFe(20–150)
        iv. glass/NiO$_x$(150–500)/Ni$_{0.7}$Co$_{0.3}$O$_y$(1–40)/NiFe(20–150)/Cu(8–40)/NiFe(20–150)
        v. glass/NiO$_x$(150–500)/Ni$_{0.9}$Co$_{0.1}$O$_y$(1–40)/NiFe(20–150)/Cu(8–40)/NiFe(20–150)
    (c) NiO$_x$/NiCoO$_y$-based multilayer sample
        i. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.3}$Co$_{0.7}$O$_y$(3)/NiFe(20–150)/Cu(8–40)/NiFe(20–150)
        ii. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.1}$Co$_{0.9}$O$_y$(3)/NiFe(20–150)/Cu(8–40)/NiFe(20–150)
        iii. glass/NiO$_x$(150–500)/Ni$_{0.9}$Co$_{0.1}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/NiFe(20–150)/Cu(8–40)/NiFe(20–150)
        iv. glass/NiO$_x$(150–500)/Ni$_{0.9}$Co$_{0.1}$O$_y$(3)/Ni$_{0.5}$Co$_{0.5}$O$_y$(3)/Ni$_{0.3}$Co$_{0.7}$O$_y$(3)/N$_{0.1}$Co$_{0.9}$O$_y$(3)/NiFe(20–150)/Cu(8–40)/NiFe(20–150)
        v. glass/NiO$_x$(150–500)/Ni$_{0.5}$Co$_{0.5}$O$_y$(3)/Ni$_{0.7}$Co$_{0.3}$O$_y$(3)/Ni$_{0.3}$Co$_{0.7}$O$_y$(3)/Ni$_{0.1}$O$_y$(3)/NiFe(20–150)/Cu(8–40)/NiFe(20–150)
        vi. glass/NiO$_x$(150–500)/Ni$_{0.5}$Co$_{0.5}$O$_y$(3)/Ni$_{0.9}$Co$_{0.1}$O$_y$(3)/Ni$_{0.3}$Co$_{0.7}$O$_y$(3)/Ni$_{0.1}$Co$_{0.9}$O$_y$(3)/NiFe(20–150)/Cu(8–40)/NiFe(20–150)

2. Magnetic pinned layer Co
    (a) NiO$_x$/CoO$_y$-based sample
        i. glass/NiO$_x$(150–500)/CoO$_y$(1–40)/Co(20–150)/Cu(8–40)/NiFe(20–150)
    (b) NiO$_x$/NiCoO$_y$-based sample
        i. glass/NiO$_x$(150–500)/Ni$_{0.1}$Co$_{0.9}$O$_y$(1–40)/Co(20–150)/Cu(8–40)/NiFe(20–150)
        ii. glass/NiO$_x$(150–500)/Ni$_{0.3}$Co$_{0.7}$O$_y$(1–40)/Co(20–150)/Cu(8–40)/NiFe(20–150)
        iii. glass/NiO$_x$(150–500)/Ni$_{0.5}$Co$_{0.5}$O$_y$(1–40)/Co(20–150)/Cu(8–40)/NiFe(20–150)
        iv. glass/NiO$_x$(150–500)/Ni$_{0.7}$Co$_{0.3}$O$_y$(1–40)/(Co(20–150)/Cu(8–40)/NiFe(20–150)
        v. glass/NiO$_x$(150–500)/Ni$_{0.9}$Co$_{0.1}$O$_y$(1–40)/Co(20–150)/Cu(8–40)/NiFe(20–150)
    (c) NiO$_x$/NiCoO$_y$-based multilayer sample
        i. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.3}$Co$_{0.7}$O$_y$(3)/Co(20–150)/Cu(8–40)/NiFe(20–150)
        ii. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.1}$Co$_{0.9}$O$_y$(3)/Co(20–150)/Cu(8–40)/NiFe(20–150)
        iii. glass/NiO$_x$(150–500)/Ni$_{0.9}$Co$_{0.1}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/Co(20–150)/Cu(8–40)/NiFe(20–150)
        iv. glass/NiO$_x$(150–500)/Ni$_{0.9}$Co$_{0.1}$O$_y$(3)/Ni$_{0.5}$Co$_{0.5}$O$_y$(3)/Ni$_{0.3}$Co$_{0.7}$O$_y$(3)/Ni$_{0.1}$Co$_{0.9}$O$_y$(3)/Co(20–150)/Cu(8–40)/NiFe(20–150)
        v. glass/NiO$_x$(150–500)/Ni$_{0.5}$Co$_{0.5}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/Co(20–150)/Cu(8–40)/NiFe(20–150)
        vi. glass/NiO$_x$(150–500)/Ni$_{0.5}$Co$_{0.5}$O$_y$(3)/Ni$_{0.9}$Co$_{0.1}$O$_y$(3)/Ni$_{0.3}$Co$_{0.7}$O$_y$(3)/Ni$_{0.1}$Co$_{0.9}$O$_y$(3)/Co(20–150)/Cu(8–40)/NiFe(20–150)

3. Nonmagnetic layer Au
    (a) NiO$_x$/CoO$_y$-based sample
        i. glass/NiO$_x$(150–500)/CoO$_y$(1–40)/NiFe(20–150)/Au(8–40)/NiFe(20–150)

(b) $NiO_x/NiCoO_y$-based sample
i. glass/$NiO_x$(150–500)/$Ni_{0.1}Co_{0.9}O_y$(1–40)/NiFe(20–150)/Au(8–40)/NiFe(20–150)
ii. glass/$NiO_x$(150–500)/$Ni_{0.3}Co_{0.7}O_y$(1–40)/NiFe(20–150)/Au(8–40)/NiFe(20–150)
iii. glass/$NiO_x$(150–500)/$Ni_{0.5}Co_{0.5}O_y$(1–40)/NiFe(20–150)/Au(8–40)/NiFe(20–150)
iv. glass/$NiO_x$(150–500)/$Ni_{0.7}Co_{0.3}O_y$(1–40)/NiFe(20–150)/Au(8–40)/NiFe(20–150)
v. glass/$NiO_x$(150–500)/$Ni_{0.9}Co_{0.1}O_y$(1–40)/NiFe(20–150)/Au(8–40)/NiFe(20–150)

(c) $NiO_x/NiCoO_y$-based multilayer sample
i. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.3}Co_{0.7}O_y$(3)/NiFe(20–150)/Au(8–40)/NiFe(20–150)
ii. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.1}Co_{0.9}O_y$(3)/NiFe(20–150)/Au(8–40)/NiFe(20–150)
iii. glass/$NiO_x$(150–500)/$Ni_{0.9}Co_{0.1}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Au(8–40)/NiFe(20–150)
iv. glass/$NiO_x$(150–500)/$Ni_{0.9}Co_{0.1}O_y$(3)/$Ni_{0.5}Co_{0.5}O_y$(3)/$Ni_{0.3}Co_{0.7}O_y$(3)/$Ni_{0.1}Co_{0.9}O_y$(3)/NiFe(20–150)/Au(8–40)/NiFe(20–150)
v. glass/$NiO_x$(150–500)/$Ni_{0.5}Co_{0.5}O_y$(3)/$Ni_{0.7}Co_{0.3}O_y$(3)$Ni_{0.3}Co_{0.7}O_y$(3)/$N_{0.1}Co_{0.9}O_y$(3)/NiFe(20–150)/Au(8–40)/NiFe(20–150)
vi. glass/$NiO_x$(150–500)/$Ni_{0.5}Co_{0.5}O_y$(3)/$Ni_{0.9}Co_{0.1}O_y$(3)/$Ni_{0.3}Co_{0.7}O_y$(3)/$Ni_{0.1}Co_{0.9}O_y$(3)/NiFe(20–150)/Au(8–40)/NiFe(20–150)

4. Nonmagnetic layer Ag
(a) $NiO_x/CoO_y$-based sample
i. glass/$NiO_x$(150–500)/$CoO_y$(1–40)/NiFe(20–150)/Ag(8–40)/NiFe(20–150)

(b) $NiO_x/NiCoO_y$-based sample
i. glass/$NiO_x$(150–500)/$Ni_{0.1}Co_{0.9}O_y$(1–40)/NiFe(20–150)/Ag(8–40)/NiFe(20–150)
ii. glass/$NiO_x$(150–500)/$Ni_{0.3}Co_{0.7}O_y$(1–40)/NiFe(20–150)/Ag(8–40)/NiFe(20–150)
iii. glass/$NiO_x$(150–500)/$Ni_{0.5}Co_{0.5}O_y$(1–40)/NiFe(20–150)/Ag(8–40)/NiFe(20–150)
iv. glass/$NiO_x$(150–500)/$Ni_{0.7}Co_{0.3}O_y$(1–40)/NiFe(20–150)/Ag(8–40)/NiFe(20–150)
v. glass/$NiO_x$(150–500)/$Ni_{0.9}Co_{0.1}O_y$(1–40)/NiFe(20–150)/Ag(8–40)/NiFe(20–150)

(c) $NiO_x/NiCoO_y$-based multilayer sample
i. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.3}Co_{0.7}O_y$(3)/NiFe(20–150)/Ag(8–40)/NiFe(20–150)
ii. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.1}Co_{0.9}O_y$(3)/NiFe(20–150)/Ag(8–40)/NiFe(20–150)
iii. glass/$NiO_x$(150–500)/$Ni_{0.9}Co_{0.1}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Ag(8–40)/NiFe(20–150)
iv. glass/$NiO_x$(150–500)/$Ni_{0.9}Co_{0.1}O_y$(3)/$Ni_{0.5}Co_{0.5}O_y$(3)/$Ni_{0.3}Co_{0.7}O_y$(3)/$Ni_{0.1}Co_{0.9}O_y$(3)/NiFe(20–150)/Ag(8–40)/NiFe(20–150)
v. glass/$NiO_x$(150–500)/$Ni_{0.5}Co_{0.5}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Ag(8–40)/NiFe(20–150)
vi. glass/$NiO_x$(150–500)/$Ni_{0.5}Co_{0.5}O_y$(3)/$Ni_{0.9}Co_{0.1}O_y$(3)/$Ni_{0.3}Co_{0.7}O_y$(3)/$Ni_{0.1}Co_{0.9}O_y$(3)/NiFe(20–150)/Ag(8–40)/NiFe(20–150)

5. Nonmagnetic layer Ru
(a) $NiO_x/CoO_y$-based sample
i. glass/$NiO_x$(150–500)/$CoO_y$(1–40)/NiFe(20–150)/Ru(8–40)/NiFe(20–150)

(b) $NiO_x/NiCoO_y$-based sample
i. glass/$NiO_x$(150–500)/$Ni_{0.1}Co_{0.9}O_y$(1–40)/NiFe(20–150)/Ru(8–40)/NiFe(20–150)
ii. glass/$NiO_x$(150–500)/$Ni_{0.3}Co_{0.7}O_y$(1–40)/NiFe(20–150)/Ru(8–40)/NiFe(20–150)
iii. glass/$NiO_x$(150–500)/$Ni_{0.5}Co_{0.5}O_y$(1–40)/NiFe(20–150)/Ru(8–40)/NiFe(20–150)
iv. glass/$NiO_x$(150–500)/$Ni_{0.7}Co_{0.3}O_y$(1–40)/NiFe(20–150)/Ru(8–40)/NiFe(20–150)
v. glass/$NiO_x$(150–500)/$Ni_{0.9}Co_{0.1}O_y$(1–40)/NiFe(20–150)/Ru(8–40)/NiFe(20–150)

(c) $NiO_x/NiCoO_y$-based multilayer sample
i. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.3}Co_{0.7}O_y$(3)/NiFe(20–150)/Ru(8–40)/NiFe(20–150)
ii. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.1}Co_{0.9}O_y$(3)/NiFe(20–150)/Ru(8–40)/NiFe(20–150)
iii. glass/$NiO_x$(150–500)/$Ni_{0.9}Co_{0.1}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Ru(8–40)/NiFe(20–150)
iv. glass/$NiO_x$(150–500)/$Ni_{0.9}Co_{0.1}O_y$(3)/$Ni_{0.5}Co_{0.5}O_y$(3)/$Ni_{0.3}Co_{0.7}O_y$(3)/$Ni_{0.1}Co_{0.9}O_y$(3)/NiFe(20–150)/Ru(8–40)/NiFe(20–150)
v. glass/$NiO_x$(150–500)/$Ni_{0.5}Co_{0.5}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Ru(8–40)/NiFe(20–150)
vi. glass/$NiO_x$(150–500)/$Ni_{0.5}Co_{0.5}O_y$(3)/$Ni_{0.9}Co_{0.1}O_y$(3)/$Ni_{0.3}Co_{0.7}O_y$(3)/$Ni_{0.1}Co_{0.9}O_y$(3)/NiFe(20–150)/Ru(8–40)/NiFe(20–150)

6. Nonmagnetic layer Re
(a) $NiO_x/CoO_y$-based sample
i. glass/$NiO_x$(150–500)/$CoO_y$(1–40)/NiFe(20–150)/Re(8–40)/NiFe(20–150)

(b) $NiO_x/NiCoO_y$-based sample
i. glass/$NiO_x$(150–500)/$Ni_{0.1}Co_{0.9}O_y$(1–40)/NiFe(20–150)/Re(8–40)/NiFe(20–150)
ii. glass/$NiO_x$(150–500)/$Ni_{0.3}Co_{0.7}O_y$(1–40)/NiFe(20–150)/Re(8–40)/NiFe(20–150)
iii. glass/$NiO_x$(150–500)/$Ni_{0.5}Co_{0.5}O_y$(1–40)/(NiFe(20–150)/Re(8–40)/NiFe(20–150)
iv. glass/$NiO_x$(150–500)/$Ni_{0.7}Co_{0.3}O_y$(1–40)/NiFe(20–150)/Re(8–40)/NiFe(20–150)
v. glass/$NiO_x$(150–500)/$Ni_{0.9}Co_{0.1}O_y$(1–40)/NiFe(20–150)/Re(8–40)/NiFe(20–150)

(c) $NiO_x/NiCoO_y$-based multilayer sample
i. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.3}Co_{0.7}O_y$(3)/NiFe(20–150)/Re(8–40)/NiFe(20–150)
ii. glass/$NiO_x$(150–500)/$Ni_{0.9}Co_{0.1}O_y$(3)/$Ni_{0.7}Co_{0.3}O_y$(3)/$Ni_{0.5}Co_{0.5}O_y$(3)/$Ni_{0.1}Co_{0.9}O_y$(3)/NiFe(20–150)/Re(8–40)/NiFe(20–150)
iii. glass/$NiO_x$(150–500)/$Ni_{0.9}Co_{0.1}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Re(8–40)/NiFe(20–150)
iv. glass/$NiO_x$(150–500)/$Ni_{0.9}Co_{0.1}O_y$(3)/$Ni_{0.5}Co_{0.5}O_y$(3)/$Ni_{0.3}Co_{0.7}O_y$(3)/$Ni_{0.1}Co_{0.9}O_y$(3)/NiFe(20–150)/Re(8–40)/NiFe(20–150)
v. glass/$NiO_x$(150–500)/$Ni_{0.5}Co_{0.5}O_y$(3)/$Ni_{0.7}Co_{0.3}O_y$(3)/$Ni_{0.3}Co_{0.7}O_y$(3)/$Ni_{0.1}Co_{0.9}O_y$(3)/NiFe(20–150)/Re(8–40)/NiFe(20–150)

vi. glass/NiO$_x$(150–500)/Ni$_{0.5}$Co$_{0.5}$O$_y$(3)/Ni$_{0.9}$Co$_{0.1}$O$_y$(3)/Ni$_{0.3}$Co$_{0.7}$O$_y$(3)/Ni$_{0.1}$Co$_{0.9}$O$_y$(3)/NiFe(20–150)/Re(8–40)/NiFe(20–150)

7. Nonmagnetic layer Cu$_{1-x}$Ag$_x$ (a) NiO$_x$/CoO$_y$-based sample
 i. glass/NiO$_x$(150–500)/CoO$_y$(1–40)/NiFe(20–150)/Cu$_{1-x}$Ag$_x$(8–40)/NiFe(20–150)

(b) NiO$_x$/NiCoO$_y$-based sample
 i. glass/NiO$_x$(150–500)/Ni$_{0.1}$Co$_{0.9}$O$_y$(1–40)/NiFe(20–150)/Cu$_{1-x}$Ag$_x$(8–40)/NiFe(20–150)
 ii. glass/NiO$_x$(150–500)/Ni$_{0.3}$Co$_{0.7}$O$_y$(1–40)/NiFe(20–150)/Cu$_x$Ag$_x$(8–40)/NiFe(20–150)
 iii. glass/NiO$_x$(150–500)/Ni$_{0.5}$Co$_{0.5}$O$_y$(1–40)/NiFe(20–150)/Cu$_x$Ag$_x$(8–40)/NiFe(20–150)
 iv. glass/NiO$_x$(150–500)/Ni$_{0.7}$Co$_{0.3}$O$_y$(1–40)/NiFe(20–150)/Cu$_x$Ag$_x$(8–40)/NiFe(20–150)
 v. glass/NiO$_x$(150–500)/Ni$_{0.9}$Co$_{0.1}$O$_y$(1–40)/NiFe(20–150)/Cu$_x$Ag$_x$(8–40)/NiFe(20–150)

(c) NiO$_x$/NiCoO$_y$-based multilayer sample
 i. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.3}$Co$_{0.7}$O$_y$(3)/NiFe(20–150)/Cu$_x$Ag$_x$(8–40)/NiFe(20–150)
 ii. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.1}$Co$_{0.9}$O$_y$(3)/NiFe(20–150)/Cu$_x$Ag$_x$(8–40)/NiFe(20–150)
 iii. glass/NiO$_x$(150–500)/Ni$_{0.9}$Co$_{0.1}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/NiFe(20–150)/Cu$_x$Ag$_x$(8–40)/NiFe(20–150)
 iv. glass/NiO$_x$(150–500)/Ni$_{0.9}$Co$_{0.1}$O$_y$(3)/Ni$_{0.5}$Co$_{0.5}$O$_y$(3)/Ni$_{0.3}$Co$_{0.7}$O$_y$(3)/Ni$_{0.1}$Co$_{0.9}$O$_y$(3)/NiFe(20–150)/Cu$_x$Ag$_x$(8–40)/NiFe(20–150)
 v. glass/NiO$_x$(150–500)/Ni$_{0.5}$Co$_{0.5}$O$_y$(3)/Ni$_{0.7}$Co$_{0.3}$O$_y$/Ni$_{0.3}$Co$_{0.7}$O$_y$(3)/Ni$_{0.1}$Co$_{0.9}$O$_y$(3)/NiFe(20–150)/Cu$_x$Ag$_x$(8–40)/NiFe(20–150)
 vi. glass/NiO$_x$(150–500)/Ni$_{0.5}$Co$_{0.5}$O$_y$(3)/Ni$_{0.9}$Co$_{0.1}$O$_y$(3)/Ni$_{0.3}$Co$_{0.7}$O$_y$(3)/Ni$_{0.1}$Co$_{0.9}$O$_y$(3)/NiFe(20–150)/Cu$_x$Ag$_x$(8–40)/NiFe(20–150)

8. Nonmagnetic layer Cu$_{1-x}$Re$_x$ (a) NiO$_x$/CoO$_y$-based sample
 i. glass/NiO$_x$(150–500)/CoO$_y$(1–40)/NiFe(20–150)/Cu$_{1-x}$Re$_x$(8–40)/NiFe(20–150)

(b) NiO$_x$/NiCoO$_y$-based sample
 i. glass/NiO$_x$(150–500)/Ni$_{0.1}$Co$_{0.9}$O$_y$(1–40)/NiFe(20–150)/Cu$_{1-x}$Re$_x$(8–40)/NiFe(20–150)
 ii. glass/NiO$_x$(150–500)/Ni$_{0.3}$Co$_{0.7}$O$_y$(1–40)/NiFe(20–150)/Cu$_{1-x}$Re$_x$(8–40)/NiFe(20–150)
 iii. glass/NiO$_x$(150–500)/Ni$_{0.5}$Co$_{0.5}$O$_y$(1–40)/NiFe(20–150)/Cu$_{1-x}$Re$_x$(8–40)/NiFe(20–150)
 iv. glass/NiO$_x$(150–500)/Ni$_{0.7}$Co$_{0.3}$O$_y$(1–40)/NiFe(20–150)/Cu$_{1-x}$Re$_x$(8–40)/NiFe(20–150)
 v. glass/NiO$_x$(150–500)/Ni$_{0.9}$Co$_{0.1}$O$_y$(1–40)/NiFe(20–150)/Cu$_{1-x}$Re$_x$(8–40)/NiFe(20–150)

(c) NiO$_x$/NiCoO$_y$-based multilayer sample
 i. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.3}$Co$_{0.7}$O$_y$(3)/NiFe(20–150)/Cu$_{1-x}$Re$_x$(8–40)/NiFe(20–150)
 ii. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.1}$Co$_{0.9}$O$_y$(3)/NiFe(20–150)/Cu$_{1-x}$Re$_x$(8–40)/NiFe(20–150)
 iii. glass/NiO$_x$(150–500)/Ni$_{0.9}$Co$_{0.1}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/NiFe(20–150)/Cu$_{1-x}$Re$_x$(8–40)/NiFe(20–150)
 iv. glass/NiO$_x$(150–500)/Ni$_{0.9}$Co$_{0.1}$O$_y$(3)/Ni$_{0.5}$Co$_{0.5}$O$_y$(3)/Ni$_{0.3}$Co$_{0.7}$O$_y$(3)/Ni$_{0.1}$Co$_{0.9}$O$_y$(3)/NiFe(20–150)/Cu$_{1-x}$Re$_x$(8–40)/NiFe(20–150)

v. glass/NiO$_x$(150–500)/Ni$_{0.5}$Co$_{0.5}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/NiFe(20–150)/Cu$_{1-x}$Re$_x$(8–40)/NiFe(20–150)
vi. glass/NiO$_x$(150–500)/Ni$_{0.5}$Co$_{0.5}$O$_y$(3)/Ni$_{0.9}$Co$_{0.1}$O$_y$(3)/Ni$_{0.3}$Co$_{0.7}$O$_y$(3)/Ni$_{0.1}$Co$_{0.9}$O$_y$(3)/NiFe(20–150)/Cu$_{1-x}$Re$_x$(8–40)/NiFe(20–150)

9. Samples dependent on the thickness of the antioxidizing layer (a) glass/NiO$_x$(150–500)/CoO$_y$(10)/Fe(3–30)/NiFe(20–150)/Cu(8–40)/NiFe(20–150)
(b) glass/NiO$_x$(150–500)/CoO$_y$(10)/Ni(3–30)/NiFe(20–150)/Cu(8–40)/NiFe(20–150)
(c) glass/NiO$_x$(150–500)/CoO$_y$(10)/Co(3–30)/NiFe(20–150)/Cu(8–40)/NiFe(20–150)
(d) glass/NiO$_x$(150–500)/CoO$_y$(10)/FeCo(3–30)/NiFe(20–150)/Cu(8–40)/NiFe(20–150)
(e) glass/NiO$_x$(150–500)/CoO$_y$(10)/NiCo(3–30)/NiFe(20–150)/Cu(8–40)/NiFe(20–150)

10. Insertion of the Co layer at the interface between the magnetic layer and the nonmagnetic layer (a) NiO$_x$/CoO$_y$-based sample
 i. glass/NiO$_x$(150–500)/CoO$_y$(1–40)/NiFe(20–150)/Co(1–30)/Cu(8–40)/Co(1–30)/NiFe(20–150)

(b) NiO$_x$/NiCoO$_y$-based sample
 i. glass/NiO$_x$(150–500)/Ni$_{0.1}$Co$_{0.9}$O$_y$(1–40)/NiFe(20–150)/Co(1–30)/Cu(8–40)/Co(1–30)/NiFe(20–150)
 ii. glass/NiO$_x$(150–500)/Ni$_{0.3}$Co$_{0.7}$O$_y$(1–40)/NiFe(20–150)/Co(1–30)/Cu(8–40)/Co(1–30)/NiFe(20–150)
 iii. glass/NiO$_x$(150–500)/Ni$_{0.5}$Co$_{0.5}$O$_y$(1–40)/NiFe(20–150)/Co(1–30)/Cu(8–40)/Co(1–30)/NiFe(20–150)
 iv. glass/NiO$_x$(150–500)/Ni$_{0.7}$Co$_{0.3}$O$_y$(1–40)/NiFe(20–150)/Co(1–30)/Cu(8–40)/Co(1–30)/NiFe(20–150)
 v. glass/NiO$_x$(150–500)/Ni$_{0.9}$Co$_{0.1}$O$_y$(1–40)/NiFe(20–150)/Co(1–30)/Cu(8–40)/Co(1–30)/NiFe(20–150)

(c) NiO$_x$/NiCoO$_y$-based multilayer sample
 i. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.3}$Co$_{0.7}$O$_y$(3)/NiFe(20–150)/Co(1–30)/Cu(8–40)/Co(1–30)/NiFe(20–150)
 ii. glass/NiO$_x$(150–500)/Ni$_{0.9}$Co$_{0.1}$O$_y$(3)/Ni$_{0.7}$Co$_{0.3}$O$_y$(3)/Ni$_{0.5}$Co$_{0.5}$O$_y$(3)/Ni$_{0.1}$Co$_{0.9}$O$_y$(3)/NiFe(20–150)/Co(1–30)/Cu(8–40)/Co(1–30)/NiFe(20–150)
 iii. glass/NiO$_x$(150–500)/Ni$_{0.9}$Co$_{0.1}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/NiFe(20–150)/Co(1–30)/Cu(8–40)/Co(1–30)/NiFe(20–150)
 iv. glass/NiO$_x$(150–500)/Ni$_{0.9}$Co$_{0.1}$O$_y$(3)/Ni$_{0.5}$Co$_{0.5}$O$_y$(3)/Ni$_{0.3}$Co$_{0.7}$O$_y$(3)/Ni$_{0.1}$Co$_{0.9}$O$_y$(3)/NiFe(20–150)/Co(1–30)/Cu(8–40)/Co(1–30)/NiFe(20–150)
 v. glass/NiO$_x$(150–500)/Ni$_{0.5}$Co$_{0.5}$O$_y$(3)/Ni$_{0.7}$Co$_{0.3}$O$_y$(3)/Ni$_{0.3}$Co$_{0.7}$O$_y$(3)/Ni$_{0.1}$Co$_{0.9}$O$_y$(3)/NiFe(20–150)/Co(1–30)/Cu(8–40)/Co(1–30)/NiFe(20–150)
 vi. glass/NiO$_x$(150–500)/Ni$_{0.5}$Co$_{0.5}$O$_y$(3)/Ni$_{0.9}$Co$_{0.1}$O$_y$(3)/Ni$_{0.3}$Co$_{0.7}$O$_y$(3)/Ni$_{0.1}$Co$_{0.9}$O$_y$(3)/NiFe(20–150)/Co(1–30)/Cu(8–40)/Co(1–30)/NiFe(20–150)

Figure 9:
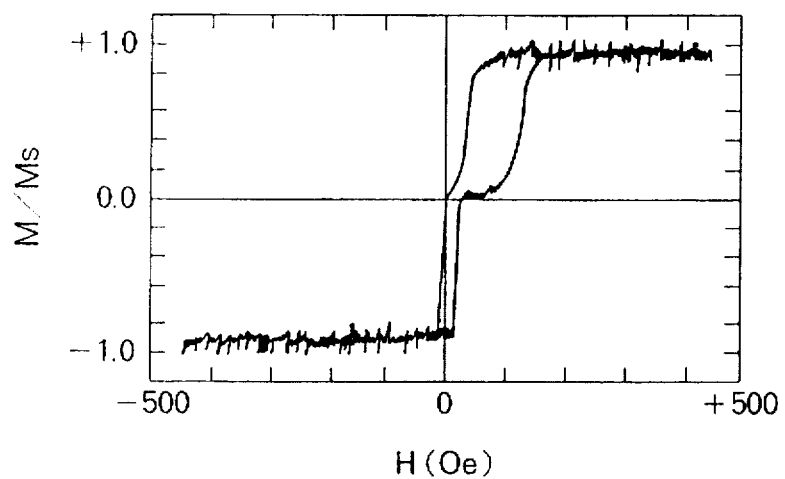
FIG. 9 shows a B-H curve of the magnetoresistance effect film according to this invention.
Figure 10:
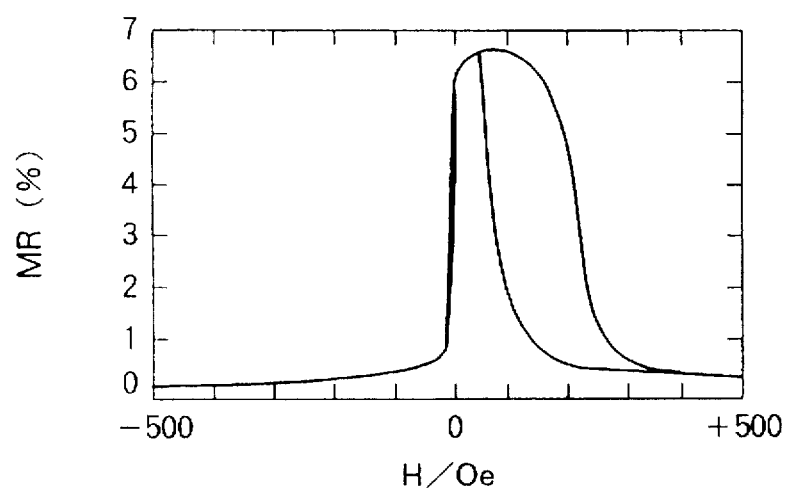
FIG. 10 shows an M-R curve of the magnetoresistance effect film according to this invention.

FIGS. 9 and 10 show the typical B-H curve and the typical M-R curve of the spin-valve film according to this invention.

Figure 11:
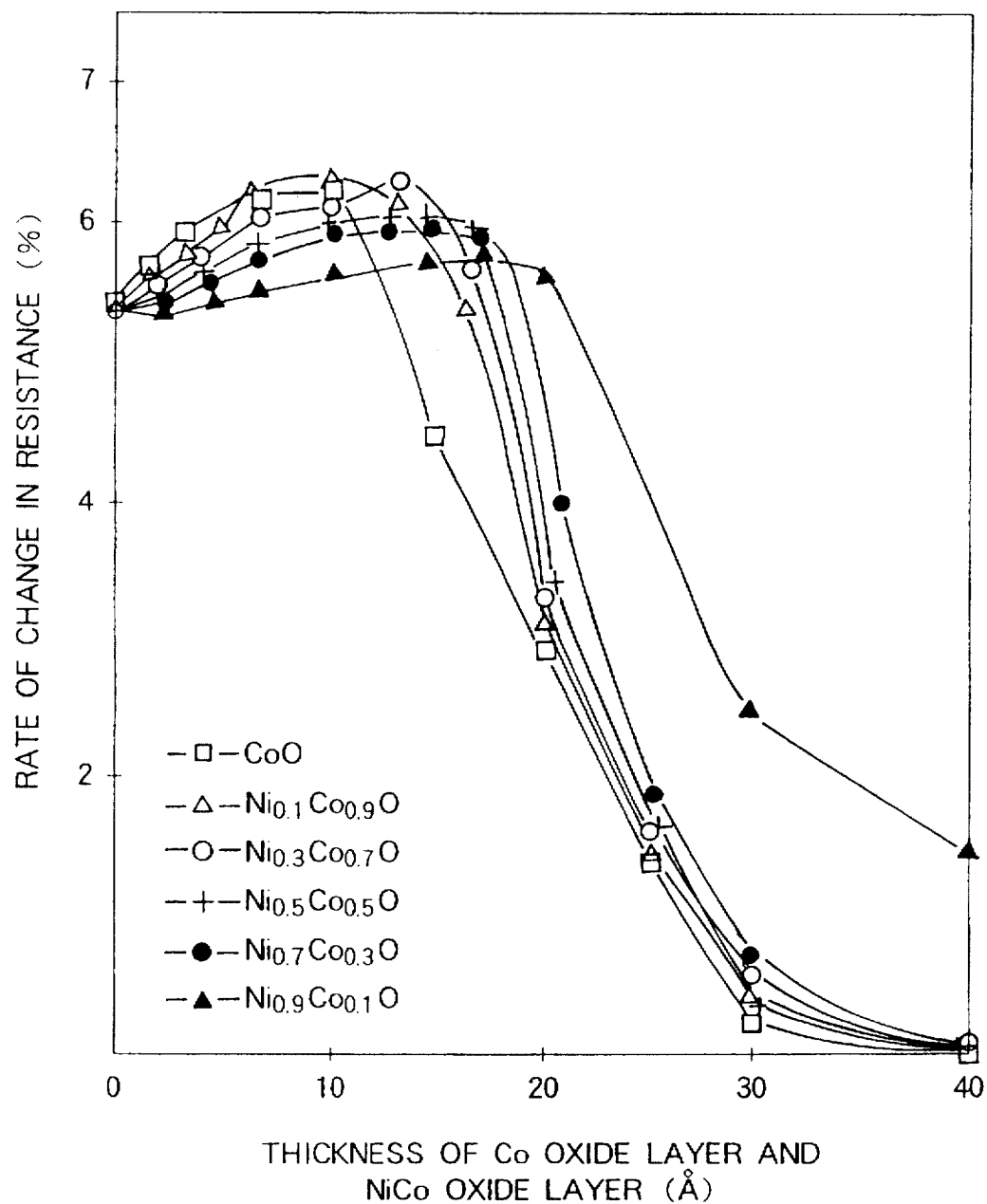
FIG. 11 shows the dependence of change in resistance of the magnetoresistance effect film according to this invention on the thicknesses of a Co oxide layer and a NiCo oxide layer.
Figure 12:
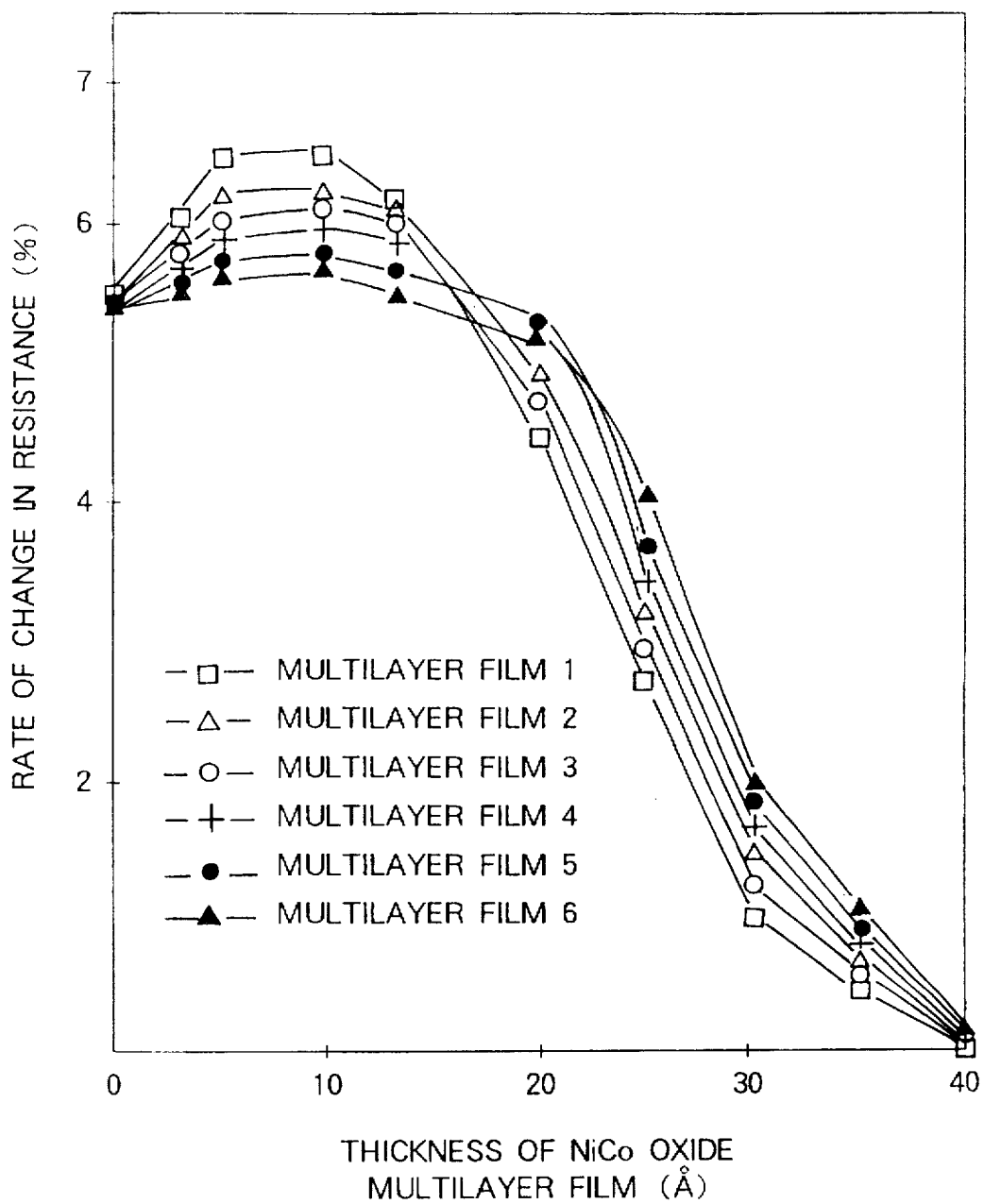
FIG. 12 shows the dependence of change in resistance of the magnetoresistance effect film according to this invention on the thickness of a NiCo oxide multilayer film.

FIG. 11 shows the dependence of the rate of change in resistance on the thicknesses of the Co oxide film and the NiCo oxide film. Likewise, FIG. 12 shows the dependence of the rate of change in resistance on the thickness of the NiCo oxide multilayer film. By depositing, on the Ni oxide film, the Co oxide film, the NiCo oxide film, or the NiCo oxide multilayer film to a thickness between several angstroms and several tens of angstroms, the rate of change in resistance gradually increases.

Figure 13:
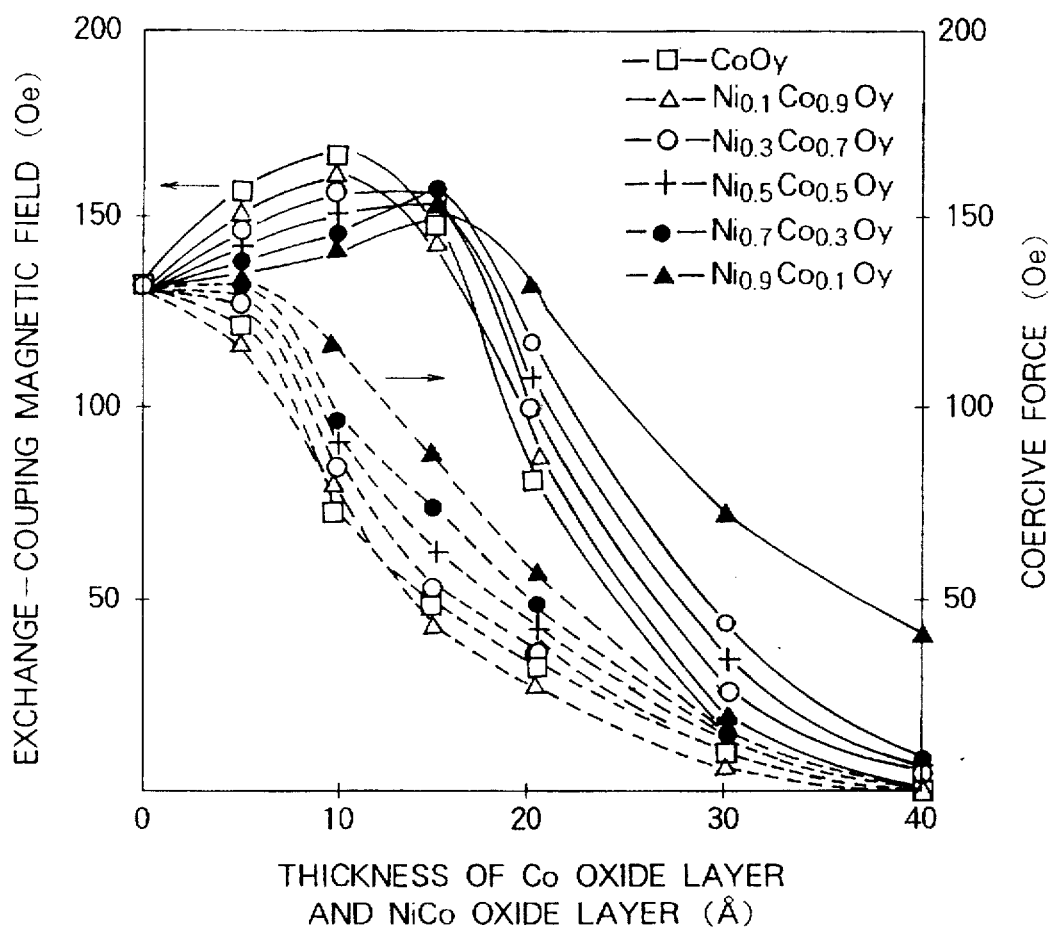
FIG. 13 shows the dependence of an exchange-coupling magnetic field and a coercive force of an exchange-coupled layer of the magnetoresistance effect film according to this invention on the thicknesses of the Co oxide layer and the NiCo oxide layer.

FIG. 13 shows the dependence of the exchange-coupling magnetic field and the coercive force of the exchange-coupled layer on the thicknesses of the Co oxide layer and the NiCo oxide layer. The exchange-coupling magnetic field does not substantially change within the range between several angstroms and several tens of angstroms. On the other hand, the coercive force considerably changes. Thus, by stacking on the Ni oxide layer the Co oxide layer, the NiCo oxide layer, or the NiCo oxide multilayer film, the hysteresis is remarkably suppressed in the M-R curve of the spin-valve film.

Figure 14:
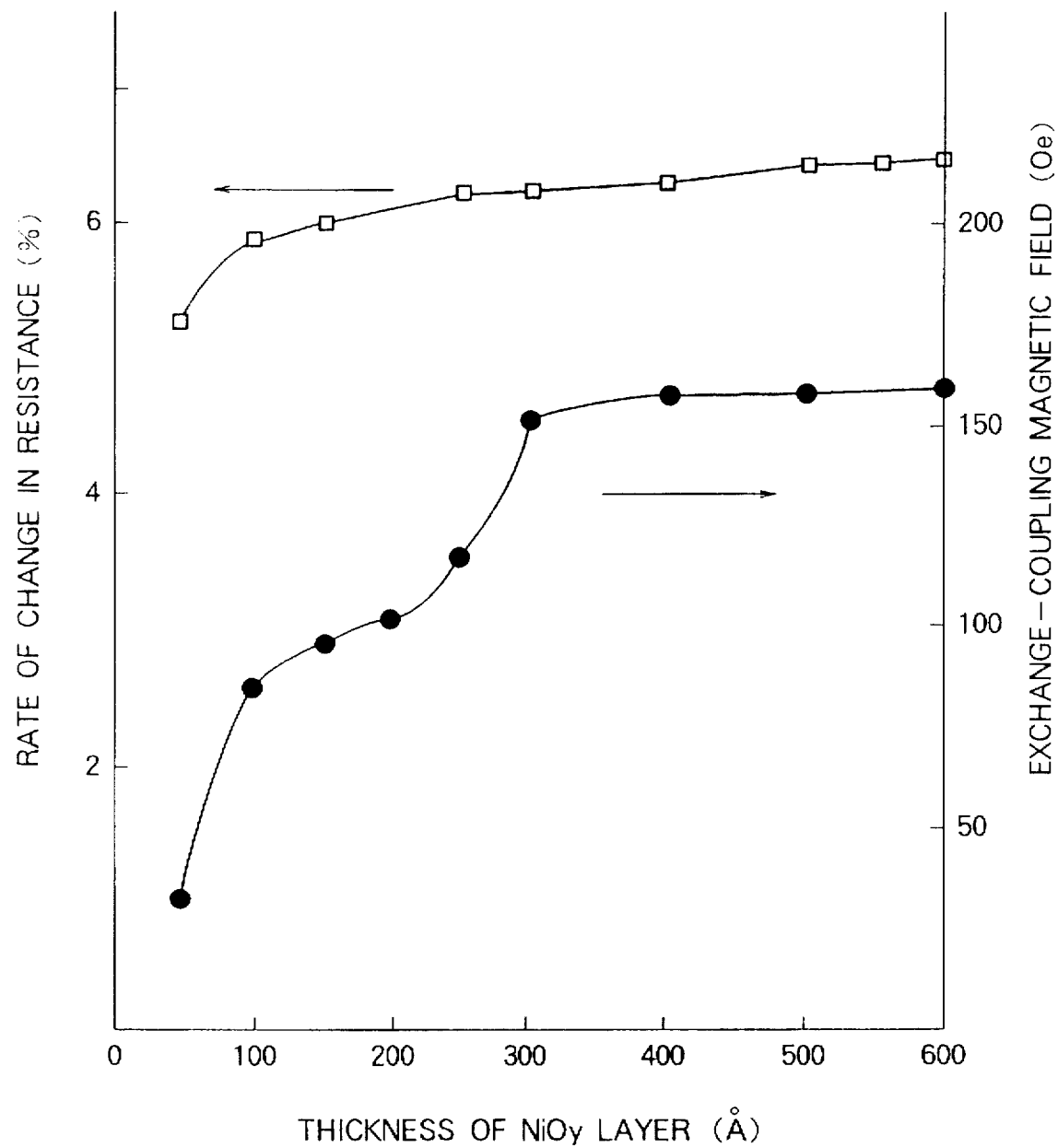
FIG. 14 shows the dependence of change in resistance and the exchange-coupling magnetic field of the magnetoresistance effect film according to this invention on the thickness of a Ni oxide layer.

FIG. 14 shows the dependence of the rate of change in resistance and the exchange-coupling magnetic field on the thickness of the Ni oxide layer. The change in resistance is hardly affected by the thickness of the Ni oxide layer. On the other hand, the exchange-coupling magnetic field is distinctly dependent upon the thickness of the Ni oxide layer. Specifically, the thickness of the Ni oxide layer must be 100 angstroms or more.

The following Table 1 shows the O/Ni ratio in the Ni oxide film. The Ni oxide film in this invention has an O/Ni ratio between 0.6 and 1.5 and exhibits the similar characteristic even in occurrence of shortage of oxygen and presence of excess oxygen.

TABLE 1

| | O/NI ratio |
|---|---|
| i | 0.62 |
| ii | 1.20 |
| iii | 0.77 |
| iv | 1.41 |
| v | 0.72 |

Figure 15:
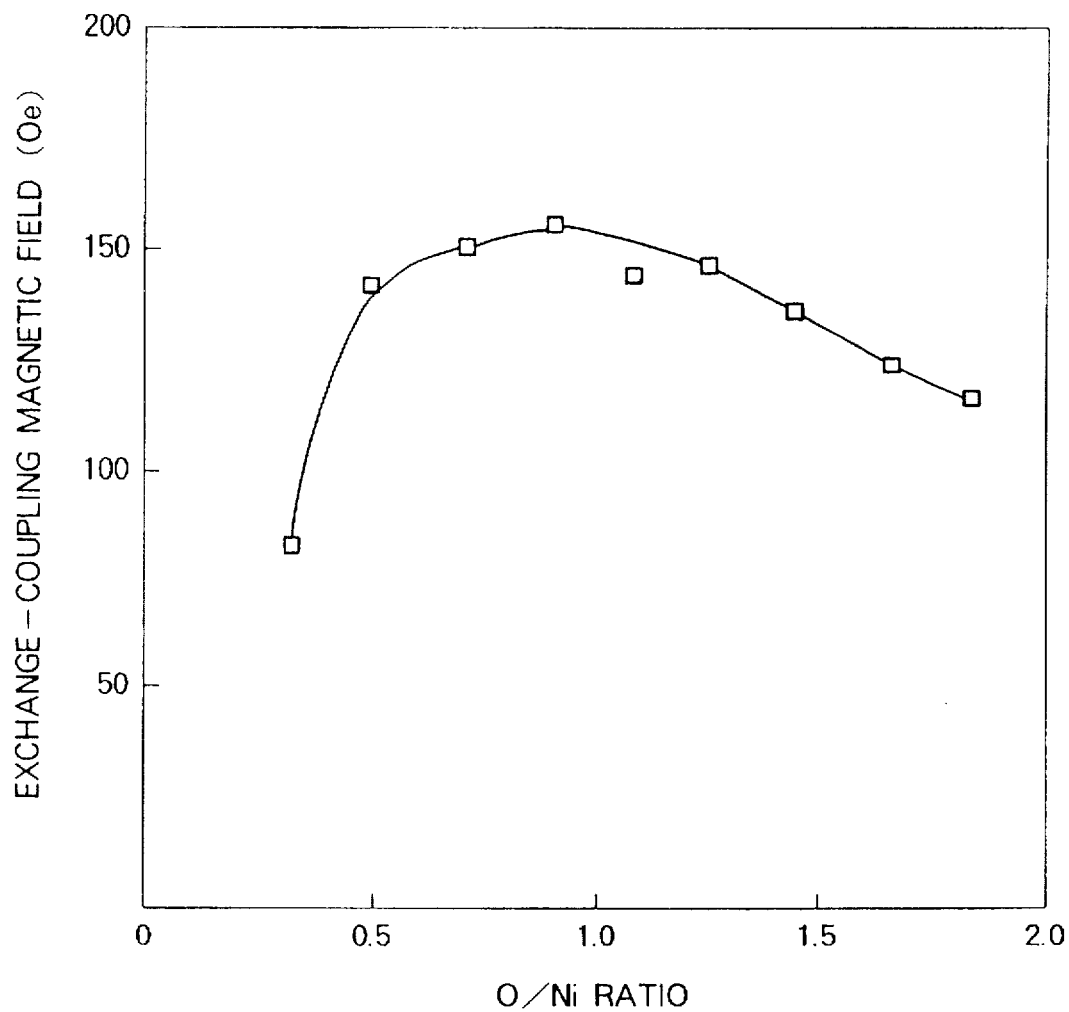
FIG. 15 shows the dependence of the exchange-coupling magnetic field of the magnetoresistance effect film according to this invention on the O/Ni ratio.

FIG. 15 shows the change of the exchange-coupling magnetic field with respect to the O/Ni ratio. When the O/Ni ratio was between 0.6 and 1.5, the exchange-coupling magnetic field was 120 Oe or more.

The following Table 2 shows the O/NiCo ratio of the NiCo oxide film in the antiferromagnetic film comprising the two-layer structure composed of the Ni oxide film and the NiCo oxide film. The ratio of oxygen to NiCo is greater than 0.5.

TABLE 2

| | O/NiCO ratio |
|---|---|
| i | 1.2 |
| ii | 2.4 |
| iii | 2.1 |
| iv | 0.6 |
| v | 1.6 |

Figure 16:
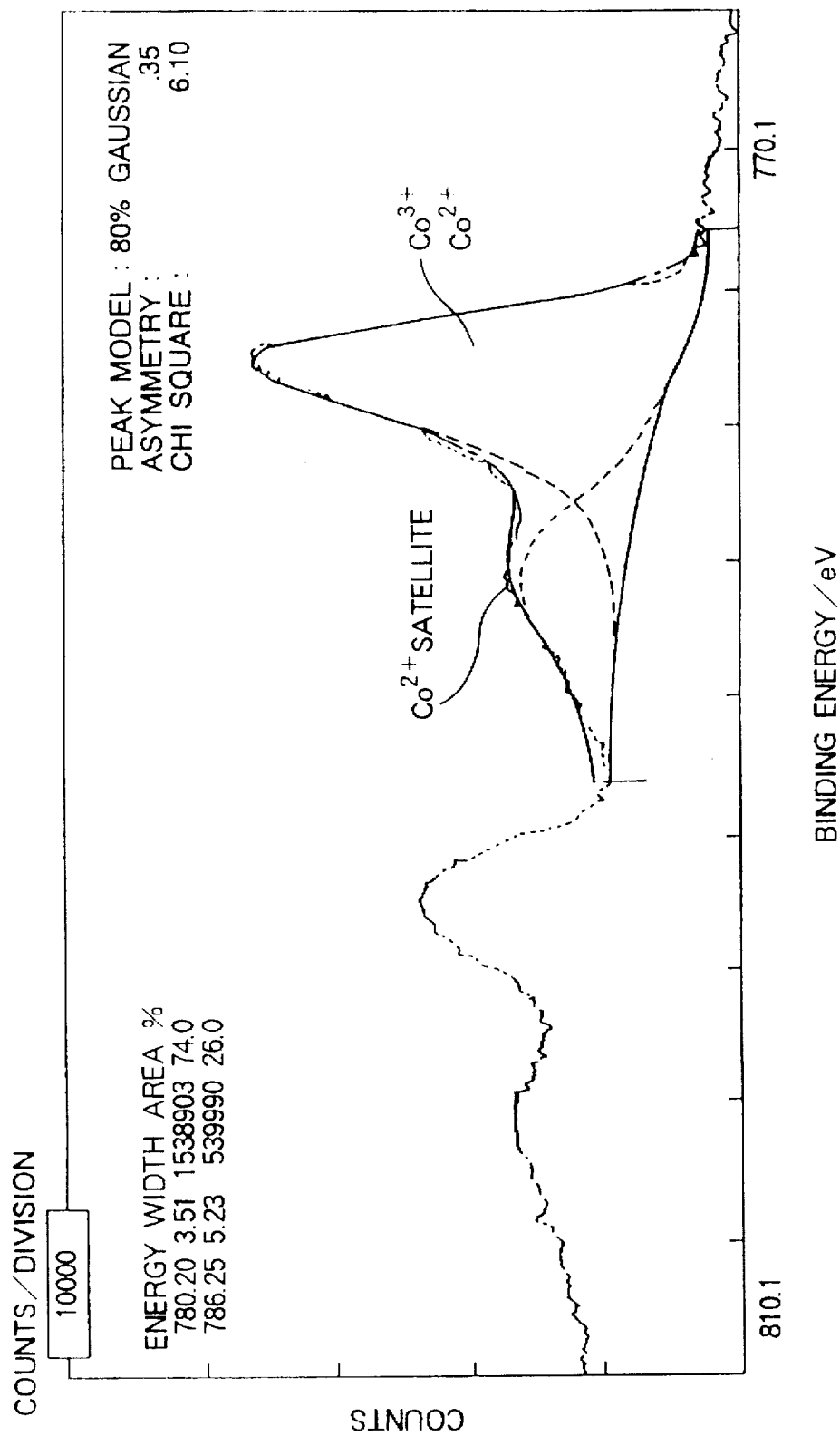
FIG. 16 shows the result of the XPS analysis of the Co oxide film of the magnetoresistance effect film according to this invention.
Figure 17:
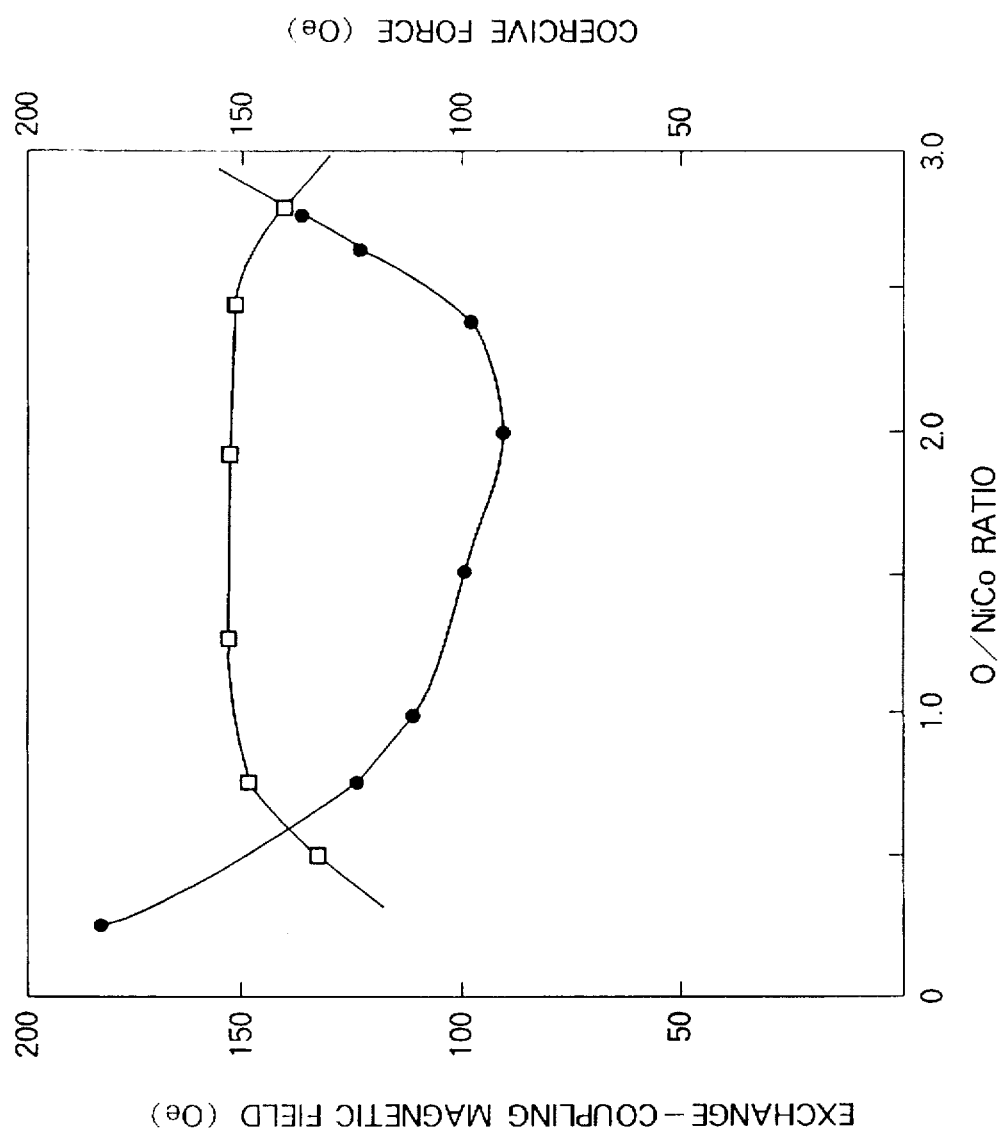
FIG. 17 shows the dependence of the exchange-coupling magnetic field and the coercive force of the exchange-coupled layer of the magnetoresistance effect film according to this invention on the O/NiCo ratio.

FIG. 16 shows the XPS results of the Co oxide film at that time. The Co2p peak has different peak configuration in dependence upon the valence thereof (ref. N. S. McIntyre and M. G. Cook. Anal. Chem. Vol. 47, No. 13, p. 2208 (1975)). As seen from the figure, this film contains a large amount of the Co oxide phase of a spinnel structure. Such Co oxide phase of a spinnel structure is easily obtained through deposition at the room temperature. FIG. 17 shows the change of the coercive force and the exchange-coupling magnetic field of the exchange-coupled layer with respect to the O/NiCo ratio. When the O/NiCo ratio is within a range between 0.5 and 2.5, the exchange-coupling magnetic field is greater than the coercive force. In this event, the hysteresis is not observed in the out put of the magnetoresistance effect device.

Figure 18:
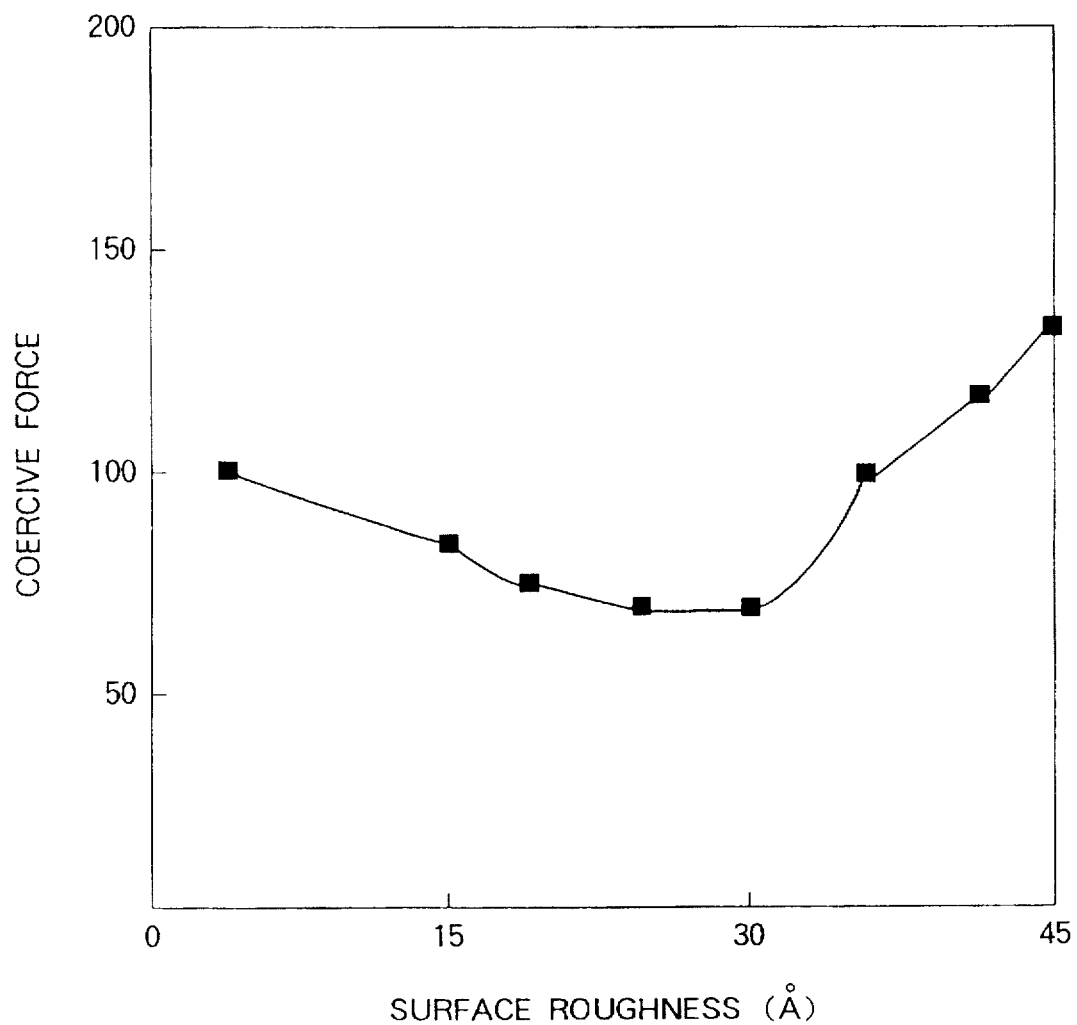
FIG. 18 shows the dependence of the coercive force of the exchange-coupled layer of the magnetoresistance effect film according to this invention on the surface roughness of an antiferromagnetic member.

FIG. 18 shows the coercive force of the exchange-coupled layer with respect to the surface roughness of the antiferromagnetic layer. It is seen that the coercive force of the exchange-coupled layer is not only related to the surface composition of the antiferromagnetic layer but also to the surface roughness. This is because the surface roughness affects the domain structure of the ferromagnetic layer stacked on the antiferromagnetic layer. When the surface roughness is between 3 and 30 angstroms, the coercive force becomes minimum so that the MR characteristic as a spin-valve film is excellent.

Figure 19:
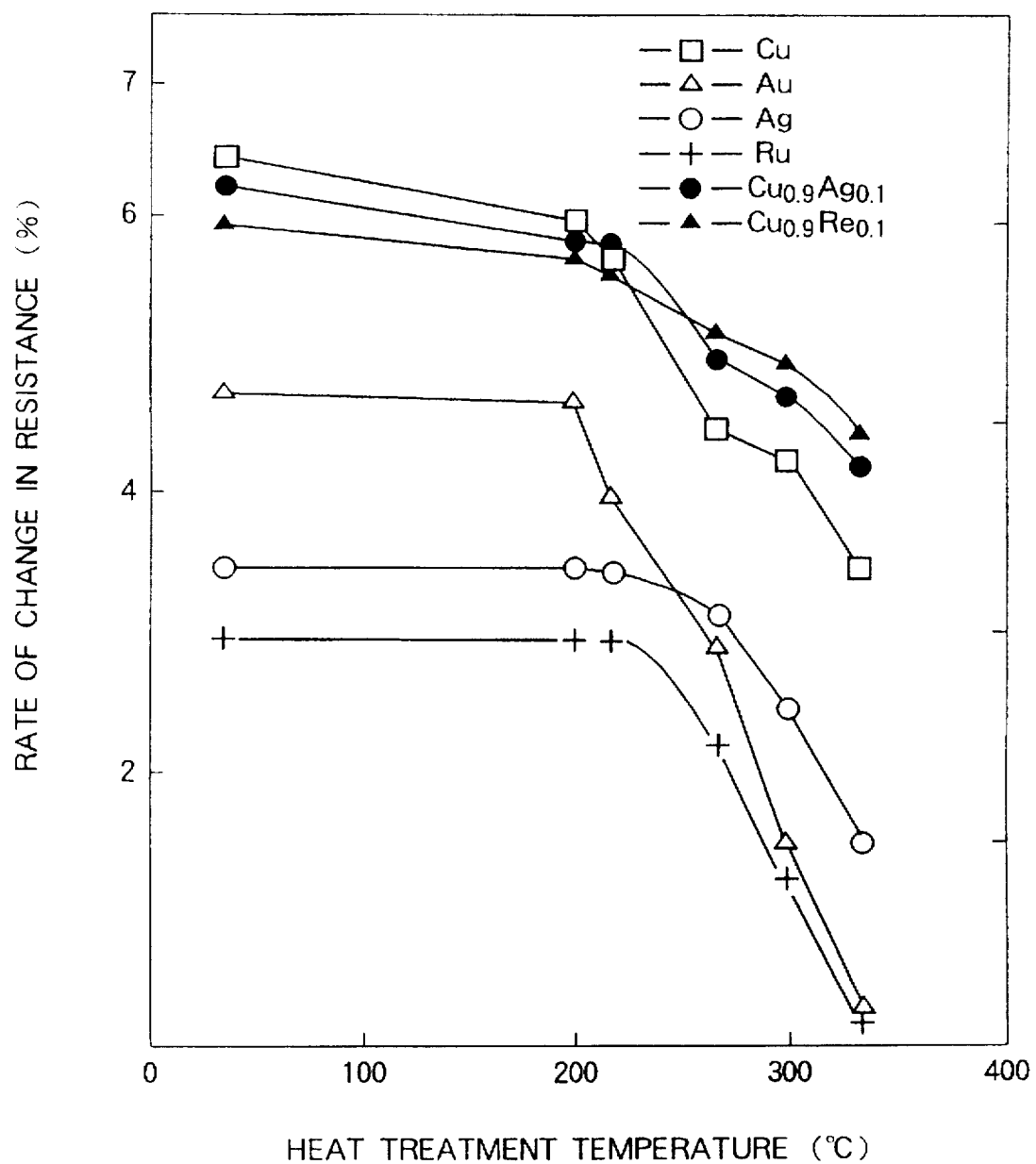
FIG. 19 shows the dependence of change in resistance of the magnetoresistance effect film according to this invention on a heat treatment temperature.

FIG. 19 shows dependence of the rate of change in resistance on the heat treatment temperature for the different nonmagnetic materials. It is found that the rate of change in resistance is maintained at a higher temperature when the nonmagnetic material is CuAg alloy or CuRe alloy. This is because alloying of Ni and Cu is suppressed by precipitation of Ag or Re in the grain boundary.

Figure 20:
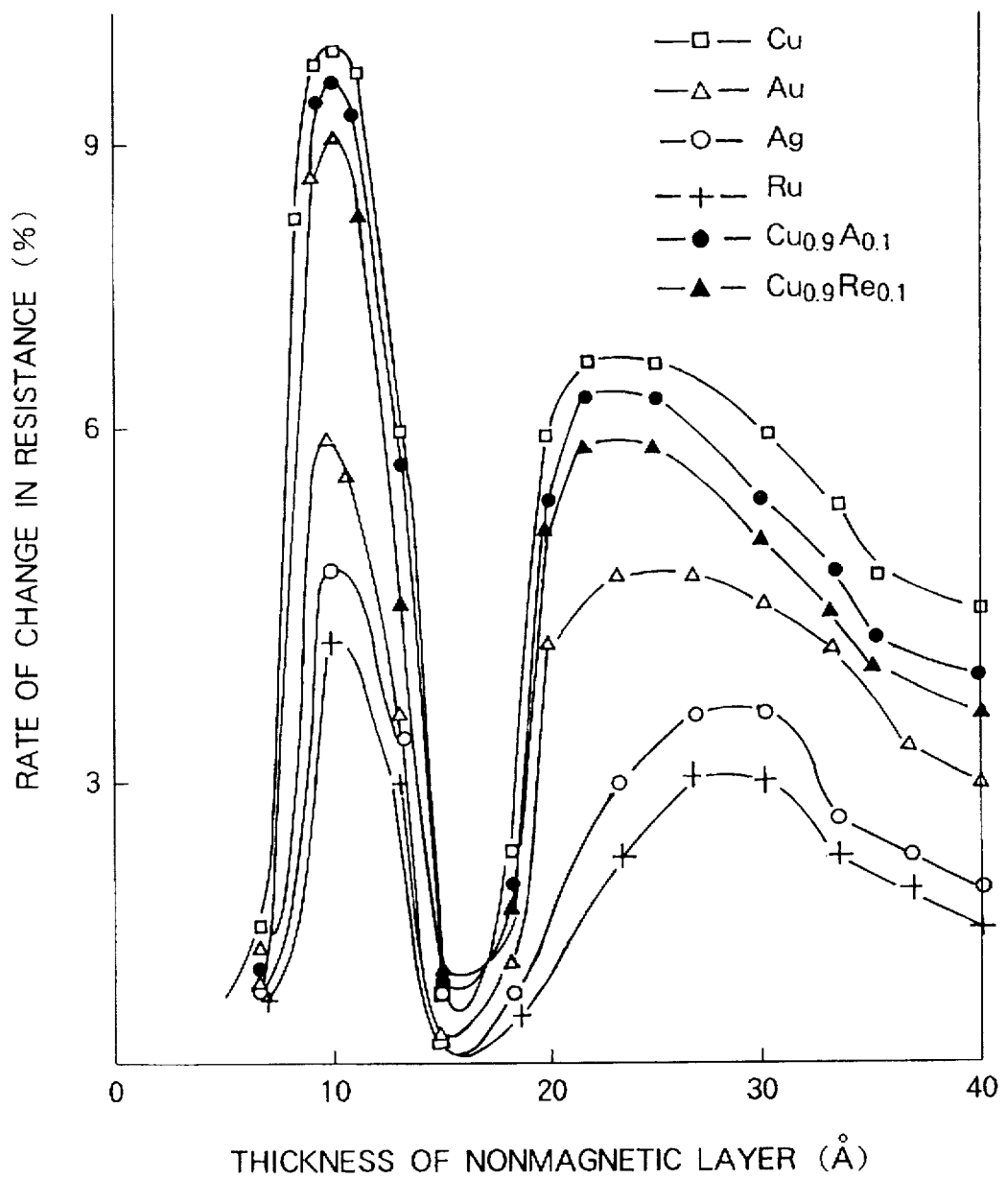
FIG. 20 shows the dependence of change in resistance of the magnetoresistance effect film according to this invention on the thickness of a nonmagnetic layer.

FIG. 20 shows the dependence of the rate of change in resistance on the thickness of the nonmagnetic layer. In the spin-valve film of this invention, the change in resistance has two peaks with respect to the thickness of the nonmagnetic layer. This is because the antiferromagnetic interaction is caused to occur between the ferromagnetic layers. The rate of change in resistance was 6.5% and 10% when the thickness of the nonmagnetic layer is between 20 and 30 angstroms and is equal to 10 angstroms, respectively.

Figure 21:
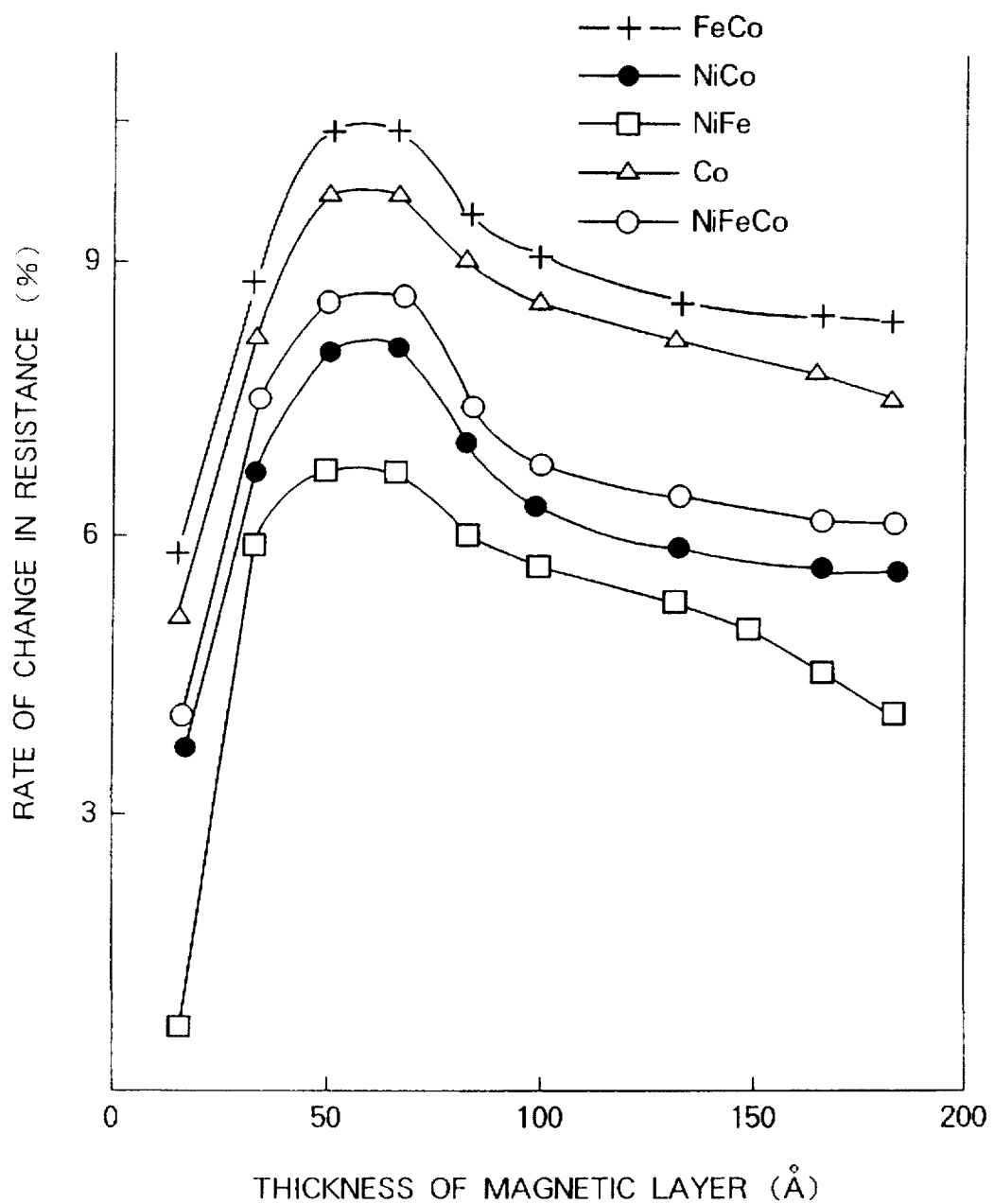
FIG. 21 shows the dependence of change in resistance of the magnetoresistance effect film according to this invention on the thickness of a ferromagnetic layer.

FIG. 21 shows the dependence of the rate of change in resistance on the thickness of the ferromagnetic layer. It is seen that the rate of change in resistance exhibits the extremum when the thickness of the ferromagnetic layer is between 40 and 70 angstroms. Use of the Co-based ferromagnetic material increases the probability of electron scattering at the interface between the ferromagnetic layer and the nonmagnetic layer so that the greater rate (10%) of change in resistance was obtained.

Figure 22:
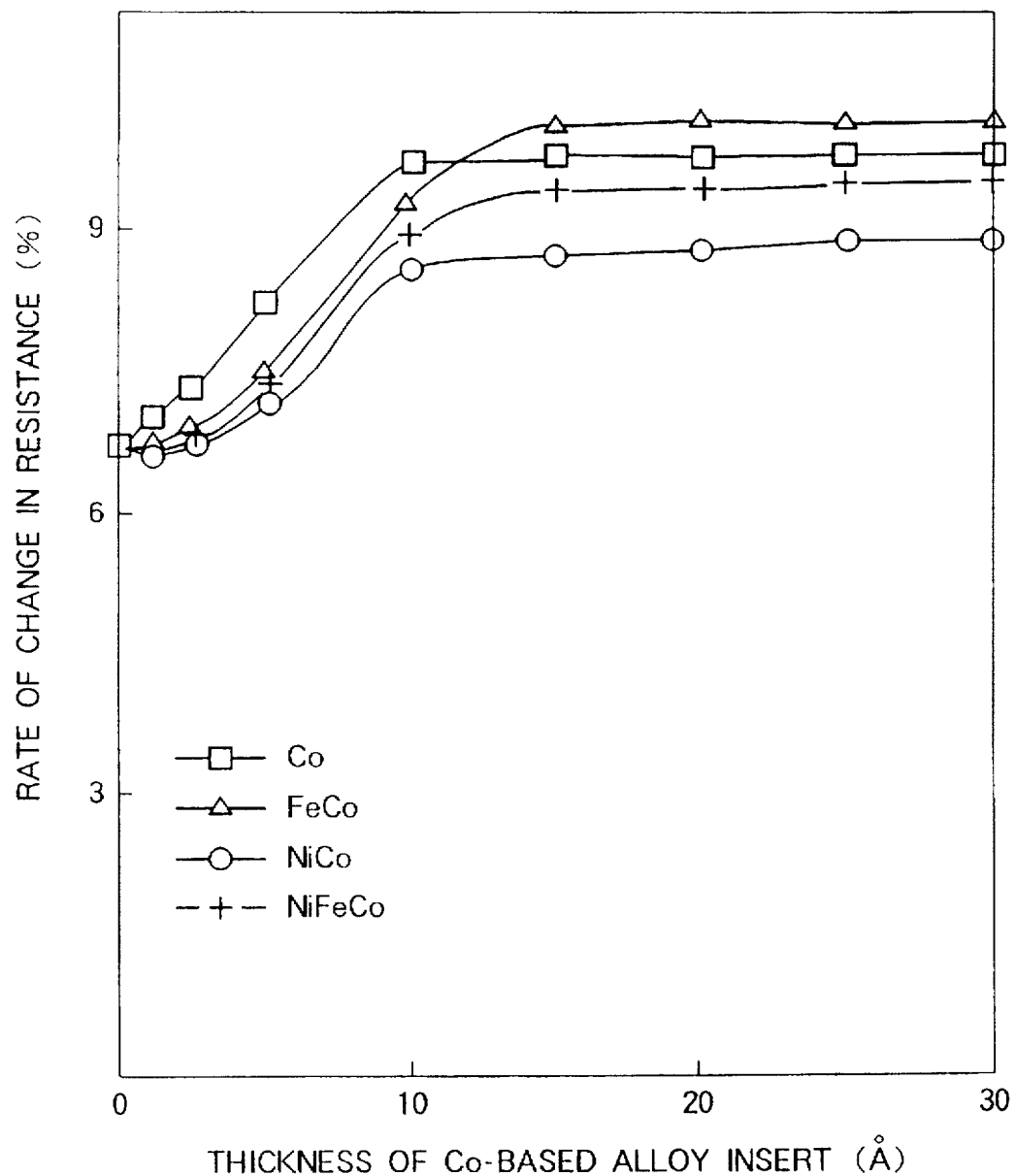
FIG. 22 shows the dependence of change in resistance of the magnetoresistance effect film according to this invention on the thickness of a Co-based alloy layer inserted.

FIG. 22 shows the dependence of the rate of change in resistance on the thickness of the Co-based alloy (Co, FeCo, NiCo, or NiFeCo) inserted at the interface between the ferromagnetic layer and the nonmagnetic layer. It is found that the insertion of at least 1 angstrom is effective but the effect is saturated over 10 angstroms. The coercive force of the ferromagnetic layer for detecting the magnetic field is on the order of 10 Oe when the thickness of the Co layer is not smaller than 30 angstroms. This results in frequent occurrence of the hysteresis in the MR characteristic of the spin-valve film.

Figure 23:
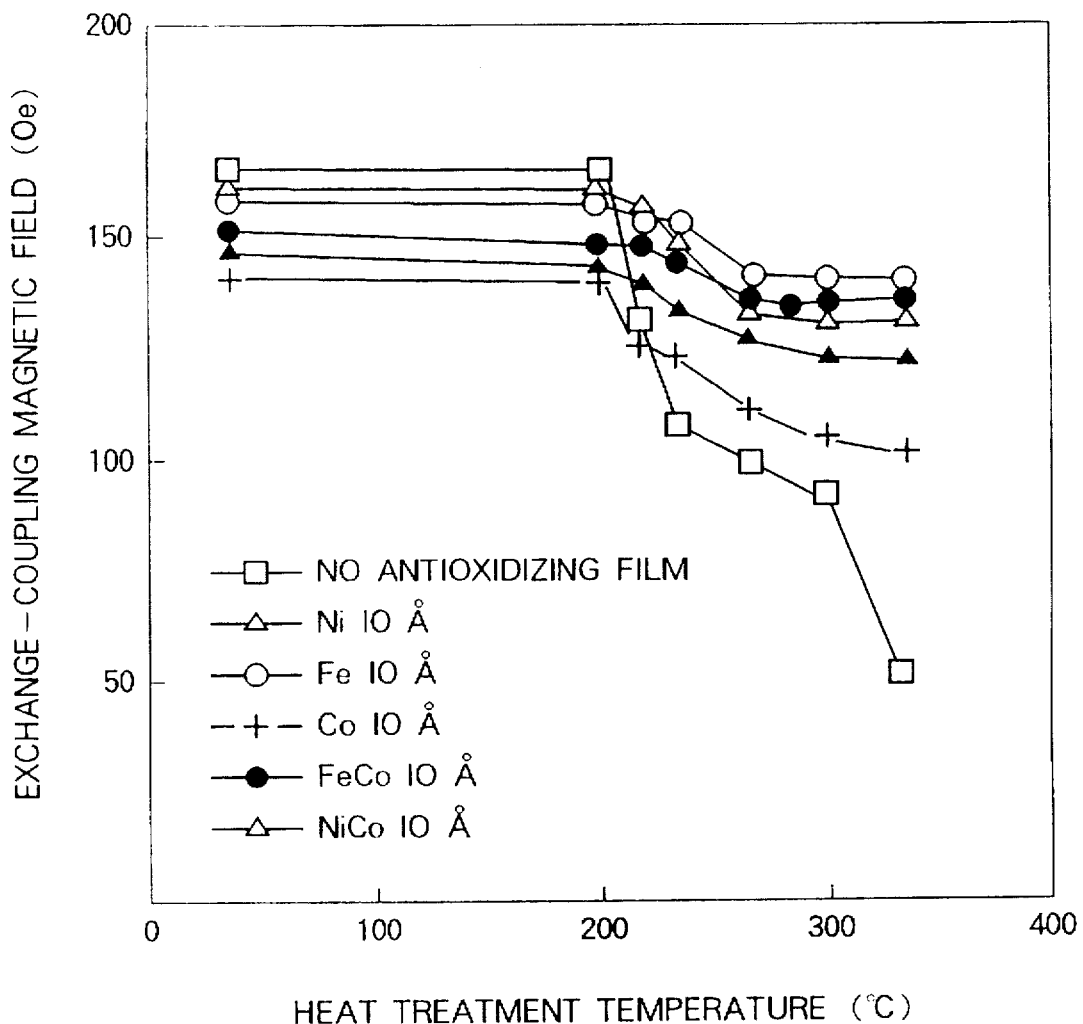
FIG. 23 shows the dependence of the exchange-coupling magnetic field of the magnetoresistance effect film according to this invention on the heat treatment temperature.
Figure 24:
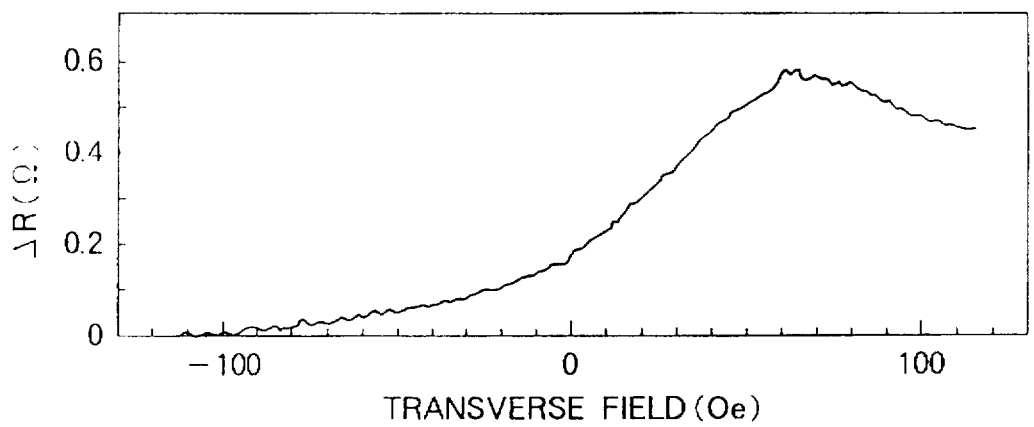
FIG. 24 shows an M-R curve of a magnetoresistance effect device according to this invention.

FIG. 23 shows the dependence of the exchange-coupling magnetic field on the heat treatment temperature when the layer of Fe, Ni, Co, or an alloy thereof is inserted at the interface between the antiferromagnetic thin film and the ferromagnetic thin film. By inserting the antioxidizing film between the oxide antiferromagnetic thin film and the ferromagnetic thin film, the exchange-coupling magnetic field is suppressed from being decreased due to oxidation of the ferromagnetic layer. The exchange-coupling magnetic field on the order of 150 Oe is maintained even through the heat treatment at 300° C. FIG. 24 shows the MR curve of the magnetoresistance effect device of this invention comprising the spin-valve film of a device height of 1 μm and a device width of 1.2 μm with the CoCrPt permanent magnet film arranged adjacent as a domain stabilization film. With this structure, the magnetic domain is stabilized by the permanent magnet thin film. Thus, it is possible to avoid the nonlinear outputs such as Berkhausen jumps and to obtain the output level as large as six to ten times as compared with the ordinary anisotropic magnetoresistance effect device.

Next, description will be made as regards specific examples of the magnetoresistance effect device according to this invention.

At first, a magnetoresistance effect device was prepared with the structure comprising several layers made of the materials and having the thicknesses shown in Table 3.

TABLE 3

|  | material | thickness (nm) |
|---|---|---|
| Ni oxide layer | $Ni_xO_{1-x}$ | 0–200 |
| Co oxide layer | $Co_xO_{1-x}$ | 1 |
| 1st ferromagnetic layer | NiFe | 6 |
| 1st MR enhance layer | Co | 1 |
| nonmagnetic layer | Cu | 2.5 |
| 2nd MR enhance layer | Co | 1 |
| 2nd ferromagnetic layer | NiFe | 6 |

Figure 29:
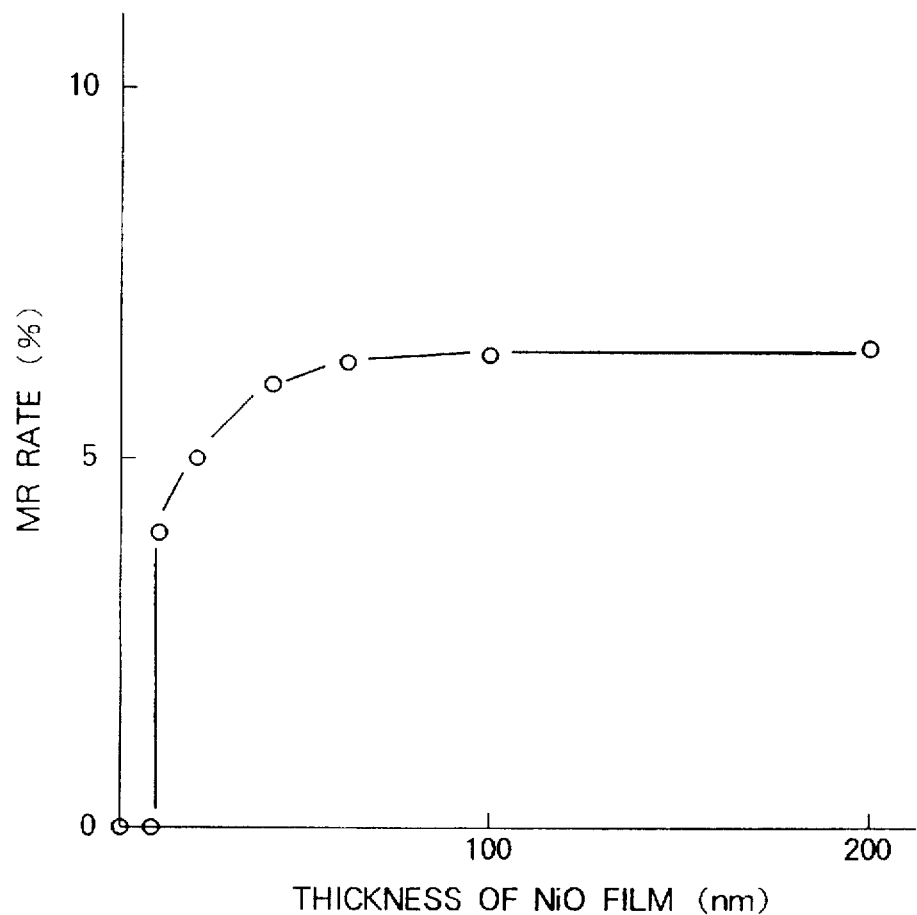
FIG. 29 is a graph showing the relationship between the thickness of the Ni oxide layer and the MR ratio of the magnetoresistance effect device according to this invention.

FIG. 29 shows the relationship between the MR ratio of the device and the thickness of the Ni oxide layer. With decrease of the thickness of the Ni oxide layer, the MR ratio does not substantially vary when the thickness is greater than 60 nm. At a smaller thickness, the MR ratio decreases until it becomes substantially equal to zero when the thickness is slightly smaller than 10 nm. It is understood that, for use as the magnetoresistance effect device, the Ni oxide layer must have the thickness not smaller than 10 nm.

Next, another magnetoresistance effect device was prepared with the structure comprising several layers made of the materials and having the thicknesses shown in Table 4.

TABLE 4

|  | material | thickness (nm) |
|---|---|---|
| Ni oxide layer | $Ni_xO_{1-x}$ | 30 |
| Co oxide layer | $Co_xO_{1-x}$ | 0–5 |
| 1st ferromagnetic layer | Co | 40 |
| nonmagnetic layer | Cu | 26 |
| 2nd ferromagnetic layer | NiFe | 60 |

Figure 30:
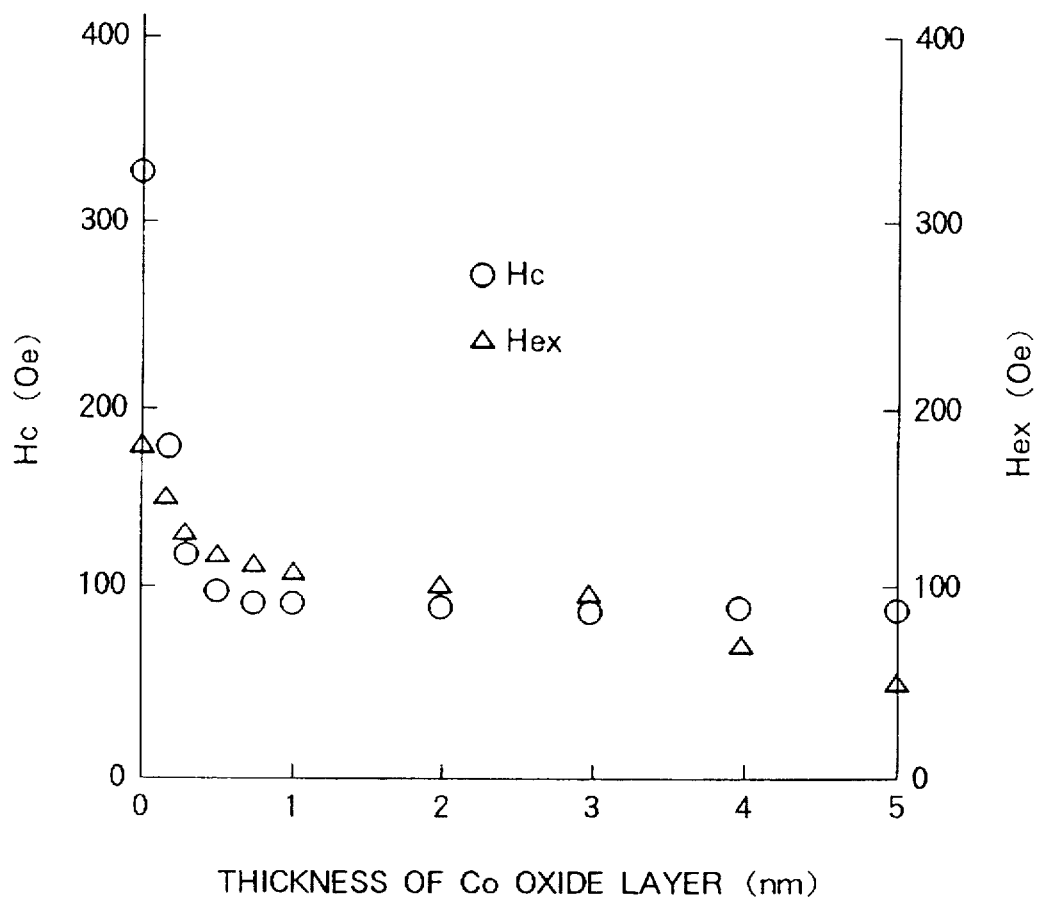
FIG. 30 is a graph showing the relationship among the thickness of the Co oxide layer, the coercive force Hc, and the exchange-coupling magnetic field Hex of a second ferromagnetic layer in the magnetoresistance effect device according to this invention.

FIG. 30 shows the relationship among the coercive force Hc of the device, the exchange-coupling magnetic field Hex, and the thickness of the Co oxide layer. Both of Hc and Hex decrease with increase of the thickness of the Co oxide layer. However, Hc and Hex decrease in different manners so that the range satisfying Hex>Hc is restricted between 0.3 and 3 nm. In the magnetoresistance effect device of this type, it is desired to satisfy Hex>Hc. Therefore, the thickness of the Co oxide layer must be within a range between 0.3 and 3.0 nm.

Next, another magnetoresistance effect device was prepared with the structure comprising several layers made of the materials and having the thicknesses shown in Table 5.

TABLE 5

|  | material | thickness (nm) |
|---|---|---|
| Ni oxide layer | NiO | 30 |
| Co oxide layer | CoO | 1.0 |
| 1st ferromagnetic layer | FeCo | 4.0 |
| nonmagnetic layer | Cu | 2.3 |
| 2nd ferromagnetic layer | NiFeCo | 6.0 |

Figure 31:
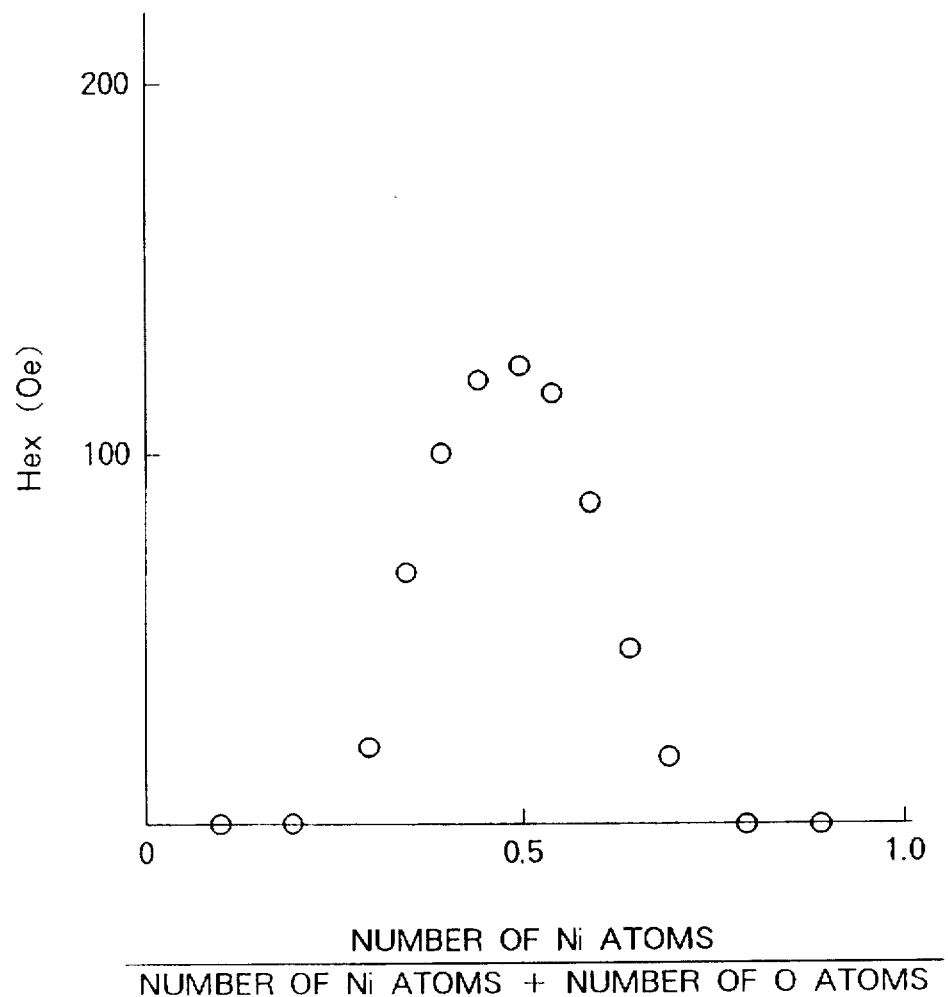
FIG. 31 is a graph showing the relationship between the ratio of (the number of Ni atoms)/(the number of Ni atoms+ the number of O atoms) in the Ni oxide layer and the exchange-coupled magnetic field Hex in the magnetoresistance effect device according to this invention.
Figure 32:
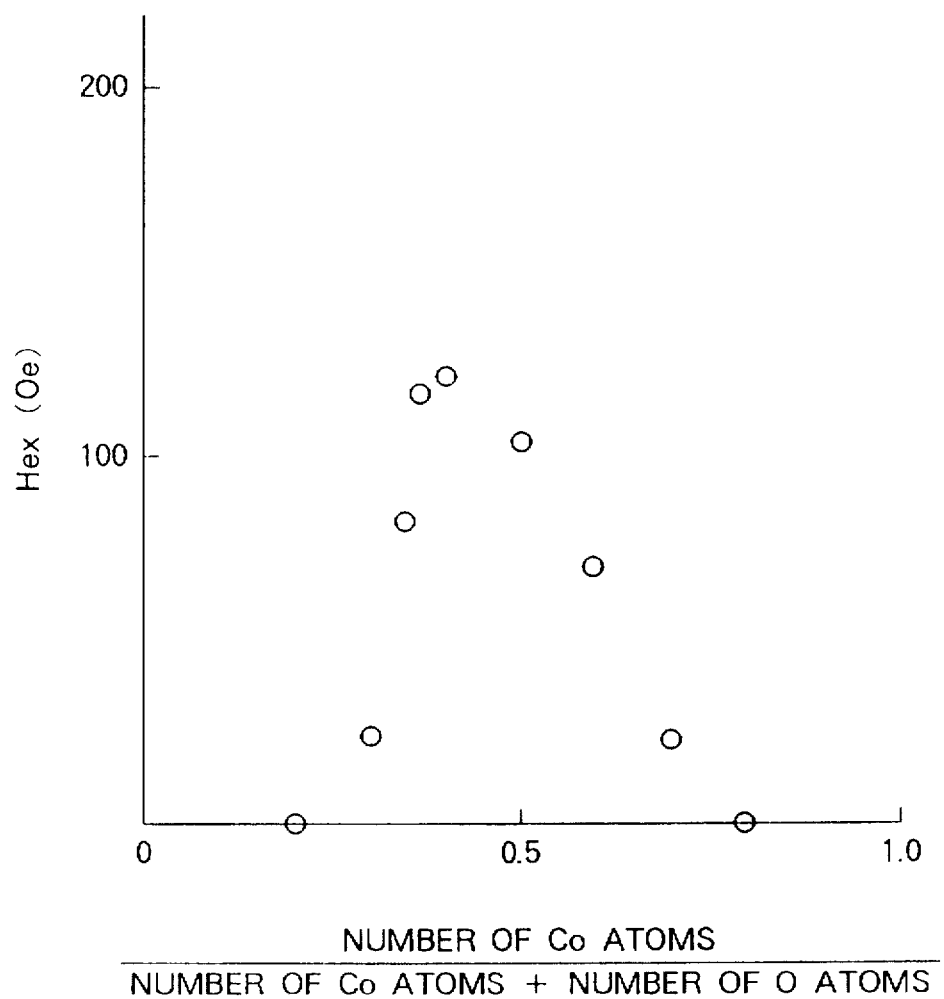
FIG. 32 is a graph showing the relationship between the ratio of (the number of Co atoms)/(the number of Co atoms+the number of O atoms) in the Co oxide layer and the exchange-coupled magnetic field Hex in the magnetoresistance effect device according to this invention.

FIG. 31 shows the relationship between the ratio of (the number of Ni atoms)/(the number of Ni atoms+the number of O atoms) in the Ni oxide layer of this device and the exchange-coupled magnetic field Hex. FIG. 32 shows the relationship between the ratio of (the number of Co atoms) /(the number of Co atoms+the number of O atoms) in the Co oxide layer and the exchange-coupling magnetic field Hex. In either of the Ni oxide layer and the Co oxide layer, Hex has a positive value when the ratio is within a range between 0.3 and 0.7. It will be understood that this range must be satisfied. As regards the Co oxide layer, the peak value appears when the ratio is about 0.4. The film structure at that time was examined by the X-ray electron spectroscope to reveal that the $Co_3O_4$ spinnel structure was a main component.

Figure 33:
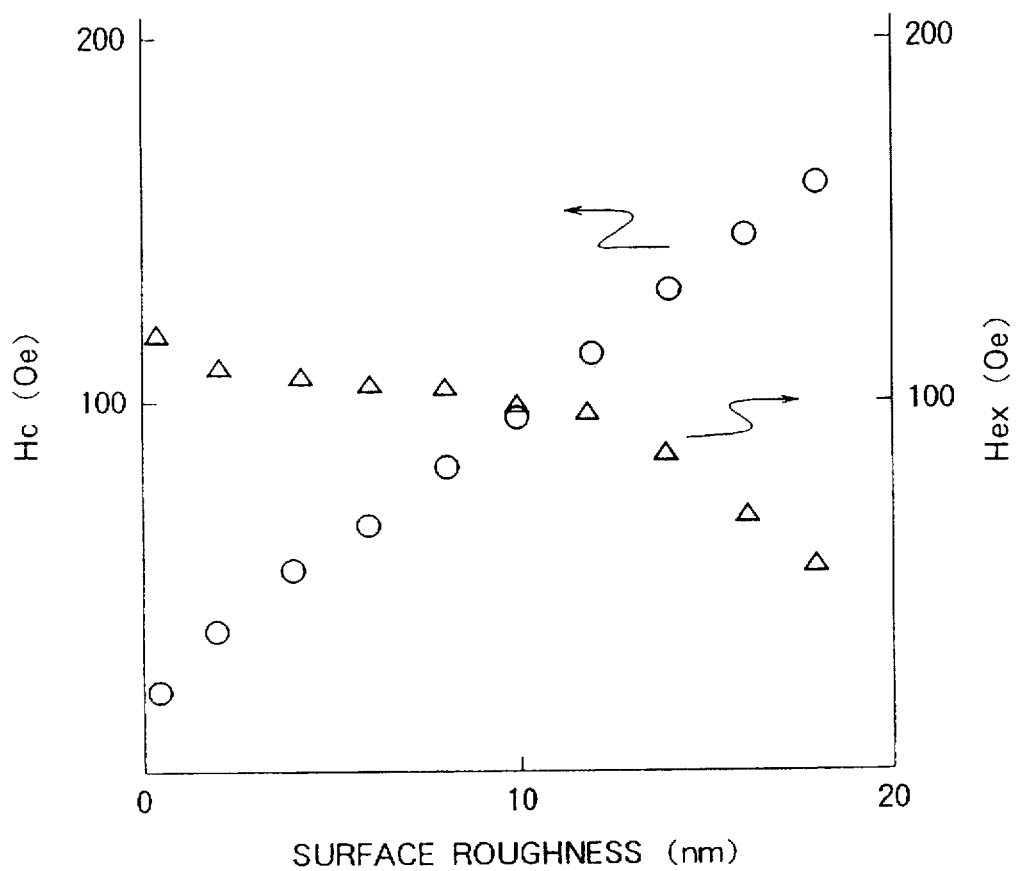
FIG. 33 is a graph showing the relationship among the surface roughness, the coercive force Hc, and the exchange-coupling magnetic field Hex of the second ferromagnetic layer in the magnetoresistance effect device according to this invention.

The magnetoresistance effect device was prepared with the structure comprising several layers made of the materials and having the thicknesses shown in Table 5 and examined for the relationship among the surface roughness directly after deposition of the Ni and the Co oxide layers, the coercive force Hc, and the exchange-coupling magnetic field Hex (FIG. 33). With increase of the surface roughness, Hc increases and Hex decreases. It is seen that the range satisfying Hex>Hc desired as the magnetoresistance effect device is obtained when the surface roughness is not greater than 10 nm.

Next, magnetoresistance effect devices having the structure of alumina underlying layer/Ni oxide layer (30 nm)/Co oxide layer (0.9 nm)/first ferromagnetic layer (4 nm)/Cu layer (1.5 nm)/second ferromagnetic layer (6 nm)/Ta protective layer (1.5 nm) were prepared by the use of various materials as the first and the second ferromagnetic layers. The MR ratios of those devices are shown in Table 6.

TABLE 6

| 1st ferromagnetic layer | 2nd ferromagnetic layer | MR ratio (%) |
|---|---|---|
| NiFe | NiFe | 6 |
| NiFeCo | NiFe | 7 |
| Co | NiFe | 8 |
| FeCo | NiFe | 8 |
| NiFe | NiFeCo | 8 |
| NiFeCo | NiFeCo | 10 |
| Co | NiFeCo | 11 |
| FeCo | NiFeCo | 11 |
| NiFe | FeCo | 8 |
| NiFeCo | FeCo | 9 |
| Co | FeCo | 12 |
| FeCo | FeCo | 13 |

Various elements were added to Cu used as the nonmagnetic layer and the corrosion potential was measured. The results are shown in Table 7. The corrosion potential was improved by addition of any of those elements.

TABLE 7

| additive to Cu layer | corrosion potential (mV) |
|---|---|
| none | –310 |
| Pd | –410 |
| Al | –320 |
| Pt | –510 |
| Ta | –420 |
| In | –340 |
| B | –330 |
| Nb | –350 |
| Hf | –450 |
| Mo | –370 |
| W | –380 |
| Re | –470 |
| Rn | –440 |
| Rh | –400 |
| Ga | –330 |
| Zr | –410 |
| Ir | –430 |
| Ah | –500 |
| As | –420 |

Next, magnetoresistance effect devices having the structure specified in Table 8 were prepared. With different amounts of Ag added to Cu, observation was made to find the heat treatment temperature T at which the MR ratio after heat treatment of one hour was reduced to 50% of that before heat treatment.

TABLE 8

|  | material | thickness (nm) |
| --- | --- | --- |
| Ni oxide layer | NiO | 25 |
| Co oxide layer | CoO | 0.7 |
| 1st ferromagnetic layer | NiFe | 3.0 |
| 1st MR enhance layer | FeCo | 1.0 |
| nonmagnetic layer | Ag— or Re— added Cu | 3.0 |
| 2nd MR enhance layer | FeCO | 1.0 |
| 2nd ferromagnetic layer | NiFe | 5.0 |

As shown in Table 9, the heat temperature T monotonically increased with increase of the amount of Ag added.

TABLE 9

| amount of Ag added to Cu layer (at %) | heat treatment temperature at which MR ratio was reduced to 50% after heat treatment of one hour (°C.) |
| --- | --- |
| 0 | 220 |
| 2 | 230 |
| 3 | 240 |
| 5 | 250 |
| 7 | 260 |
| 10 | 270 |
| 15 | 275 |
| 20 | 275 |
| 30 | 280 |
| 40 | 280 |
| 50 | 280 |

Mangetoresistance effect devices having the structure shown in Table 8 were prepared. With different amounts of Re added to Cu, observation was made to find the heat treatment temperature T at which the MR ratio after heat treatment of one hour was reduced to 50% of that before heat treatment.

As shown in Table 10, the heat treatment temperature T monotonically increased with increase of the amount of Re added.

TABLE 10

| amount of Re added to Cu layer (at %) | heat treatment temperature at which MR ratio was reduced to 50% after heat treatment of one hour (°C.) |
| --- | --- |
| 0 | 220 |
| 2 | 225 |
| 3 | 235 |
| 5 | 250 |
| 7 | 260 |
| 10 | 270 |
| 15 | 270 |
| 20 | 275 |
| 30 | 280 |
| 40 | 280 |
| 50 | 280 |

Figure 34:
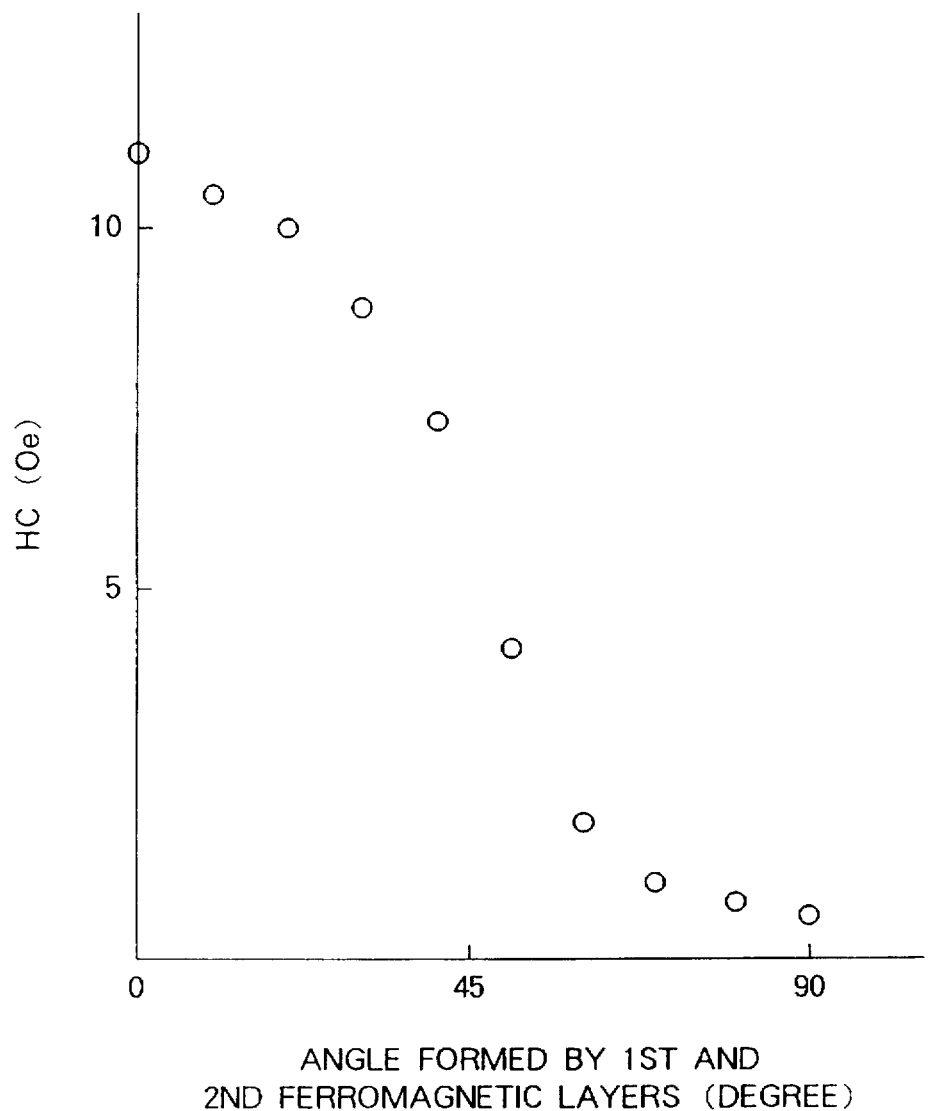
FIG. 34 is a graph showing the relationship between the angle formed by easy magnetization axes of the first and the second ferromagnetic layers and the coercive force Hc of the second ferromagnetic layer in the magnetoresistance effect device according to this invention.

Next, examination was made as to the relationship between the angle θ formed by the easy magnetization axes of the first and the second ferromagnetic layers and the coercive force Hc of the second ferromagnetic layer (FIG. 34). The film structure shown in Table 11 was used.

TABLE 11

|  | material | thickness (nm) |
| --- | --- | --- |
| Ni oxide layer | $Ni_xO_{1-x}$ | 30 |
| Co oxide layer | $Co_xO_{1-x}$ | 1.0 |
| 1st ferromagnetic layer | NiFe | 3.0 |
| 1st MR enhance layer | Co | 0.7 |
| nonmagnetic layer | Cu | 25 |
| 2nd MR enhance layer | Co | 0.7 |
| 2nd ferromagnetic layer | NiFe | 6.0 |
| protective layer | Cu | 1.5 |

With increase of θ, Hc monotonically decreased to become smaller than 1 Oe when the angle is within a range between 70 and 90 degrees. It is understood that this range is desirable in order to decrease the hysteresis of the device and to suppress occurrence of Berkhausen noise at the head.

Next, the head was experimentally prepared with the structure, the materials, and the thicknesses illustrated in FIG. 26 and specified in Table 12.

TABLE 12

|  | material | thickness (nm) |
| --- | --- | --- |
| lower shielding layer | NiFe | 2 |
| lower gap layer | alumina | 0.07–0.15 |
| lower electrode layer | Mo | 0.05 |
| longitudinal biasing layer | CoCrPt | 0.025 |
| magnetoresistance effect device | see Fig. 25 and Table 4 | |
| gap defining insulation layer | alumina | 0.01 |
| upper gap layer | alumina | 0.07–0.15 |
| upper shielding layer | NiFe | 2 |

In this case, the magnetoresistance effect device having the structure shown in Table 13 was used.

TABLE 13

|  | material | thickness (nm) |
| --- | --- | --- |
| Ni oxide layer | $Ni_xO_{1-x}$ | 25 |
| Co oxide layer | $Co_xO_{1-x}$ | 1 |
| 1st ferromagnetic layer | NiFe | 1–20 |
| 1st MR enhance layer | Co | 1 |
| nonmagnetic layer | Cu | 1–4 |
| 2nd MR enhance layer | Co | 1 |
| 2nd ferromagnetic layer | NiFe | 2–20 |
| protective layer | Cu | 1.5 |

Figure 35:
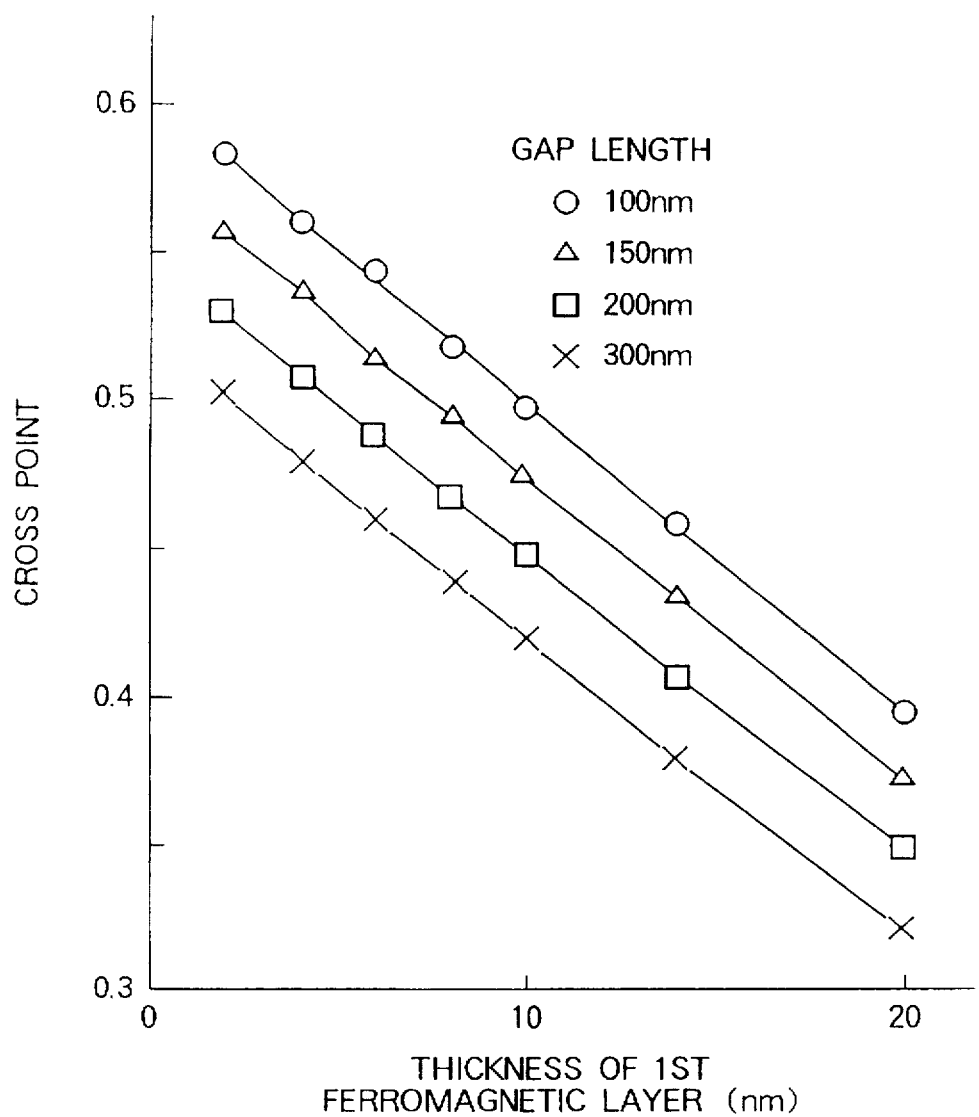
FIG. 35 is a graph showing the relationship between the thickness of the first ferromagnetic layer and the cross point in the magnetoresistance effect device according to this invention.
Figure 36:
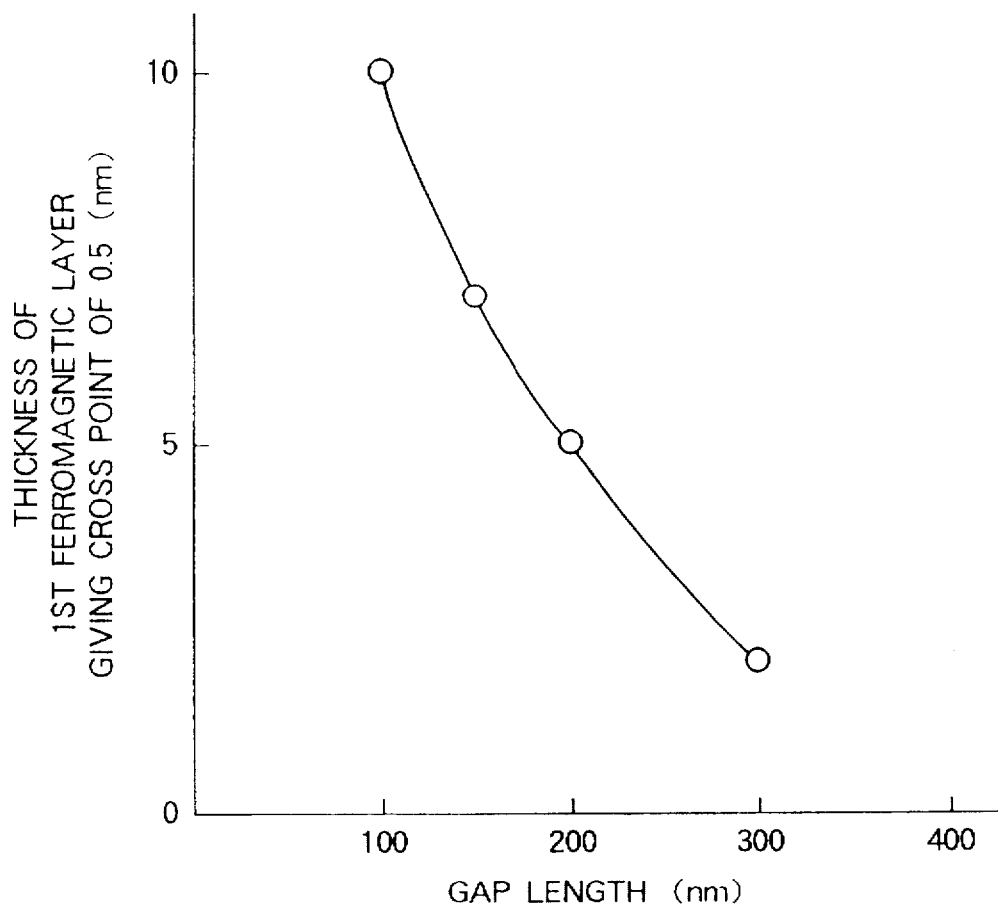
FIG. 36 is a graph showing the relationship between the thickness of upper and lower gap layers and the thickness of the first ferromagnetic layer giving the cross point of 0.5 in the magnetoresistance effect device according to this invention.
Figure 37:
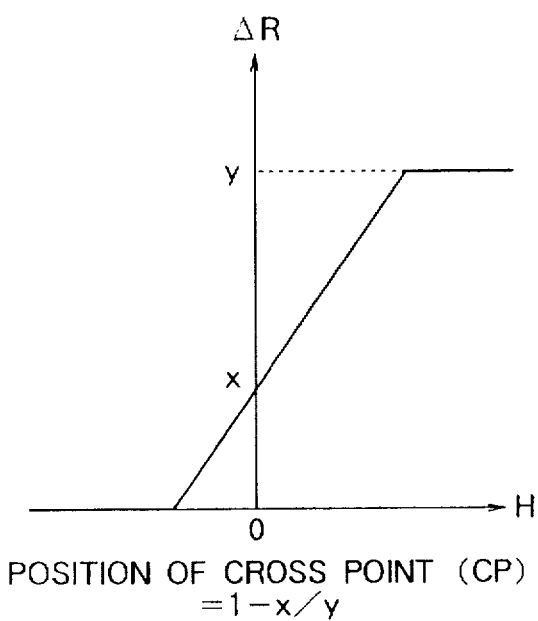
FIG. 37 is a view for describing the cross point of the magnetoresistance effect device according to this invention.

FIG. 35 shows the relationship between the cross point and the thickness of the first ferromagnetic layer for different thicknesses of the upper and the lower gap layers. FIG. 36 shows the relationship between the thickness of the first ferromagnetic layer where the cross point is 0.5 and the thickness of the upper and the lower gap layers. In this case, the upper and the lower gap layers have the same thickness. The thickness of the second ferromagnetic layer is fixed to 6 nm. The definition of the cross point is illustrated in FIG. 37. The cross point decreases with increase of the thickness of the first ferromagnetic layer. The thickness of the first ferromagnetic layer giving the cross point of 0.5 linearly decreases with increase of the thickness of the upper and the lower gap layers and is not greater than 10 nm in the illustrated range of the thickness of the gap layers.

Figure 38:
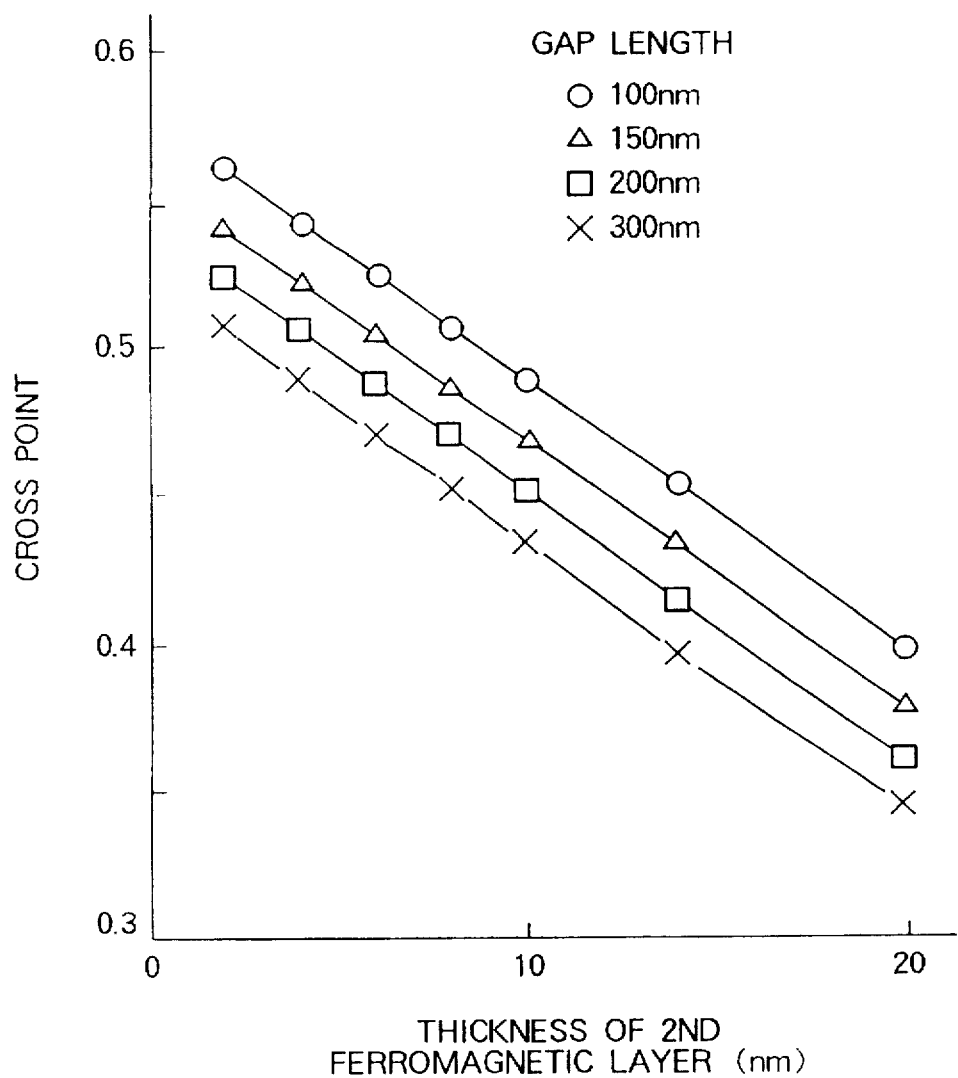
FIG. 38 is a graph showing the relationship between the thickness of the second ferromagnetic layer and the cross point in the magnetoresistance effect device according to this invention.
Figure 39:
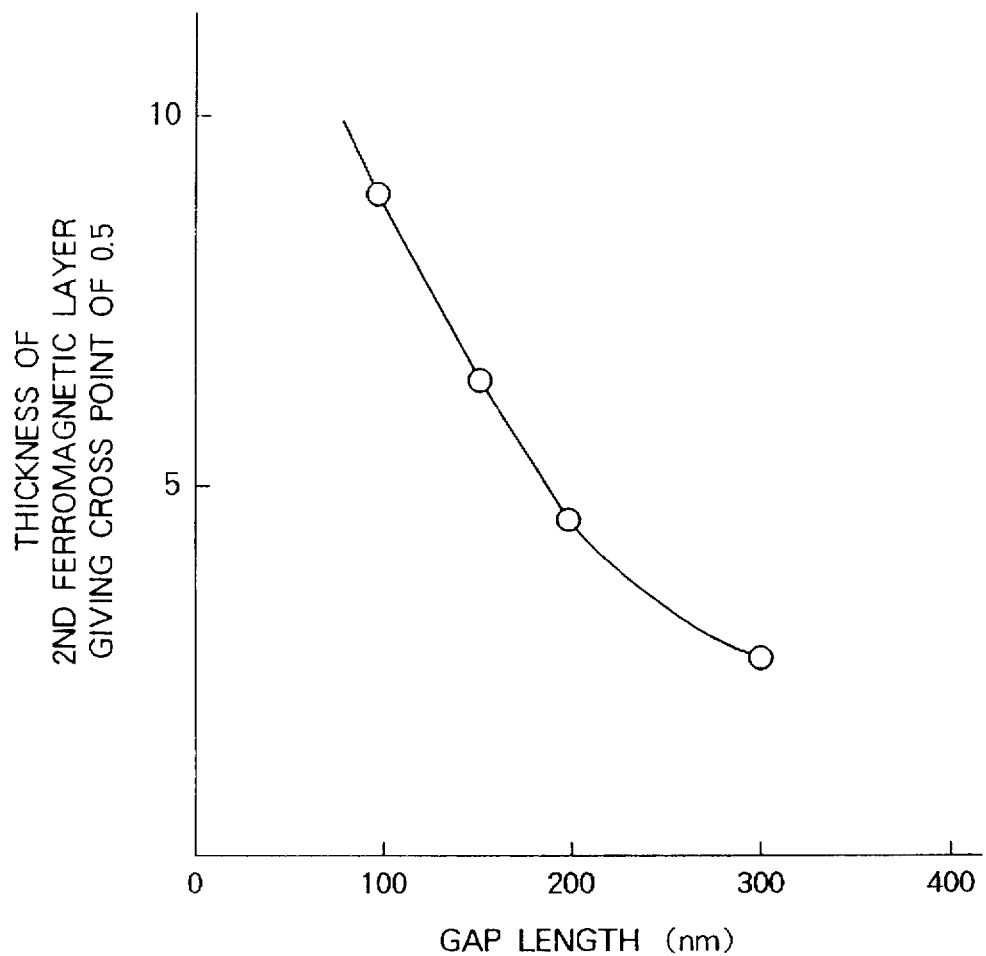
FIG. 39 is a graph showing the relationship between the thickness of the upper and the lower gap layers and the thickness of the second ferromagnetic layer giving the cross point of 0.5 in the magnetoresistance effect device according to this invention.

FIG. 38 shows the relationship between the cross point and the thickness of the second ferromagnetic layer for different thicknesses of the upper and the lower gap layers. FIG. 39 shows the relationship between the thickness of the second ferromagnetic layer where the cross point is 0.5 and the thickness of the upper and the lower gap layers. In this case, the upper and the lower gap layers have the same thickness. The thickness of the first ferromagnetic layer is equal to 6 nm. The definition of the cross point is illustrated in FIG. 37. The cross point decreases with increase of the thickness of the second ferromagnetic layer. The thickness of the second ferromagnetic layer giving the cross point of 0.5 linearly decreases with increase of the thickness of the upper and the lower gap layers and is not greater than 10 nm in the illustrated range of the thickness of the gap layers.

Table 14 shows the half-widths of the output signal for the different thicknesses of the antiferromagnetic layer within the range between 5 and 100 nm.

TABLE 14

| thickness of anti-ferromagnetic layer (nm) | half-width of output signal (ns) |
|---|---|
| 5 | 12 |
| 10 | 15 |
| 20 | 20 |
| 30 | 25 |
| 50 | 30 |
| 100 | 50 |

The linear velocity of the medium upon reproduction of the record is 10 m/s. In order to achieve high recording density on the order of 2 Gb/in or more, the half-width of the output signal must be 25 ns or less. This condition was achieved when the thickness of the antiferromagnetic film is 30 nm or less.

Figure 40:
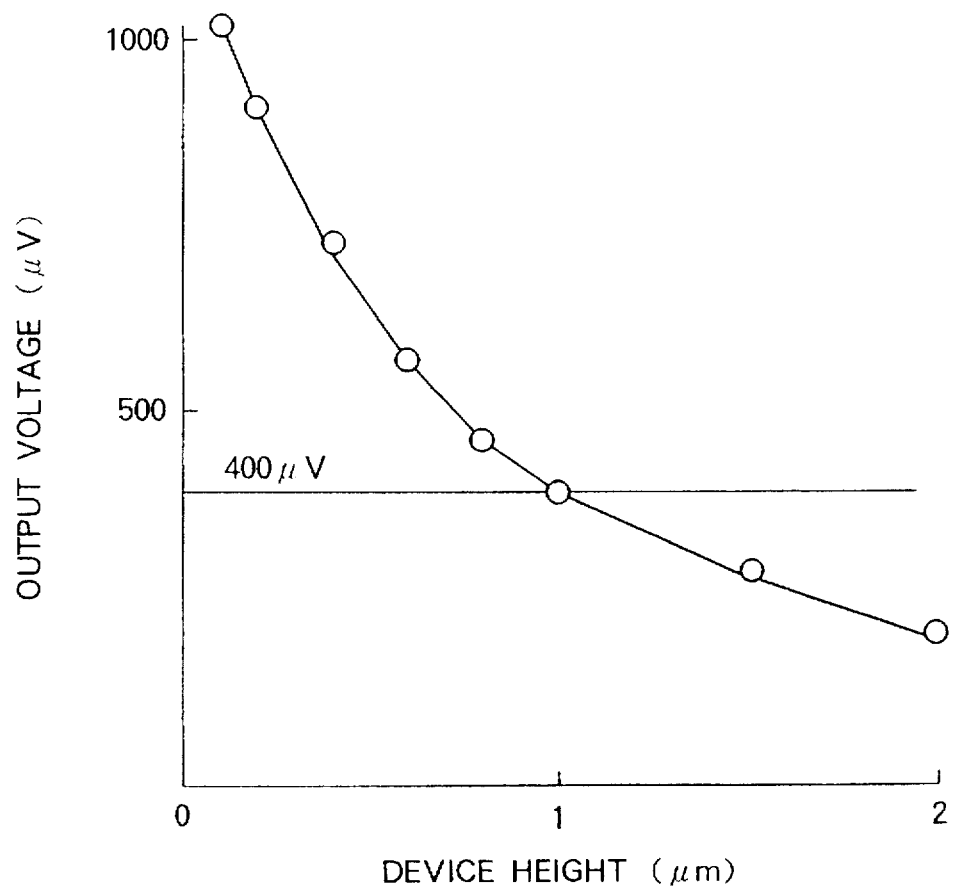
FIG. 40 is a graph showing the relationship between the device height and the output voltage in the magnetoresistance effect device according to this invention.

FIG. 40 shows the relationship between the device height and the output voltage. Herein, the sense current is $2 \times 10^7$ A/cm$^2$ and the track width is 1 µm. As the device height is smaller, the output voltage becomes high. Generally, the output voltage on the order of 400 µV is required. It is seen that this condition is satisfied when the device height is within a range smaller than 1 µm.

As is obvious from the foregoing description, it is possible according to this invention to obtain the spin-valve multilayer film which exhibits linear change in resistance around the zero magnetic field and which is excellent in corrosion resistance. In addition, the coercive force of the exchange-coupled layer is small and the hysteresis is considerably reduced when used as the magnetoresistance effect device. Furthermore, the heat resistance is remarkably improved and no substantial change in characteristic is observed even through the heat treatment at 300° C.

According to this invention, it is possible to obtain a magnetoresistance effect device, a shielded-type magnetoresistance effect sensor, a magnetoresistance detection system, and a magnetic memory system each of which is excellent in corrosion resistance, exchange-coupling magnetic field, hysteresis characteristic, MR ratio, cross point, and half-width of the output signal.

What is claimed is:

1. A magnetoresistance effect film comprising two ferromagnetic layers stacked on a substrate with a nonmagnetic layer interposed between said two ferromagnetic layers, and an antiferromagnetic layer underlying a first one of said ferromagnetic layers, the inequality of $Hc_2 < Hr$ being satisfied between a biasing magnetic field Hr of said antiferromagnetic layer and a coercive force $Hc_2$ of the other second one of said ferromagnetic layers, wherein at least a part of said antiferromagnetic layer is made of a NiMn alloy having an fct crystalline structure, said NiMn alloy having 1–10% carbon (C) by the atomic percent added thereto to induce fct lattice transformation during heat treatment.

2. A magnetoresistance effect film as claimed in claim 1, wherein said NiMn alloy contains 46% to 60% Mn on the basis of the atomic percent.

3. A magnetoresistance effect film as claimed in claim 1, wherein said NiMn alloy is a three-phase alloy comprising Ni, Mn, and a selected corrosion-resistant metal.

4. A magnetoresistance effect film as claimed in claim 3, wherein said corrosion-resistant metal is chromium (Cr).

5. A magnetoresistance effect film as claimed in claim 1, wherein said antiferromagnetic layer of NiMn alloy is provided with an underlying layer made of a material selected from the group consisting of Ti, Hf, Zr, Y, Ta, Cr, and an alloy thereof.

6. A magnetoresistance effect film as claimed in claim 1, wherein said antiferromagnetic layer and said first ferromagnetic layer are subjected to heat treatment at a temperature not higher than 300° C.

7. A magnetoresistance effect film as claimed in claim 1, wherein said nonmagnetic layer has a thickness of 20 to 35 angstroms.

8. A magnetoresistance effect film as claimed in claim 1, wherein the inequality $Hc_2 < Hk_2 < Hr$ is satisfied among a biasing magnetic field Hr of said antiferromagnetic layer, a coercive force $Hc_2$ of said second ferromagnetic layer, and an anisotropy magnetic field $Hk_2$.

9. A magnetoresistance effect film as claimed in claim 1, wherein each of said ferromagnetic layers is made of a material selected from the group consisting of Ni, Fe, Co, NiFe, NiFeCo, and an alloy thereof as a main component.

10. A magnetoresistance effect film as claimed in claim 1, wherein an additional layer made of a material selected from the group consisting of Co, FeCo, NiCo, and NiFeCo and having a thickness between 5 and 30 angstroms is inserted at an interface between said nonmagnetic layer and each of said ferromagnetic layers.

11. A magnetoresistance effect film as claimed in claim 1, wherein said two ferromagnetic layers have easy magnetization axes perpendicular to each other, respectively, by forming said ferromagnetic layers under magnetic fields applied in different directions by an angle of 90° to each other.

12. A magnetoresistance effect film as claimed in claim 1, wherein said second ferromagnetic layer is forced to be in a single-domain state by the use of an additional antiferromagnetic layer or a permanent magnet layer.

* * * * *